United States Patent
Lee et al.

(10) Patent No.: US 10,418,284 B2
(45) Date of Patent: Sep. 17, 2019

(54) SEMICONDUCTOR DEVICES AND METHODS OF FABRICATING THE SAME

(71) Applicant: Samsung Electronics Co., Ltd., Suwon-si, Gyeonggi-do (KR)

(72) Inventors: Chul Woong Lee, Suwon-si (KR); Hanseung Kwak, Suwon-si (KR); Youngmook Oh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/882,190

(22) Filed: Jan. 29, 2018

(65) Prior Publication Data
US 2018/0151447 A1 May 31, 2018

Related U.S. Application Data

(63) Continuation of application No. 15/189,312, filed on Jun. 22, 2016, now Pat. No. 9,911,659.

(30) Foreign Application Priority Data

Jul. 21, 2015 (KR) .......................... 10-2015-0103120

(51) Int. Cl.
*H01L 21/8234* (2006.01)
*H01L 29/06* (2006.01)
(Continued)

(52) U.S. Cl.
CPC ................ *H01L 21/823481* (2013.01); *H01L 21/823431* (2013.01); *H01L 21/823437* (2013.01);
(Continued)

(58) Field of Classification Search
CPC ..... H01L 21/823481; H01L 21/823431; H01L 21/823437; H01L 21/823462; H01L 21/823468
(Continued)

(56) References Cited

U.S. PATENT DOCUMENTS 7,105,887 B2 9/2006 Park et al.
8,081,516 B2 12/2011 Lee et al.
(Continued)

FOREIGN PATENT DOCUMENTS

KR 20040060549 7/2004
KR 100764452 10/2007
(Continued)

*Primary Examiner* — Long K Tran
(74) *Attorney, Agent, or Firm* — Myers Bigel, P.A.

(57) ABSTRACT

Semiconductor devices and methods of fabricating the same are provided. The semiconductor devices may include gate electrodes on a substrate. A longitudinal direction of each of the gate electrodes may extend in a first direction, and ones of the gate electrodes may be arranged in the first direction. The semiconductor devices may also include first and second gate spacers extending in the first direction and on respective sidewalls of the ones of the gate electrodes. The first and second gate spacers may be spaced apart from each other in a second direction that is different from the first direction. The semiconductor devices may further include gate separation patterns, and ones of the gate separation patterns may be between two among the ones of the gate electrodes adjacent to each other in the first direction and between the first and second gate spacers.

20 Claims, 54 Drawing Sheets

(51) Int. Cl.
*H01L 27/088* (2006.01)
*H01L 27/11* (2006.01)
*H01L 27/02* (2006.01)

(52) U.S. Cl.
CPC ........ *H01L 21/823462* (2013.01); *H01L 21/823468* (2013.01); *H01L 27/088* (2013.01); *H01L 27/0886* (2013.01); *H01L 29/0649* (2013.01); *H01L 27/0207* (2013.01); *H01L 27/1104* (2013.01)

(58) Field of Classification Search
USPC ........................................................ 257/401
See application file for complete search history.

(56) References Cited

U.S. PATENT DOCUMENTS

| | | | |
|---|---|---|---|
| 8,377,795 B2 | 2/2013 | Kanakasabapathy et al. | |
| 8,492,206 B2 | 7/2013 | Zhong et al. | |
| 9,070,719 B2 | 6/2015 | Zhong et al. | |
| 9,093,378 B2 | 7/2015 | Kim et al. | |
| 9,153,665 B2 | 10/2015 | Yu et al. | |
| 2010/0112798 A1* | 5/2010 | Lai | H01L 21/82384 438/591 |
| 2014/0151761 A1* | 6/2014 | Hsieh | H01L 29/66545 257/288 |
| 2014/0170853 A1 | 6/2014 | Shamma et al. | |
| 2014/0252497 A1 | 9/2014 | Peng et al. | |
| 2014/0273528 A1 | 9/2014 | Niskanen et al. | |
| 2014/0349482 A1 | 11/2014 | Tsao et al. | |
| 2015/0054078 A1* | 2/2015 | Xie | H01L 29/785 257/347 |
| 2016/0020294 A1* | 1/2016 | Koo | H01L 29/511 257/288 |

FOREIGN PATENT DOCUMENTS

| | | |
|---|---|---|
| KR | 20080060331 | 7/2008 |
| KR | 20140113254 | 9/2014 |

* cited by examiner

SEMICONDUCTOR DEVICES AND METHODS OF FABRICATING THE SAME

CROSS-REFERENCE TO RELATED APPLICATION

This application is a continuation of U.S. patent application Ser. No. 15/189,312, filed on Jun. 22, 2016, which itself claims priority under 35 U.S.C. § 119 to Korean Patent Application No. 10-2015-0103120, filed on Jul. 21, 2015, in the Korean Intellectual Property Office, the disclosures of both of which are herein incorporated by reference in their entireties.

BACKGROUND

Embodiments of the inventive concepts relate to semiconductor devices and methods for fabricating the same. More particularly, embodiments of the inventive concepts relate to semiconductor devices including fin field effect transistors and methods for fabricating the same.

Semiconductor devices may include metal-oxide-semiconductor field effect transistors (MOSFETs). As the semiconductor devices have been highly integrated, sizes of MOSFETs have been reduced and operating characteristics of the semiconductor devices become deteriorated. Various researches are being conducted for semiconductor devices to overcome limitations associated with a high-integration degree and improved performance.

SUMMARY

Embodiments of the inventive concepts may provide semiconductor devices capable of improving an integration degree and electrical characteristics.

Embodiments of the inventive concepts may also provide methods for fabricating semiconductor devices with a high-integration degree and improved electrical characteristics.

A semiconductor device may include gate electrodes on a substrate. A longitudinal direction of each of the gate electrodes may extend in a first direction and ones of the gate electrodes may be arranged in the first direction. The semiconductor device may include first and second gate spacers extending in the first direction and on respective sidewalls of the ones of the gate electrodes. The first and second gate spacers may be spaced apart from each other in a second direction that is different from the first direction. The semiconductor device may further include gate separation patterns, and ones of the gate separation patterns may be between two among the ones of the gate electrodes adjacent to each other in the first direction and between the first and second gate spacers.

According to various embodiments, widths of the gate separation patterns may be substantially equal to widths of the gate electrodes.

In various embodiments, the gate separation patterns may be in contact with the first and second gate spacers.

In various embodiments, top surfaces of the gate separation patterns may be substantially coplanar with top surfaces of the gate electrodes.

According to various embodiments, bottom surfaces of the gate separation patterns may be lower than bottom surfaces of the gate electrodes.

According to various embodiments, each of the gate electrodes may have first opposing sidewalls that are spaced apart from each other in the first direction and second opposing sidewalls that are spaced apart from each other in the second direction. One of the first opposing sidewalls may form a first angle with a top surface of the substrate, one of the second opposing sidewalls may form a second angle with the top surface of the substrate, and the second angle may be greater than the first angle.

According to various embodiments, the first and second gate spacers may include an insulating material different from the gate separation patterns.

In various embodiments, the semiconductor device may also include a device isolation layer defining active patterns on the substrate. Each of the gate electrodes may intersect one of the active patterns, and the gate separation patterns may be disposed on the device isolation layer.

According to various embodiments, the semiconductor device may further include epitaxial layers disposed on the active patterns on both sides of each of the gate electrodes.

In various embodiments, the semiconductor device may further a gate insulating layer disposed between one of the gate electrodes and the substrate, the gate insulating layer may extend between the one of the gate electrodes and the first and second gate spacers and between the one of the gate electrodes and one of the gate separation patterns.

In various embodiments, each of the gate separation patterns may include a lower portion and an upper portion protruding from the lower portion. A width of the upper portion may be smaller than a width of the lower portion, and the first and second gate spacers may be disposed on the lower portion of one of the gate separation patterns.

According to various embodiments, the lower portions of the gate separation patterns adjacent to each other in the second direction may be connected to each other.

According to various embodiments, one of the gate separation patterns may extend onto top surfaces of the ones of the gate electrodes that are arranged in the first direction.

According to various embodiments, widths of the gate separation patterns may be greater than widths of the gate electrodes.

In various embodiments, the gate electrodes may include first gate electrodes that are arranged in the first direction and spaced apart from each other by a first distance in the first direction and second gate electrodes that area arranged in the first direction and spaced apart from each other by a second distance greater than the first distance in the first direction. The gate separation patterns may include a first gate separation pattern on sidewalls of two of the first gate electrodes and a second gate separation pattern on sidewalls of two of the second gate electrodes. The sidewalls of the two of the first gate electrodes may be spaced apart from each other in the first direction, and the sidewalls of the two of the second gate electrodes may be spaced apart from each other in the first direction.

According to various embodiments, the second gate separation pattern may include a first insulating pattern and a second insulating pattern that may be formed of materials different from each other, and the first insulating pattern may extend between the substrate and the second insulating pattern and between the second insulating pattern and the two of the second gate electrodes.

In various embodiments, the first gate separation pattern may fill a space between the two of the first gate electrodes in the first direction.

A semiconductor device may include active patterns on a substrate and gate structures disposed on the substrate. Each of the gate structures may intersect one of the active patterns. Each of the gate structures may include a pair of gate spacers extending in a first direction, gate electrodes disposed between the pair of gate spacers and gate separation patterns each disposed between the pair of gate spacers and between two of the gate electrodes adjacent to each other in the first direction. The gate electrodes may be spaced apart from each other in the first direction.

According to various embodiments, the semiconductor device may further include a device isolation layer defining the active patterns. The gate separation patterns may be disposed on the device isolation layer.

In various embodiments, a top surface of the device isolation layer may be lower than top surfaces of the active patterns, and one of the gate electrodes may cover the top surface and a sidewall of one of the active patterns.

According to various embodiments, each of the gate electrodes may have first opposing sidewalls that are spaced apart from each other in the first direction and second opposing sidewalls that are spaced apart from each other in a second direction that is different from the first direction. One of the first opposing sidewalls may form a first angle with a top surface of the substrate, one of the second opposing sidewalls may form a second angle with the top surface of the substrate, and the second angle may be greater than the first angle.

In various embodiments, the semiconductor device may also include a gate insulating layer disposed between one of the gate electrodes and the substrate. The gate insulating layer may extend between the one of the gate electrodes and the pair of gate spacers and between the one of the gate electrodes and one of the gate separation patterns.

In various embodiments, the pair of gate spacers may include an insulating material different from the gate separation patterns.

According to various embodiments, top surfaces of the gate separation patterns may be substantially coplanar with top surfaces of the gate electrodes.

According to various embodiments, bottom surfaces of the gate separation patterns may be lower than bottom surfaces of the gate electrodes.

A method of fabricating a semiconductor device may include patterning a substrate to form active patterns, forming a gate layer comprising openings on the substrate, forming a gate separation layer filling the openings on the gate layer and forming gate electrodes and gate separation patterns by patterning the gate separation layer and the gate layer. Ones of the gate electrodes may be arranged in a first direction, and each of the gate separation patterns may be disposed between the gate electrodes adjacent to each other in the first direction.

According to various embodiments, each of the openings of the gate layer may have a longitudinal axis that extends in a second direction that is different from the first direction.

According to various embodiments, lengths of the openings in the second direction may be greater than widths of the gate electrodes in the second direction.

In various embodiments, each of the openings may be formed between adjacent ones of the active patterns when viewed from a plan perspective.

In various embodiments, forming the gate layer may include forming a lower layer on the substrate, forming a first mask pattern comprising first preliminary openings on the lower layer and etching the lower layer using the first mask pattern as an etch mask to form the openings.

According to various embodiments, wherein forming the gate electrodes and the gate separation patterns may include forming a second mask pattern on the gate separation layer and etching the gate separation layer and the gate layer using the second mask pattern as an etch mask. The second mask pattern may include second preliminary openings, and each of the second preliminary openings may have a linear shape extending in the first direction.

In various embodiments, the patterning of the substrate to form the active patterns may include forming a mask pattern defining the active patterns on the substrate, etching the substrate using the mask pattern as an etch mask to form trenches and forming a device isolation layer in the trenches. The device isolation layer may expose upper portions of sidewalls of the trenches.

In various embodiments, the method may further include forming gate spacers extending in the first direction. The gate spacers may be on sidewalls of the ones of the gate electrodes that are arranged in the first direction and on sidewalls of the gate separation patterns.

According to various embodiments, the method may further include etching portions of the active patterns at both sides of each of the gate electrodes to form recesses after forming the gate spacers and forming epitaxial layers in the respective recesses.

A method of fabricating a semiconductor device may include forming a device isolation layer on a substrate. The device isolation layer may define an active pattern. The method may also include forming a gate separation pattern overlapping the device isolation layer when viewed from a plan perspective and forming first and second gate spacers on respective first opposing sidewalls of the gate separation pattern. The gate separation pattern may include an electrically insulating material, and the first and second gate spacers may cross over the active pattern and extending in a first direction. The method may further include forming first and second gate electrodes between the first and second gate spacers and on respective second opposing sidewalls of the gate separation pattern. The first gate electrode may cross over the active pattern and the first and second gate electrodes may extend in the first direction.

According to various embodiments, the method may additionally include forming a dummy gate layer on the substrate after forming the device isolation layer. The dummy gate layer may include an opening exposing the device isolation layer. The method may also include forming a gate separation layer in the opening of the dummy gate layer and on the dummy gate layer, forming a mask pattern having a linear shape on the dummy gate layer and the gate separation layer and forming the gate separation pattern and first and second dummy gate patterns by etching the gate separation layer and the dummy gate layer using the mask pattern as an etch mask. The first and second dummy gate patterns may be on the respective second opposing sidewalls of the gate separation pattern. The method may further include removing the first and second dummy gate patterns after forming the first and second gate spacers on the respective first opposing sidewalls of the gate separation pattern to form first and second gate recesses between the first and second gate spacers. The first and second gate electrodes may be formed in the first and second gate recesses respectively.

According to various embodiments, the gate separation layer may fills the opening of the dummy gate layer, and the first and second gate recesses may expose the second opposing sidewalls of the gate separation pattern.

In various embodiments, the method may further include forming first and second active recesses in the active region on respective sides of the first dummy gate pattern by etching the active region using the gate separation pattern, the first and second dummy gate patterns and the first and second gate spacers as an etch mask, forming epitaxial layers in the first and second active recesses and forming an interlayer insulating layer on the gate separation pattern, the first and second dummy gate patterns, the first and second gate spacers and the epitaxial layers According to various embodiments, the interlayer insulating layer may expose upper surfaces of the gate separation pattern and the first and second dummy gate patterns, and removing the first and second dummy gate patterns may be performed after forming the interlayer insulating layer.

According to various embodiments, the first and second gate spacers may contact the respective first opposing sidewalls of the gate separation pattern.

In various embodiments, the first and second gate spacers may include a material different from the gate separation pattern In various embodiments, the first and second gate spacers may be spaced apart from each other by a constant distance along the first direction According to various embodiments, the method may additionally include comprising forming first and second gate insulating layers before forming the first and second gate electrodes. The first gate insulating layer may be between the first gate electrode and the gate separation pattern and may contact the gate separation pattern. The second gate insulating layer may be between the second gate electrode and the gate separation pattern and may contact the gate separation pattern.

According to various embodiments, an upper surface of the gate separation pattern and an upper surface of the first gate electrode may be coplanar.

In various embodiments, a lower surface of the gate separation pattern may be lower than a lower surface of the first gate electrode.

BRIEF DESCRIPTION OF THE DRAWINGS

The inventive concepts will become more apparent in view of the attached drawings and accompanying detailed description.

DETAILED DESCRIPTION

Figure 1:
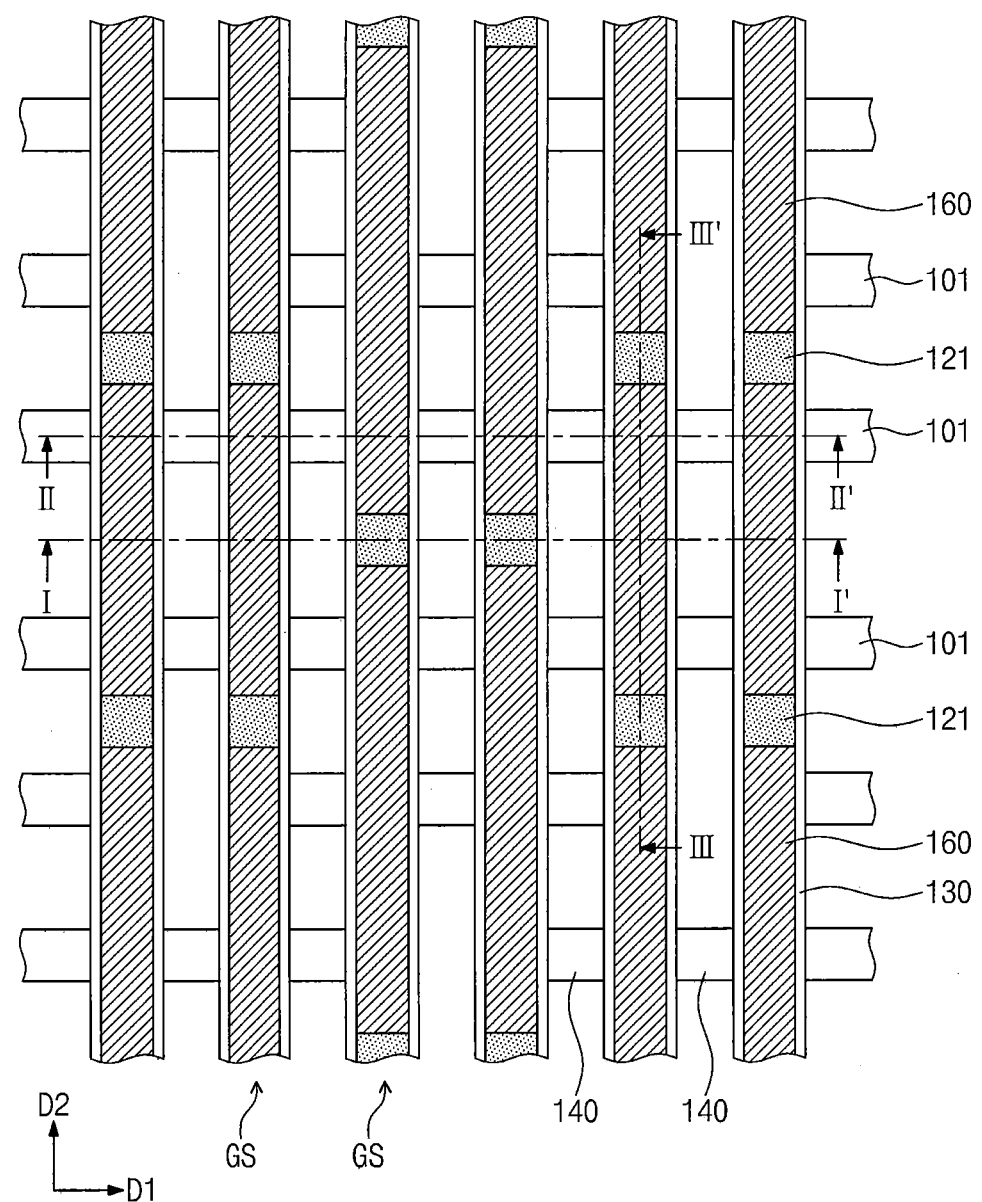
FIG. 1 is a plan view illustrating a semiconductor device according to some embodiments of the inventive concepts.

The advantages and features of the inventive concepts and methods of achieving them will be apparent from the following example embodiments that will be described in more detail with reference to the accompanying drawings. It should be noted, however, that the inventive concepts are not limited to the following example embodiments and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity. The same reference numerals or the same reference designators denote the same elements throughout the specification.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, steps, operations, elements, and/or components, but do not preclude the presence or addition of one or more other features, steps, operations, elements, components, and/or groups thereof.

Moreover, example embodiments are described herein with reference to cross-sectional views and/or plan views that are idealized views. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Embodiments of the inventive concepts will now be described more fully hereinafter with reference to the accompanying drawings.

Figure 2A:
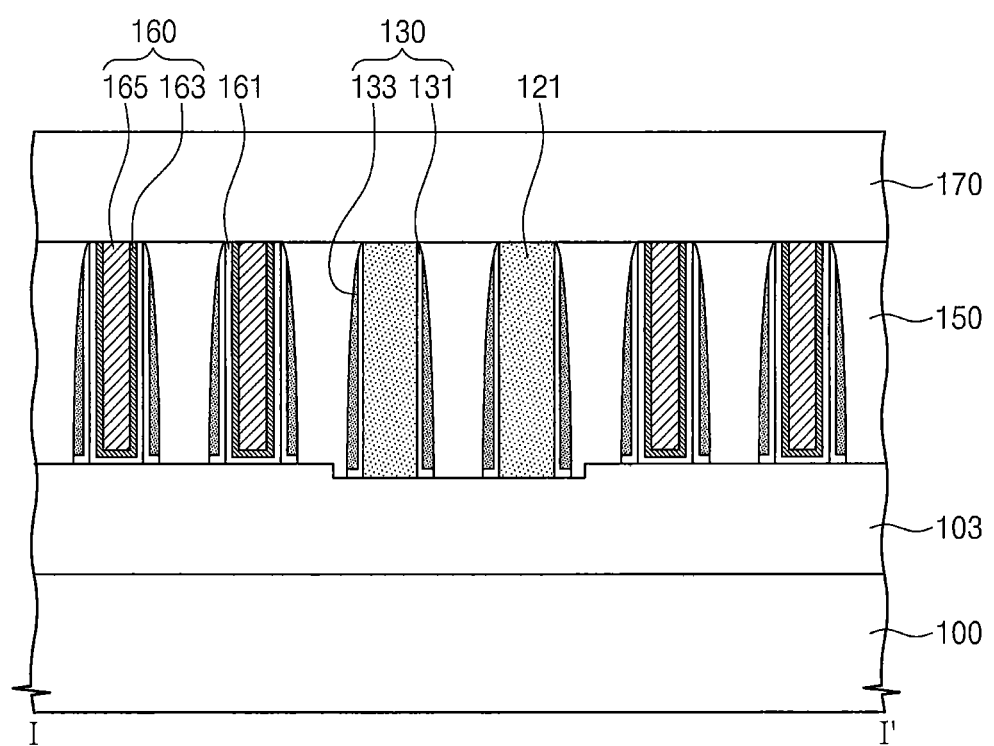
FIGS. 2A, 2B, and 2C are cross-sectional views taken along the lines I-I', II-II', and III-III' of FIG. 1, respectively, to illustrate a semiconductor device according to some embodiments of the inventive concepts.
Figure 2B:
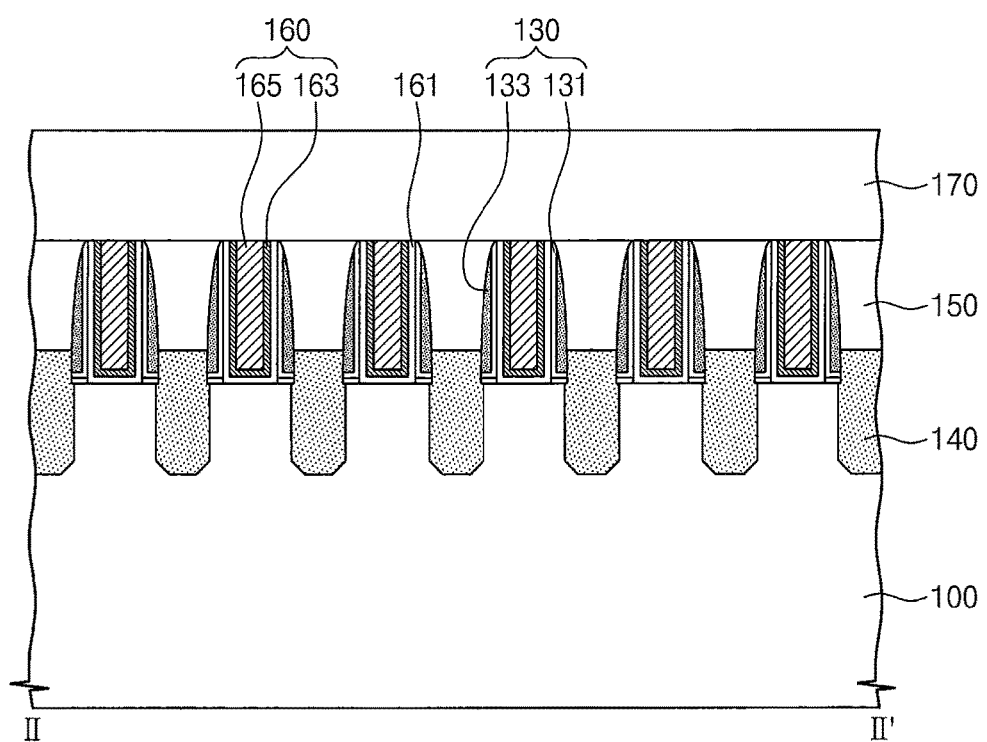
Figure 2C:
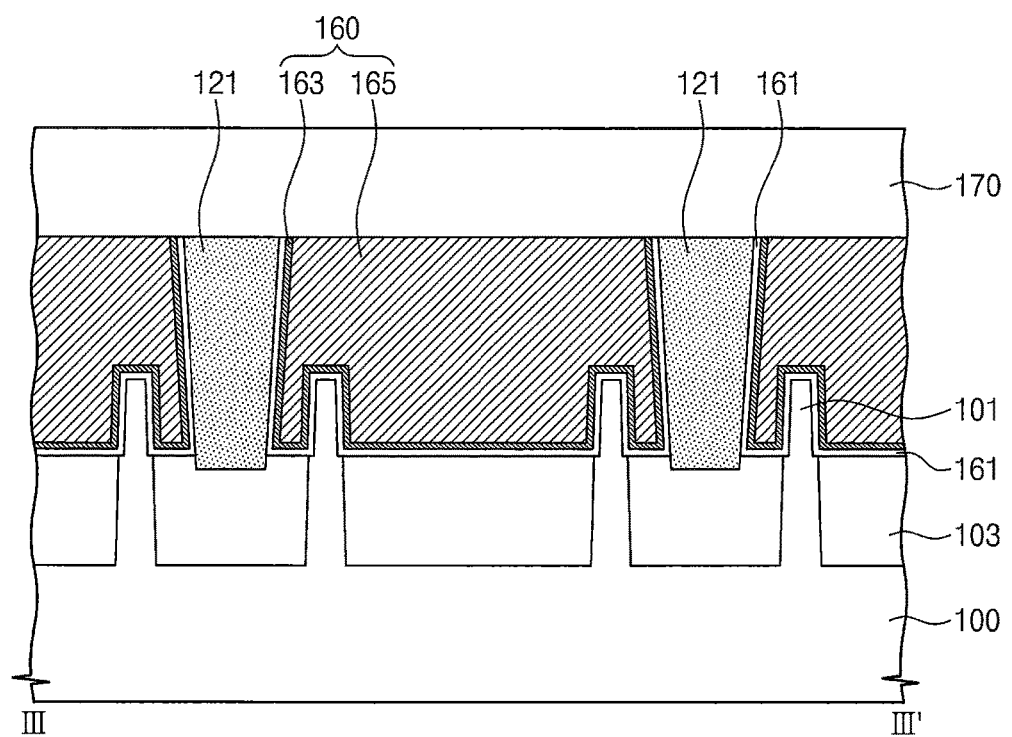
Figure 3:
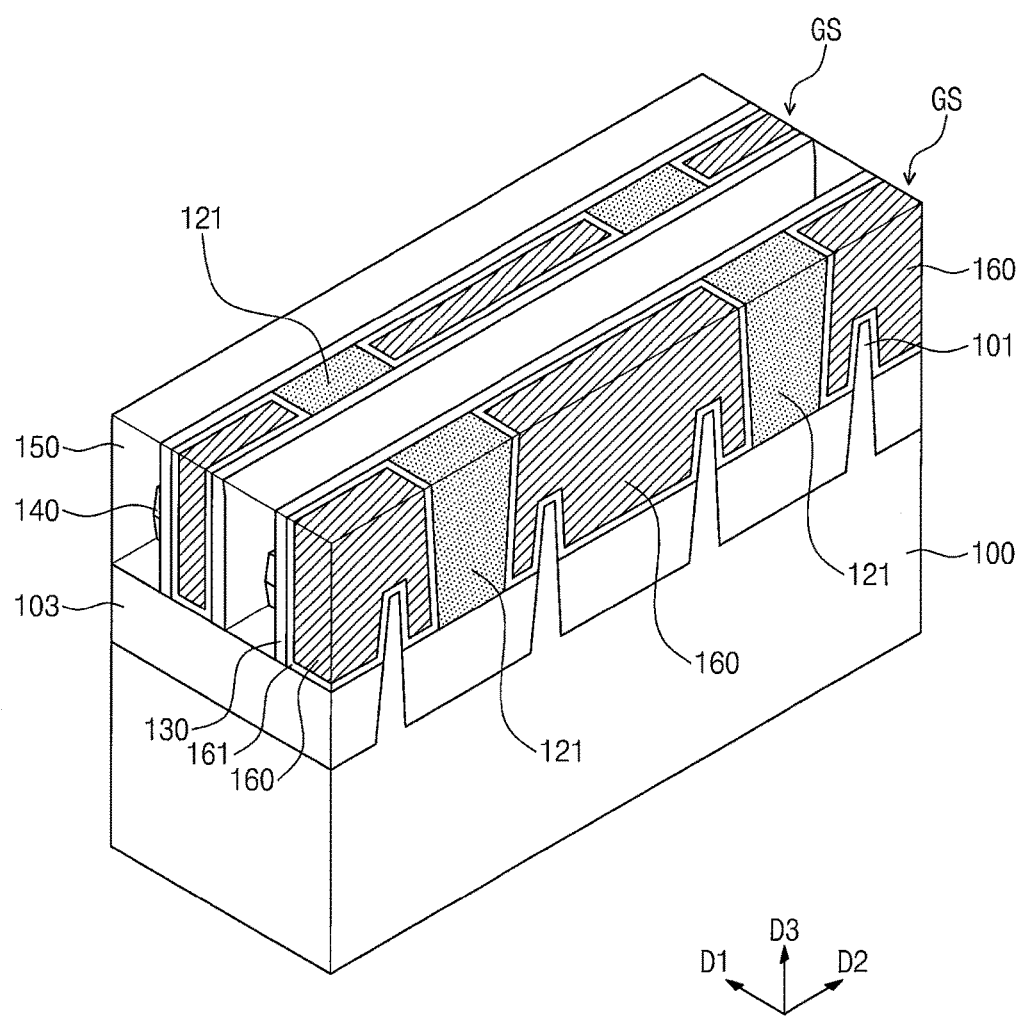
FIGS. 3 and 4 are perspective views illustrating a semiconductor device according to some embodiments of the inventive concepts.
Figure 4:
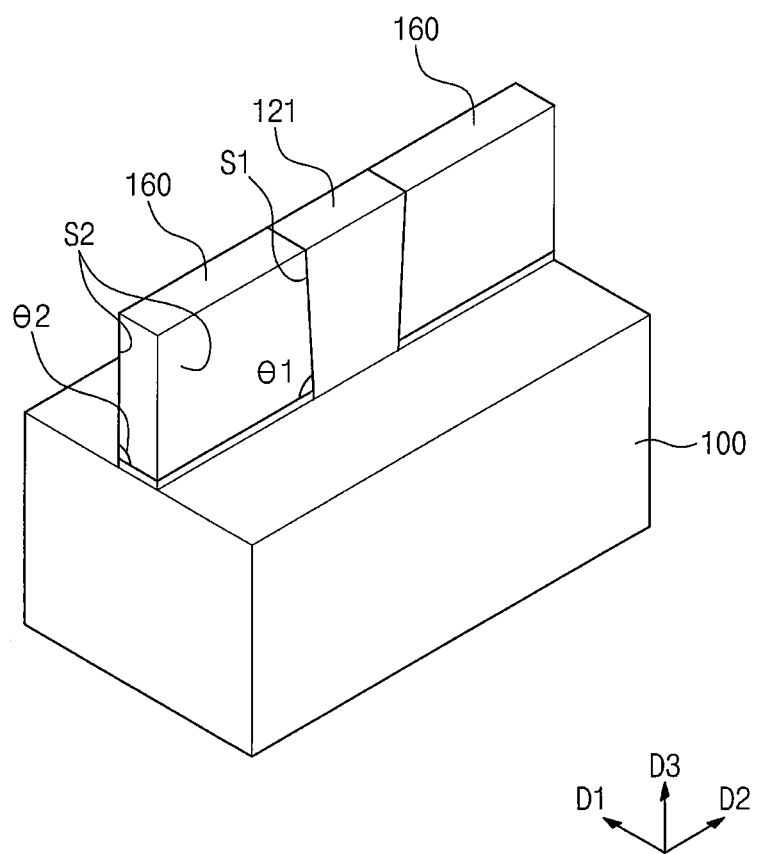
Figure 5:
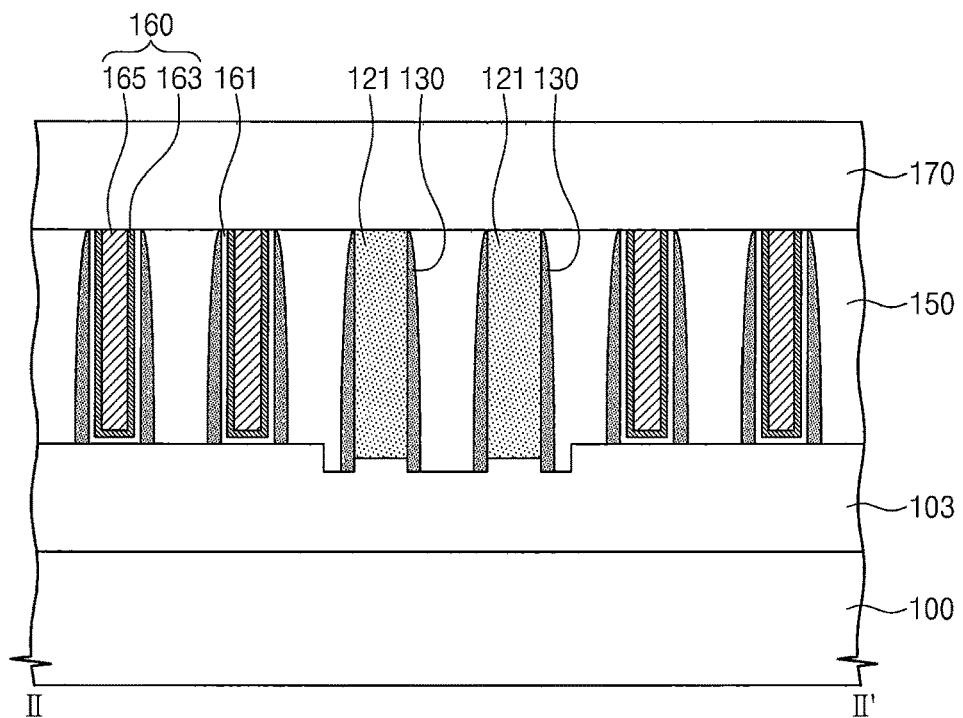
FIGS. 5 and 6 are cross-sectional views taken along the line II-II' of FIG. 1 to illustrate semiconductor devices according to some embodiments of the inventive concepts.
Figure 6:
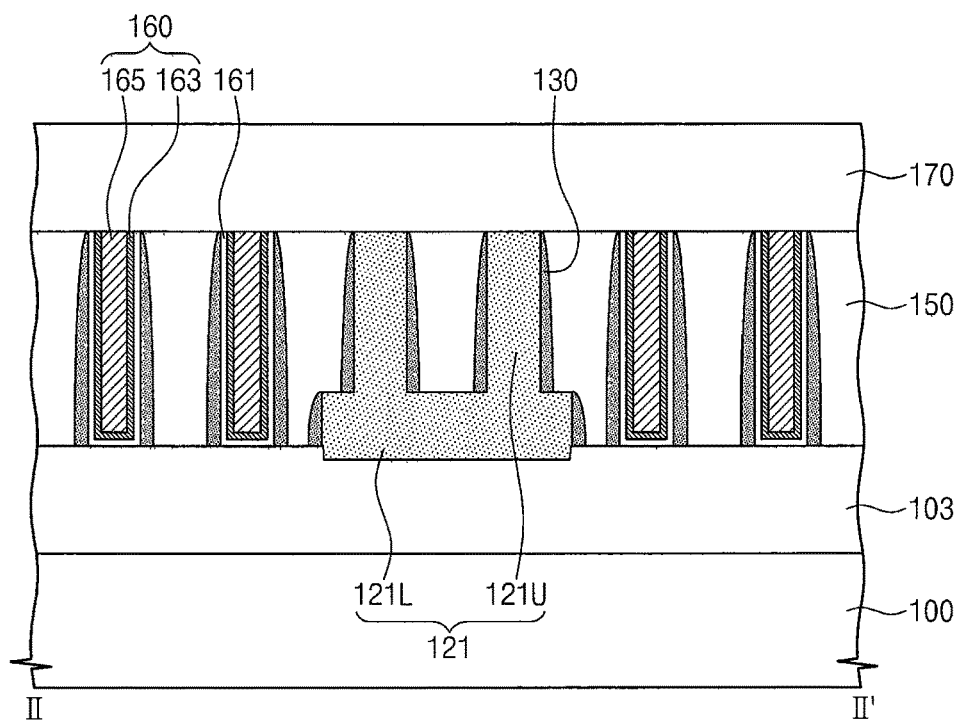

FIG. 1 is a plan view illustrating a semiconductor device according to some embodiments of the inventive concepts. FIGS. 2A, 2B, and 2C are cross-sectional views taken along the lines I-I', II-II', and III-III' of FIG. 1, respectively, to illustrate a semiconductor device according to some embodiments of the inventive concepts. FIGS. 3 and 4 are perspective views illustrating a semiconductor device according to some embodiments of the inventive concepts. FIGS. 5 and 6 are cross-sectional views illustrating a semiconductor device according to some embodiments of the inventive concepts.

Referring to FIGS. 1, 2A, 2B, 2C, and 3, a plurality of gate structures GS may extend in one direction (e.g., D2) and may be spaced apart from each other on a substrate (e.g., semiconductor substrate) 100. Each of the gate structures GS may include a pair of gate spacers 130 extending in the one direction D2, gate electrodes 160 disposed between the pair of gate spacers 130 and spaced apart from each other in the one direction D2, and gate separation patterns 121 disposed between the gate electrodes 160 and between the pair of gate spacers 130. The gate structures GS may intersect active patterns 101 defined in the semiconductor substrate 100, and epitaxial layers 140 may be disposed in the active patterns 101 at both sides of each of the gate structures GS. In some embodiments, a first interlayer insulating layer 150 may cover the epitaxial layers 140 and may fill spaces defined between the gate structures GS. A second interlayer insulating layer 170 may be disposed on top surfaces of the gate structures GS and the first interlayer insulating layer 150. In some embodiments, the pair of gate spacers 130 may be spaced apart from each other by a constant distance along the one direction D2 as illustrated in FIG. 1.

In more detail, the active patterns 101 may vertically protrude from the semiconductor substrate 100 and may have long axes parallel to a first direction D1. Each of the active patterns 101 may have a longitudinal axis extending in the first direction D1. Each of the active patterns 101 may have a bar shape or a linear shape. The active patterns 101 may be defined by a device isolation layer 103 formed on the semiconductor substrate 100. In some embodiments, a top surface of the device isolation layer 103 may be lower than the top surfaces of the active patterns 101 as illustrated in, for example, FIG. 2C.

The gate electrodes 160 may be disposed on the semiconductor substrate 100 to intersect the active patterns 101 and may be two-dimensionally arranged. In other words, the gate electrodes 160 may be spaced apart from each other in the first direction D1 and a second direction D2 that may be perpendicular to each other. Each of the gate electrodes 160 may intersect at least one of the active patterns 101 and may have long axes parallel to the second direction D2. Each of the gate electrodes 160 may have a longitudinal axis extending in the second direction D2 as illustrated in FIG. 1. In some embodiments, the gate electrodes 160 may be on sidewalls and top surfaces of the active patterns 101. The gate electrodes 160 may be spaced apart from each other in the second direction D2 on the device isolation layer 103.

Each of the gate electrodes 160 may have first opposing sidewalls S1 that are spaced apart from each other in the second direction D2 and second opposing sidewalls S2 that are spaced apart from each other in the first direction D1, as illustrated in FIG. 4. One of the first sidewalls S1 may form a first angle θ1 with a top surface of the semiconductor substrate 100, and the second sidewalls S2 may form a second angle θ2 with the top surface of the semiconductor substrate 100. The second angle θ2 may be greater than the first angle θ1.

In some embodiments, each of the gate electrodes 160 may include a barrier metal pattern 163 and a metal pattern 165 which are sequentially formed, and the barrier metal pattern 163 may extend between the metal pattern 165 and the semiconductor substrate 100 and between the metal pattern 165 and gate spacers 130 as illustrated in FIG. 2C. In some embodiments, the barrier metal pattern 163 may be formed of a conductive material having a predetermined work function. The barrier metal pattern 163 may be formed of one of metal nitrides. The metal pattern 165 may be formed of at least one of materials having a specific resistance lower than that of the barrier metal pattern 163. For example, the metal pattern 165 may include at least one of metals.

According to some embodiments, each of the gate separation patterns 121 may be disposed between two of the gate electrodes 160 adjacent to each other in the second direction D2. The gate separation patterns 121 may be adjacent to the first opposing sidewalls (e.g., S1 of FIG. 4) of the two of the gate electrodes 160. In other words, each of the gate electrodes 160 may be disposed between the gate separation patterns 121 adjacent to each other in the second direction D2. A width of each of the gate separation patterns 121 in the first direction D1 may be substantially equal to a width of each of the gate electrode 160 in the first direction D1. The gate separation patterns 121 may be formed of an insulating material and may be disposed on the device isolation layer 103. The gate separation patterns 121 may overlap the device isolation layer 103 when view from a plan perspective. For example, the gate separation patterns 121 may include a silicon oxide layer, a silicon nitride layer, a silicon oxynitride layer and/or low-k dielectric layers. One of the gate separation patterns 121 may be adjacent to another of the gate separation patterns 121 that is spaced apart from the one of the gate separation patterns in the first direction D1 and may be adjacent to still another of the gate separation patterns 121 in a direction diagonal to the first direction D1 as illustrated in FIG. 1. In some embodiments, top surfaces of the gate separation patterns 121 may be substantially coplanar with top surfaces of the gate electrodes 160. Bottom surfaces of the gate separation patterns 121 may be lower than bottom surfaces of the gate electrodes 160. In some embodiments, portions of the device isolation layer 103 at both sides of each of the gate separation patterns 121 may be recessed as illustrated in FIG. 5. In other words, the bottom surfaces of the gate separation patterns 121 may be lower than the bottom surfaces of the gate electrodes 160, and top surfaces of the portions of the device isolation layer 103 may be lower than the bottom surfaces of the gate separation patterns 121. In some embodiments, the gate separation pattern 121 may include a lower portion 121L and an upper portion 121U protruding upward from the lower portion 121L as illustrated in FIG. 6. Here, a width of the upper portion 121U of the gate separation pattern 121 may be smaller than a width of the lower portion 121L and may be substantially equal to a width of the gate electrodes 160. In addition, the lower portions 121L of the gate separation patterns 121 adjacent to each other in the first direction D1 may be connected to each other. In other words, a portion of the gate separation pattern 121 may be disposed between the gate structures GS.

The gate spacers 130 may be disposed on both sidewalls of the gate electrodes 160 and both sidewalls of the gate separation patterns 121. The gate spacers 130 may extend in the second direction D2 to be on the second opposing sidewalls S2 of FIG. 4 of the gate electrodes 160 and the sidewalls of the gate separation patterns 121. In some embodiments, each of the gate spacers 130 may include first and second spacers 131 and 133 that are formed of insulating materials different from each other. The first spacer 131 may have an L-shape cross section. The first spacer 131 may extend between the second spacer 133 and the semiconductor substrate 100 and on the second opposing sidewalls S2 of the gate electrode 160. The first spacer 131 may be in direct contact with the gate separation patterns 121. In some embodiments, the first spacer 131 may be formed of a different material from the gate separation patterns 121.

Bottom surfaces of the gate spacers 130 disposed at both sides of the gate separation pattern 121 may be lower than the bottom surface of the gate separation pattern 121, as illustrated in FIG. 5.

In some embodiment, the gate spacers 130 may be disposed on the lower portion 121L of the gate separation pattern 121 to cover sidewalls of the upper portion 121U of the gate separation pattern 121 as illustrated in FIG. 6. In addition, the gate spacers 130 may also cover sidewalls of the lower portion 121L of the gate separation pattern 121 as illustrated in FIG. 6.

A gate insulating layer 161 may be disposed between each of the gate electrodes 160 and the active pattern 101. In some embodiments, the gate insulating layer 161 may extend between one of the first opposing sidewalls S1 of the gate electrode 160 and one of the gate separation patterns 121 and between the second opposing sidewalls S2 of the gate electrode 160 and the gate spacers 130. In other words, the gate separation patterns 121 may be in contact with the gate spacers 130 and may be in contact with the gate insulating layer 161.

The epitaxial layers 140 may be disposed in the semiconductor substrate 100 at both sides of each of the gate electrodes 160. The active pattern 101 may be disposed between the epitaxial layers 140 adjacent to each other, and bottom surfaces of the epitaxial layers 140 may be lower than top surfaces of the active patterns 101. The epitaxial layers 140 may be source/drain electrodes of a field effect transistor and may be formed of a material capable of providing tensile stress or compressive stress to the active patterns 101. The epitaxial layers 140 may be formed of a material of which a lattice constant is different from that of a material of the active pattern 101. For example, the epitaxial layers 140 may be formed of silicon carbide (SiC) or silicon-germanium (SiGe).

Figure 7A:
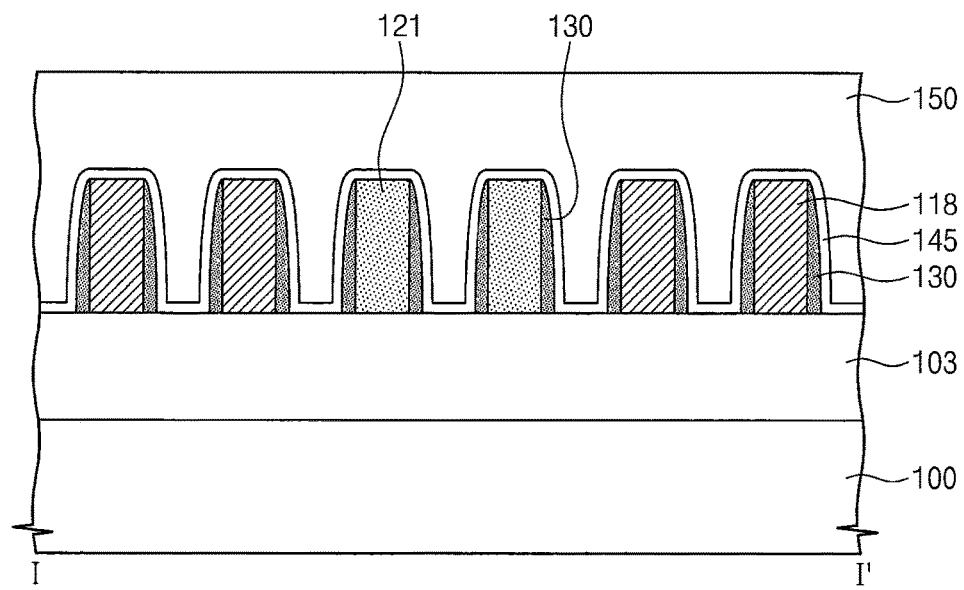
FIGS. 7A, 7B, and 7C are cross-sectional views taken along the lines I-I', II-II', and III-III' of FIG. 1, respectively, to illustrate a semiconductor device according to some embodiments of the inventive concepts.
Figure 7B:
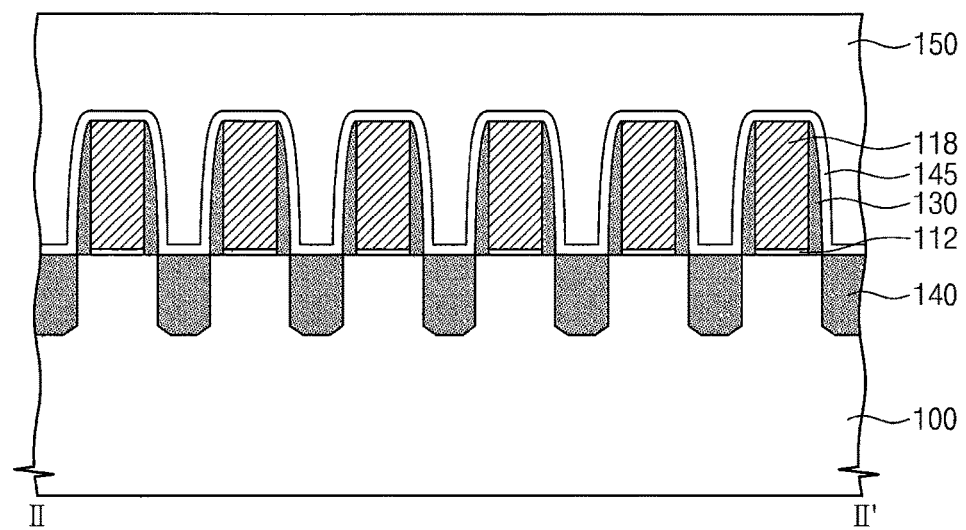
Figure 7C:
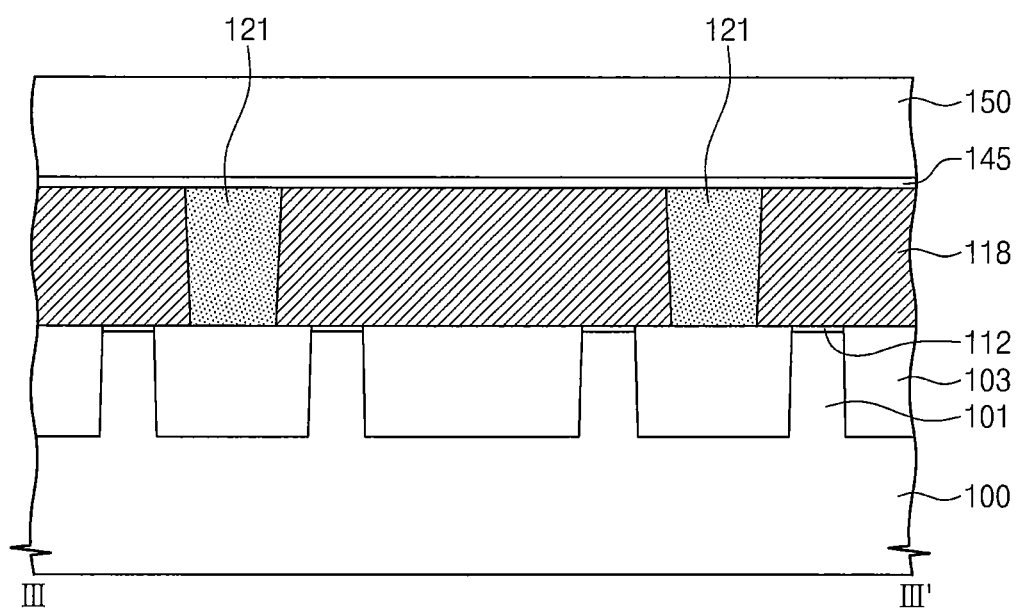

FIGS. 7A, 7B, and 7C are cross-sectional views taken along the lines I-I', II-II', and III-III' of FIG. 1, respectively, to illustrate a semiconductor device according to some embodiments of the inventive concepts. The same or similar technical descriptions described with reference to FIGS. 2A, 2B, and 2C will be omitted or mentioned briefly for the purpose of ease and convenience in explanation.

Referring to FIGS. 1, 7A, 7B, and 7C, gate conductive patterns 118 intersecting the active patterns 101 may be two-dimensionally disposed on the semiconductor substrate 100. The gate conductive patterns 118 may correspond to gate electrodes (e.g., 160 of FIGS. 2A, 2B, and 2C). The gate conductive patterns 118 may be spaced apart from each other in the first direction D1 and the second direction D2 that may be perpendicular to each other. Each of the gate conductive patterns 118 may intersect at least one of the active patterns 101 and may have long axes parallel to the second direction D2. Each of the gate conductive patterns 118 may have a longitudinal axis extending in the second direction D2 as illustrated in FIG. 1. In some embodiments, the gate conductive patterns 118 may be disposed to intersect the top surfaces of the active patterns 101.

The active patterns 101 may correspond to portions of the semiconductor substrate 100 defined by the device isolation layer 103. The active patterns 101 may have long axes in the first direction D1. Each of the active patterns 101 may have a longitudinal direction extending in the first direction D1. In some embodiments, the top surfaces of the active patterns 101 may be substantially coplanar with the top surface of the device isolation layer 103.

A gate insulating layer 112 may be disposed between the gate conductive pattern 118 and the active pattern 101.

The gate spacers 130 may extend in the second direction D2 to cover sidewalls of the gate conductive patterns 118 and the gate separation patterns 121 arranged in the second direction D2. In some embodiments, first opposing sidewalls (e.g., S1 of FIG. 4) of the gate conductive patterns 118 that are spaced apart from each other in the second direction D2 may be in direct contact with the gate separation patterns 121 as illustrated in FIG. 7C. Second opposing sidewalls (e.g., S2 of FIG. 4) of the gate conductive patterns 118 that are spaced apart from each other in the first direction D1 may be in direct contact with the gate spacers 130 as illustrated in FIGS. 7A and 7B. In some embodiments, the gate spacers 130 may be formed of the substantially same material as the gate separation patterns 121. In some embodiments, the gate spacers 130 may include an insulating material different from the gate separation patterns 121. Epitaxial layers 140 may be disposed in the semiconductor substrate 100 at both sides of each of the gate conductive patterns 118.

Each of the gate separation patterns 121 may be disposed between two of the gate conductive patterns 118 adjacent to each other in the second direction D2 and between the gate spacers 130 adjacent to each other in the first direction D1. In some embodiments, top surfaces of the gate separation patterns 121 may be substantially coplanar with top surfaces of the gate conductive patterns 118.

An interlayer insulating layer 150 may be disposed on the semiconductor substrate 100 to cover the top surfaces of the gate conductive patterns 118 and the top surfaces of the gate separation patterns 121. In addition, the interlayer insulating layer 150 may fill spaces between the gate spacers 130. In some embodiments, an etch stop layer 145 may conformally cover the gate conductive patterns 118, the gate separation patterns 121, and the gate spacers 130. The interlayer insulating layer 150 may be disposed on the etch stop layer 145. The etch stop layer 145 may be formed of an insulating material having an etch selectivity with respect to the interlayer insulating layer 150.

Figure 8:
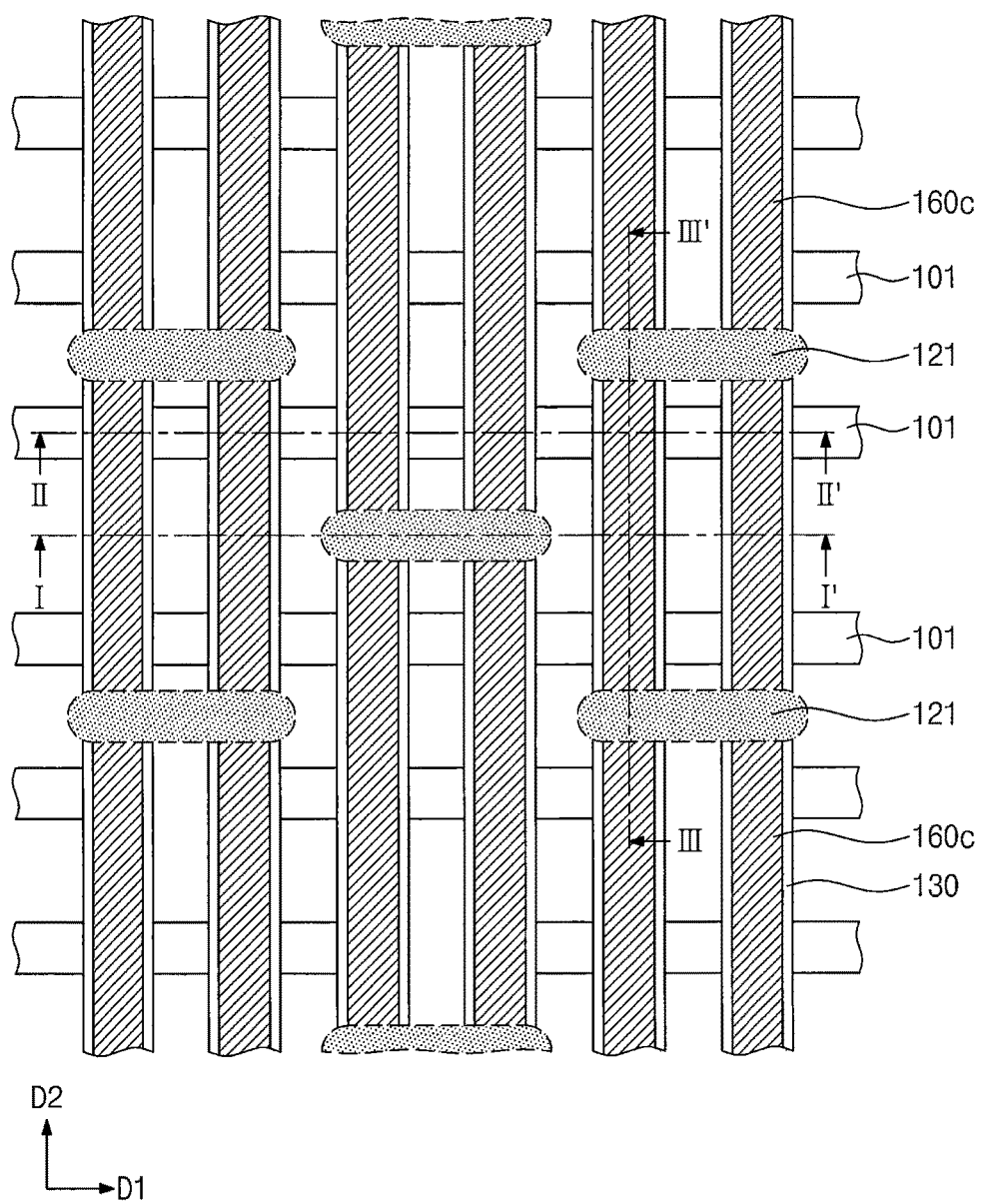
FIG. 8 is a plan view illustrating a semiconductor device according to some embodiments of the inventive concepts.
Figure 9A:
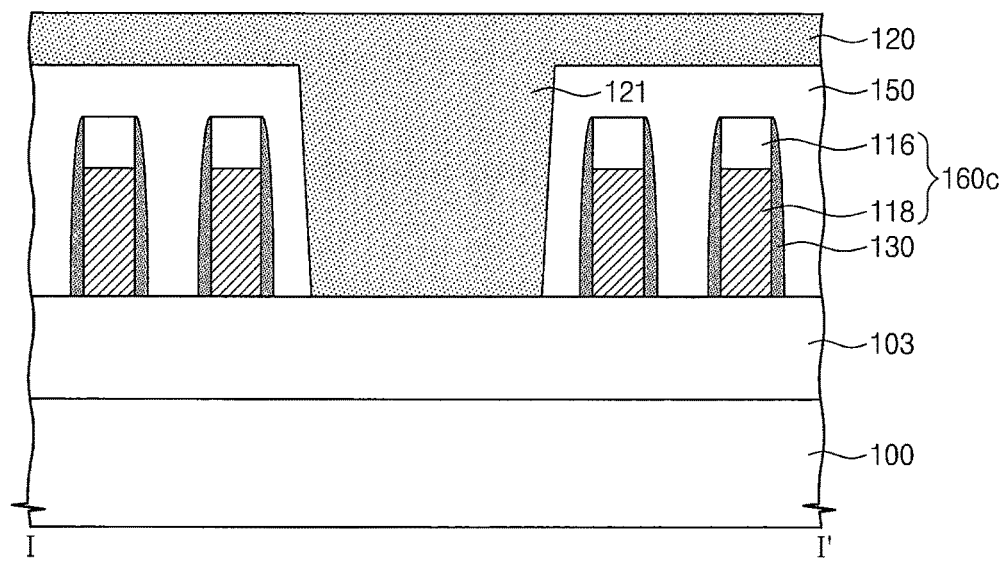
FIGS. 9A, 9B, and 9C are cross-sectional views taken along the lines I-I', II-II', and III-III' of FIG. 8, respectively, to illustrate a semiconductor device according to some embodiments of the inventive concepts.
Figure 9B:
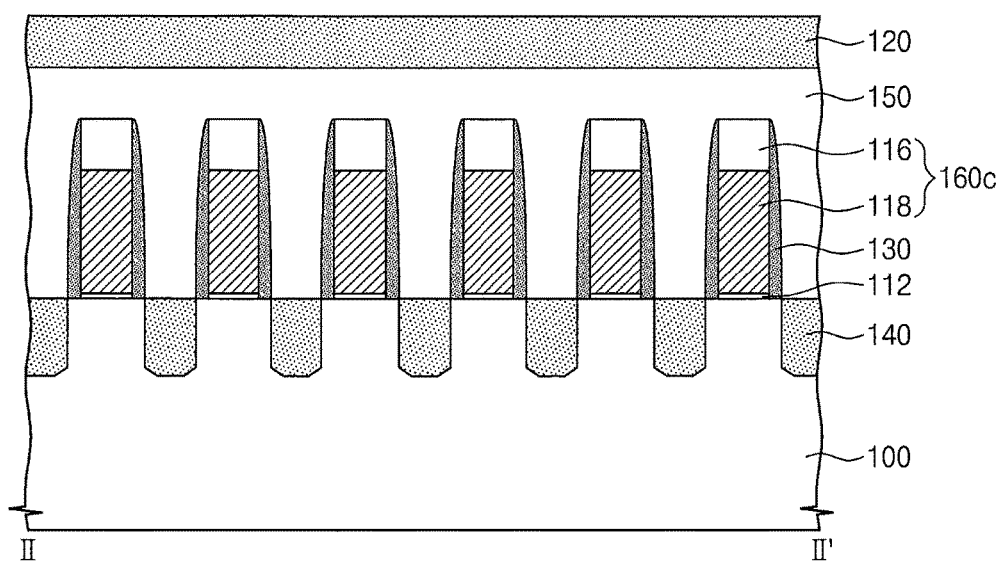
Figure 9C:
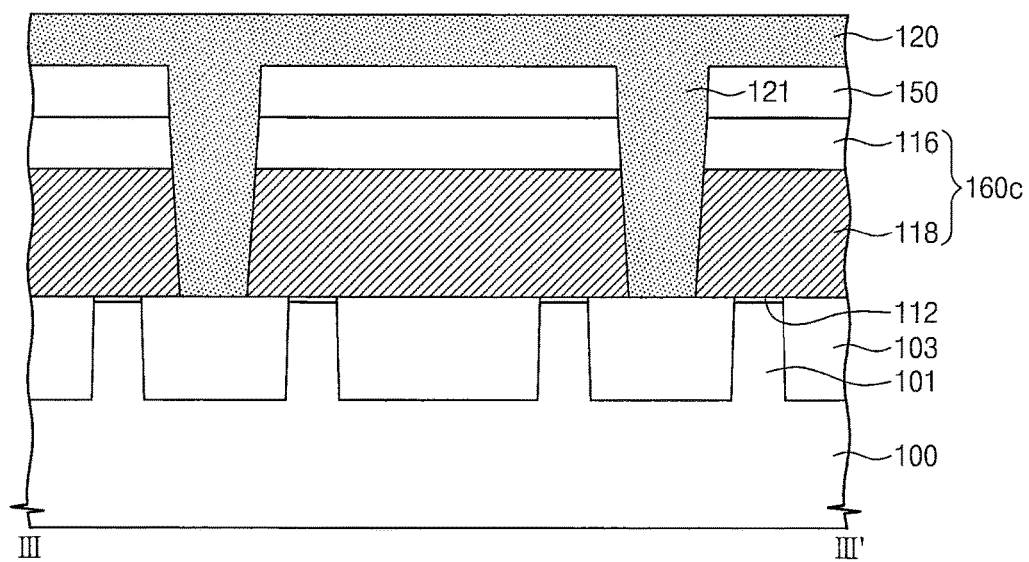

FIG. 8 is a plan view illustrating a semiconductor device according to some embodiments of the inventive concepts. FIGS. 9A, 9B, and 9C are cross-sectional views taken along lines I-I', II-II', and III-III' of FIG. 8, respectively, to illustrate a semiconductor device according to some embodiments of the inventive concepts.

Referring to FIGS. 8, 9A, 9B, and 9C, gate electrodes 160c intersecting active patterns 101 may be two-dimensionally disposed on a semiconductor substrate 100.

The active patterns 101 may have long axes in a first direction D1 and may have bar shapes or linear shapes. Each of the active patterns 101 may have a longitudinal axis extending the first direction D1. The active patterns 101 may be defined by a device isolation layer 103 formed on the semiconductor substrate 100.

In some embodiments, each of the gate electrodes 160c may include a gate conductive pattern 118 and a hard mask pattern 116 as illustrated if FIGS. 9A and 9B. The gate conductive pattern 118 may be a gate electrode. The gate electrodes 160c may be arranged to be spaced apart from each other in the first direction D1 and the second direction D2.

Gate spacers 130 may cover the sidewalls of the gate electrodes 160c, and the gate spacers 130 that are arranged in the second direction D2 may be separated from each other by gate separation patterns 121 as illustrated in FIG. 8.

Epitaxial layers 140 used as source/drain electrodes may be disposed in the active patterns 101 between the gate electrodes 160c arranged in the first direction D1. The epitaxial layers 140 may have bottom surfaces lower than the top surfaces of the active patterns 101 and may be formed of a material of which a lattice constant is different from that of the active patterns 101 disposed under the gate electrodes 160c.

An interlayer insulating layer 150 may be disposed on the semiconductor substrate 100 to cover the gate electrodes 160c, the gate spacers 130, and the epitaxial layers 140.

In some embodiments, a gate separation layer 120 may cover an entire top surface of the interlayer insulating layer 150 and may fill a space between two of the gate electrodes 160c adjacent to each other in the second direction D2. The portion of the gate separation layer 120 filling the space between the two of the gate electrodes 160c may correspond to the gate separation pattern 121. The gate separation pattern 121 of the gate separation layer 120 may intersect at least two gate electrodes 160c adjacent to each other in the first direction D1 as illustrated in FIG. 8. The gate separation pattern 121 of the gate separation layer 120 may be in direct contact with sidewalls of the gate electrodes 160c adjacent to each other in the second direction D2. The gate separation pattern 121 of the gate separation layer 120 may be disposed on the device isolation layer 103 between the active patterns 101 adjacent to each other in the second direction D2. The gate separation pattern 121 of the gate separation layer 120 may overlap the device isolation layer 103 when viewed from a plan perspective. It will be understood that the gate separation layer 120 is not shown in FIG. 8 to show elements underlying the gate separation layer 120.

Figure 10:
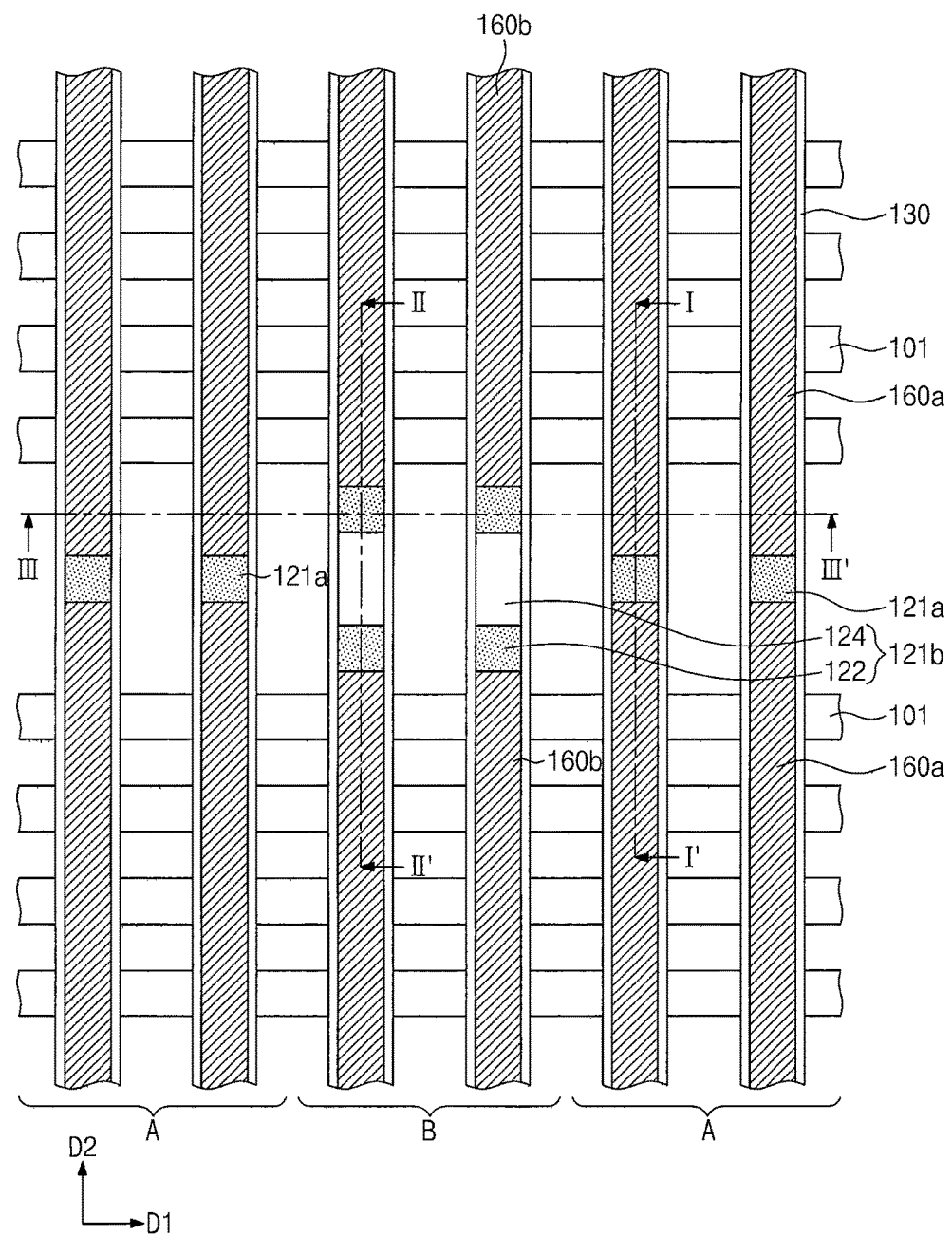
FIG. 10 is a plan view illustrating a semiconductor device according to some embodiments of the inventive concepts.
Figure 11A:
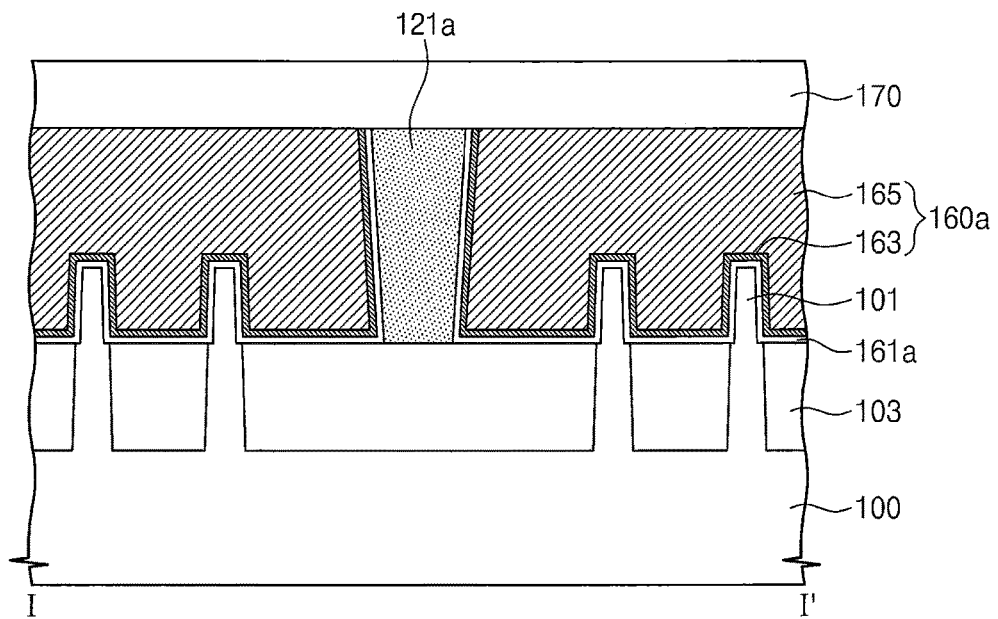
FIGS. 11A, 11B, and 11C are cross-sectional views taken along the lines I-I', II-II', and III-III' of FIG. 10, respectively, to illustrate a semiconductor device according to some embodiments of the inventive concepts.
Figure 11B:
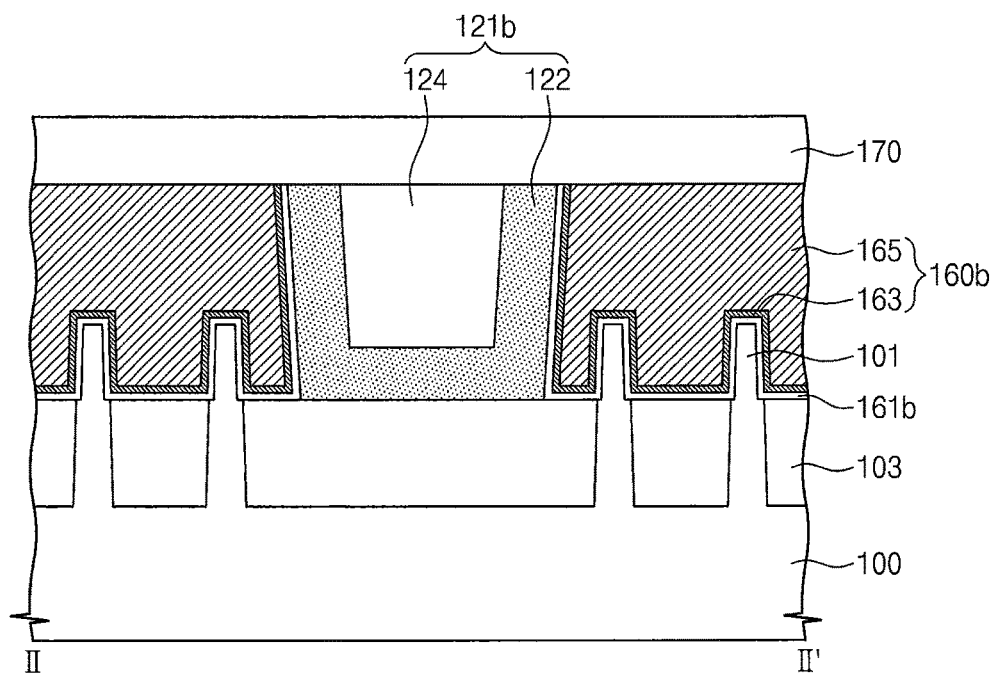
Figure 11C:
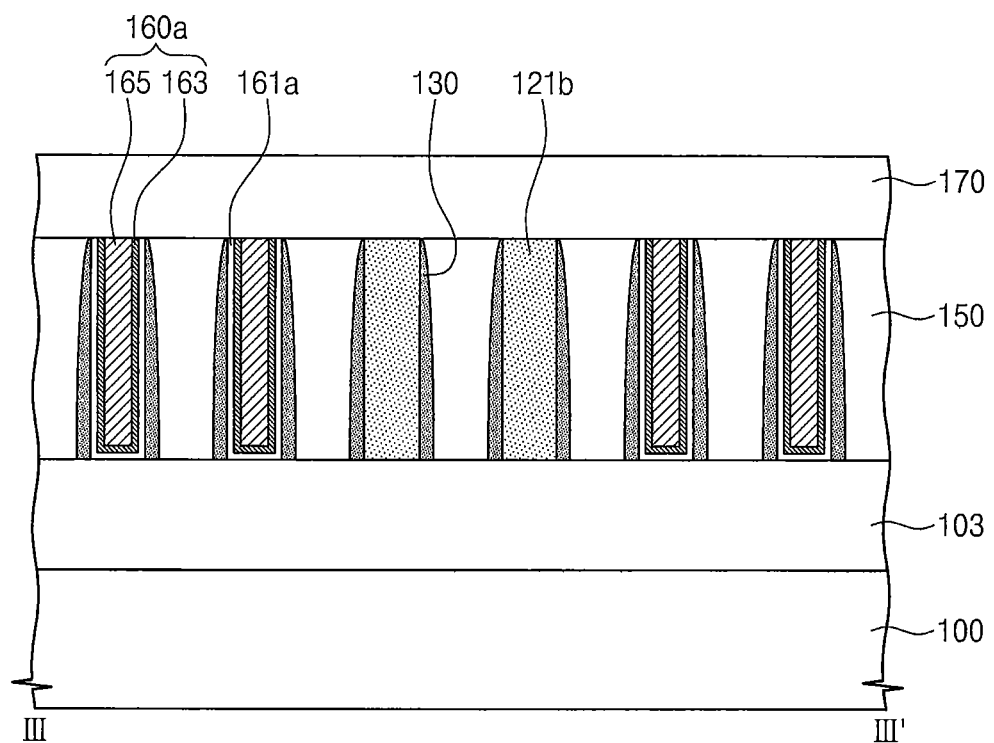

FIG. 10 is a plan view illustrating a semiconductor device according to some embodiments of the inventive concepts. FIGS. 11A, 11B, and 11C are cross-sectional views taken along the lines I-I', II-II', and III-III' of FIG. 10, respectively, to illustrate a semiconductor device according to some embodiments of the inventive concepts.

Referring to FIGS. 10, 11A, 11B, and 11C, a semiconductor substrate 100 may include first regions A and second regions B. First gate electrodes 160a may intersect active patterns 101 in the first regions A, and second gate electrodes 160b may intersect active patterns 101 in the second region B.

The active patterns 101 may protrude from the semiconductor substrate 100 and may extend in the first direction D1 to intersect the first and second regions A and B. The active patterns 101 may correspond to portions of the semiconductor substrate 100 defined by a device isolation layer 103, and a top surface of the device isolation layer 103 may be lower than top surfaces of the active patterns 101.

The first gate electrodes 160a may be spaced apart from each other in a first direction D1 and a second direction D2. Likewise, the second gate electrodes 160b may be spaced apart from each other in the first direction D1 and the second direction D2. A distance between the first gate electrodes 160a in the second direction D2 may be smaller than a distance between the second gate electrodes 160b in the second direction D2.

A first gate separation pattern 121a may be disposed between the first gate electrodes 160a adjacent to each other in the second direction D2, and a second gate separation pattern 121b may be disposed between the second gate electrodes 160b adjacent to each other in the second direction D2. The first and second gate separation patterns 121a and 121b may be disposed on the device isolation layer 103 between the active patterns 101 adjacent to each other. The first and second gate separation patterns 121a and 121b may overlap the device isolation layer 103 between the active patterns 101 adjacent to each other when viewed from a plan view as illustrated in FIG. 10. In the first direction D1, the first gate separation pattern 121a may have the same width as the first gate electrodes 160a. Likewise, the second gate separation pattern 121b may have the same width as the second gate electrodes 160b in the first direction D1.

Each of the first and second gate electrodes 160a and 160b may include a barrier metal pattern 163 and a metal pattern 165, and a first gate insulating layer 161a may be disposed between the first gate electrode 160a and the active pattern 101. The first gate insulating layer 161a may extend between the first gate separation pattern 121a and the first gate electrode 160a as illustrated in FIG. 11A. A second gate insulating layer 161b may be disposed between the second gate electrode 160b and the active pattern 101. The second gate insulating layer 161b may extend between the second gate separation pattern 121b and the second gate electrode 160b as illustrated in FIG. 11B.

Gate spacers 130 may be disposed on both sidewalls of the first and second gate electrodes 160a and 160b and may extend in the second direction D2 so as to be in direct contact with the first and second gate separation patterns 121a and 121b.

The second gate separation pattern 121b may include a first insulating pattern 122 and a second insulating pattern 124 that are formed of materials different from each other. The first insulating pattern 122 may extend from on the device isolation layer 103, which is disposed between the second gate electrodes 160b adjacent to each other in the second direction D2, onto sidewalls of the second gate electrodes 160b adjacent to each other, as illustrated in FIG. 11B. In some embodiments, a thickness of the first insulating pattern 122 (e.g., a thickness of the first insulating pattern 122 in the second direction D2) may be smaller than the distance between the second gate electrodes 160b adjacent to each other in the second direction D2. The second insulating pattern 124 may be disposed on the first insulating pattern 122 to fill the space between the second gate electrodes 160b adjacent to each other in the second direction D2.

In some embodiments, top surfaces of the first and second gate electrodes 160a and 160b may be substantially coplanar with top surfaces of the first and second gate separation patterns 121a and 121b.

Epitaxial layers (not shown) may be disposed at both sides of each of the first and gate electrodes 160a and 160b, and a first interlayer insulating layer 150 may fill a space between the first gate electrodes 160a and a space between the second gate electrodes 160b. A second interlayer insulating layer 170 may cover the first and second gate electrodes 160a and 160b and the first and second gate separation patterns 121a and 121b.

In addition, bottom surfaces of the first and second gate separation patterns 121a and 121b may be lower than bottom surfaces of the first and second gate electrodes 160a and 160b, as described with reference to FIGS. 2A, 2B, and 2C.

Figure 12A:
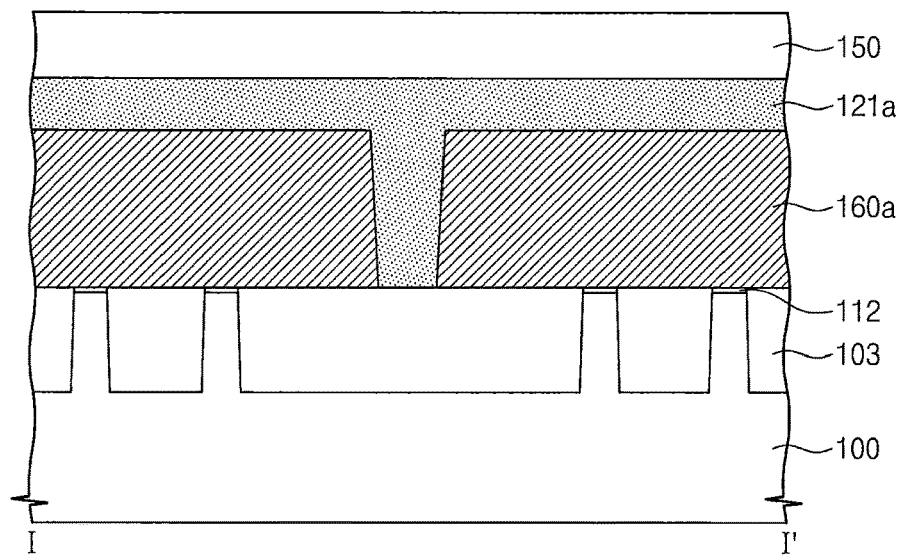
FIGS. 12A, 12B, and 12C are cross-sectional views taken along the lines I-I', II-II', and III-III' of FIG. 10, respectively, to illustrate a semiconductor device according to some embodiments of the inventive concepts.
Figure 12B:
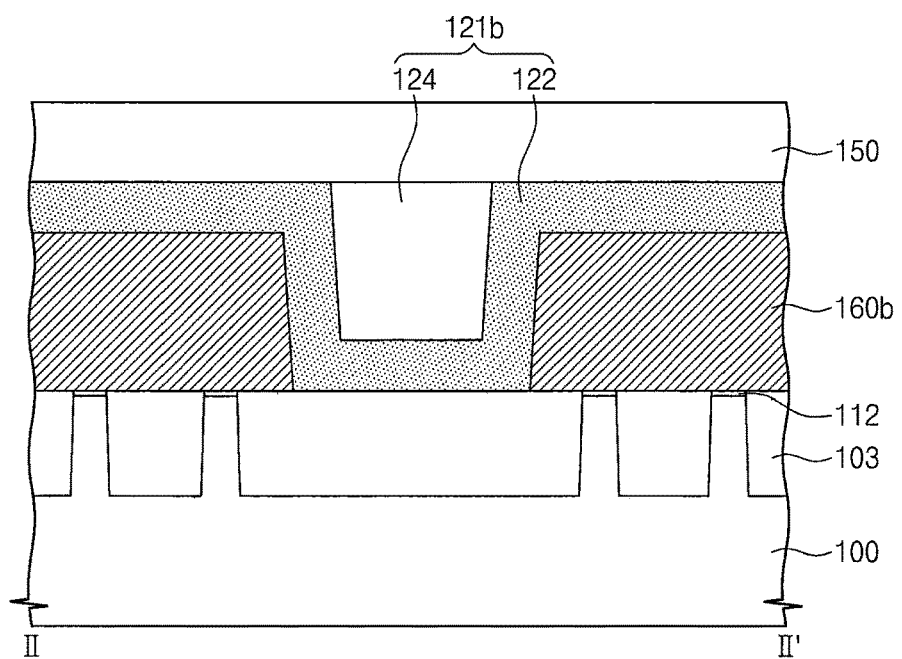
Figure 12C:
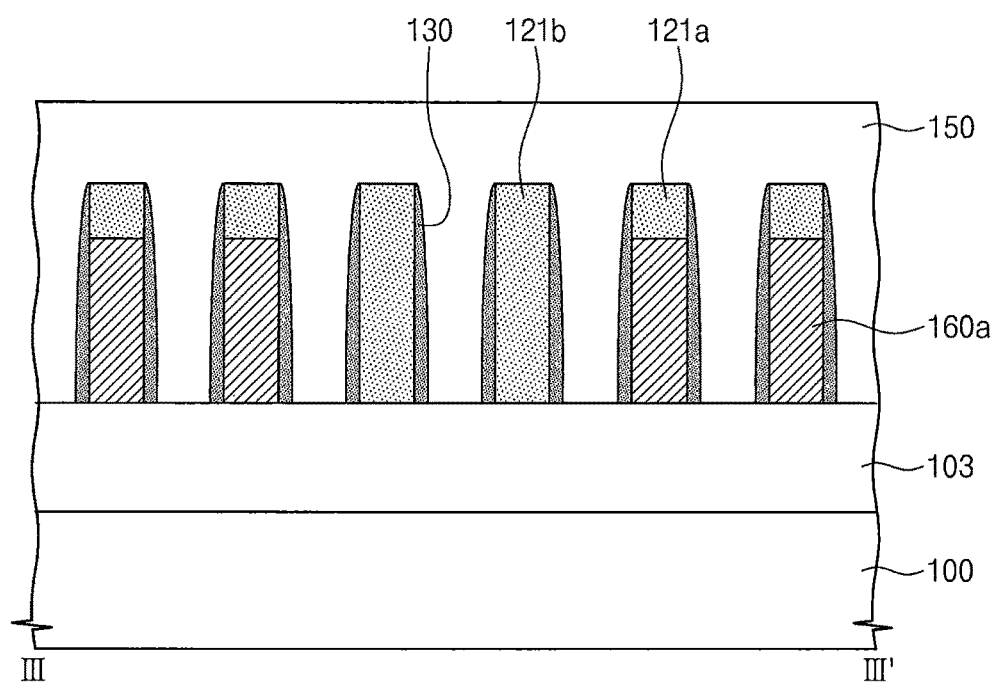

FIGS. 12A, 12B, and 12C are cross-sectional views taken along the lines I-I', II-II', and III-III' of FIG. 10, respectively, to illustrate a semiconductor device according to some embodiments of the inventive concepts. The same and similar technical descriptions described with reference to FIGS. 11A, 11B, and 11C will be omitted or mentioned briefly for the purpose of ease and convenience in explanation.

Referring to FIGS. 10, 12A, 12B, and 12C, a semiconductor substrate 100 may include first and second regions A and B, and active patterns 101 may extend in a first direction D1 to intersect the first and second regions A and B. In some embodiments, active patterns 101 may correspond to portions of the semiconductor substrate 100 defined by a device isolation layer 103.

First gate electrodes 160a may intersect the active patterns 101 in the first regions A, and second gate electrodes 160b may intersect the active patterns 101 in the second regions B. The first gate electrodes 160a may be spaced apart from each other in the first direction D1 and the second direction D2. Likewise, the second gate electrodes 160b may be spaced apart from each other in the first direction D1 and the second direction D2. A distance between the first gate electrodes 160a in the second direction D2 may be smaller than a distance between the second gate electrodes 160b in the second direction D2.

In some embodiments, first and second gate separation patterns 121a and 121b may extend in the second direction D2 to cover the top surfaces of the first and second gate electrodes 160a and 160b. In addition, the first gate separation pattern 121a may fill a space between the first gate electrodes 160a adjacent to each other in the second direction D2, and the second gate separation pattern 121b may fill a space between the second gate electrodes 160b adjacent to each other in the second direction D2. The second gate separation pattern 121b may include a first insulating pattern 122 covering sidewalls of the second gate electrodes 160b and a second insulating pattern 124 disposed on the first insulating pattern 122. The first insulating pattern 122 may extend in the second direction D2 to cover the top surfaces of the second gate electrodes 160b arranged in the second direction D2. The first insulating pattern 122 may conformally cover the sidewalls of the second gate electrodes 160b adjacent to each other in the second direction D2 and a top surface of the device isolation layer 103 disposed between the second gate electrodes 160b. In some embodiments, a thickness of the first insulating pattern 122 (e.g., a thickness of the first insulating pattern 122 in the second direction D2) may be smaller than the distance between the second gate electrodes 160b adjacent to each other in the second direction D2.

The gate spacers 130 of the first region A may extend in the second direction D2 to cover sidewalls of the first gate electrodes 160a and sidewalls of the first gate separation patterns 121a, and the gate spacers 130 of the second region B may extend in the second direction D2 to cover sidewalls of the second gate electrodes 160b and sidewalls of the second gate separation patterns 121b.

Epitaxial layers 140 may be disposed in the active patterns 101 at both sides of each of the first and second gate electrodes 160a and 160b. An interlayer insulating layer 150 may fill a space between the first gate electrodes 160a adjacent to each other in the first direction D1 and a space between the second gate electrodes 160b adjacent to each other in the first direction D1. The interlayer insulating layer 150 may also cover the first and second gate separation patterns 121a and 121b and the first and second gate electrodes 160a and 160b.

FIGS. 13A to 20A, 13B to 20B, and 13C to 20C are cross-sectional views taken along the lines I-I', II-II', and III-III' of FIGS. 13D to 17D to illustrate a method for fabricating the semiconductor device illustrated in FIGS. 1 and 2A to 2C according to some embodiments of the inventive concepts. FIGS. 13D to 17D are plan views illustrating a method for fabricating a semiconductor device according to some embodiments of the inventive concepts.

Referring to FIGS. 13A, 13B, 13C, and 13D, a substrate (e.g., a semiconductor substrate) 100 may be patterned to form active patterns 101.

According to some embodiments, the semiconductor substrate 100 may be a single-crystalline silicon substrate, a silicon-on-insulator (SOI) substrate, a germanium substrate, a germanium-on-insulator (GOI) substrate, a silicon-germanium substrate, or a substrate including an epitaxial layer obtained by performing a selective epitaxial growth (SEG) process.

Figure 13A:
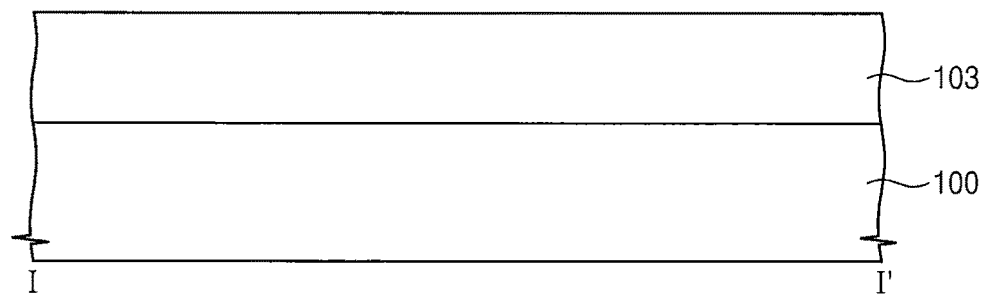
FIGS. 13A, 14A, 15A, 16A, 17A, 18A, 19A and 20A are cross-sectional views taken along the line I-I' of FIGS. 13D to 17D, FIGS. 13B, 14B, 15B, 16B, 17B, 18B, 19B and 20B are cross-sectional views taken along the line II-II' of FIGS. 13D to 17D, and 13C, 14C, 15C, 16C, 17C, 18C, 19C and 20C are cross-sectional views taken along the line III-III' of FIGS. 13D to 17D to illustrate a method for fabricating a semiconductor device according to some embodiments of the inventive concepts.
Figure 13B:
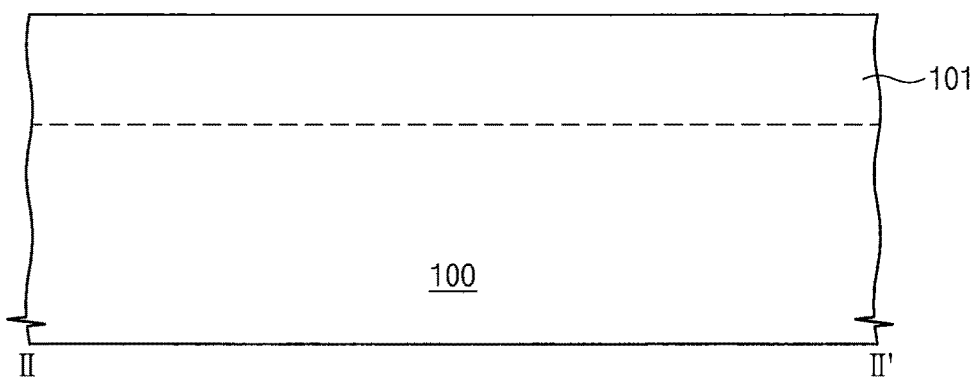
FIGS. 13D, 14D, 15D, 16D and 17D are plan views illustrating a method for fabricating a semiconductor device according to some embodiments of the inventive concepts.
Figure 13C:
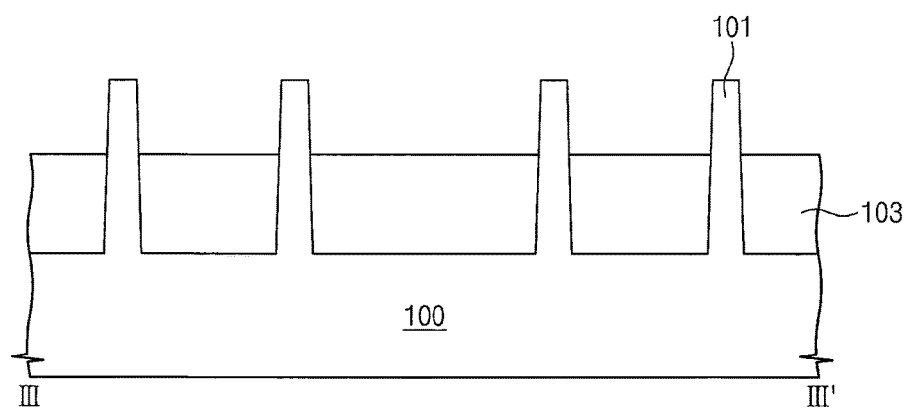
Figure 13D:
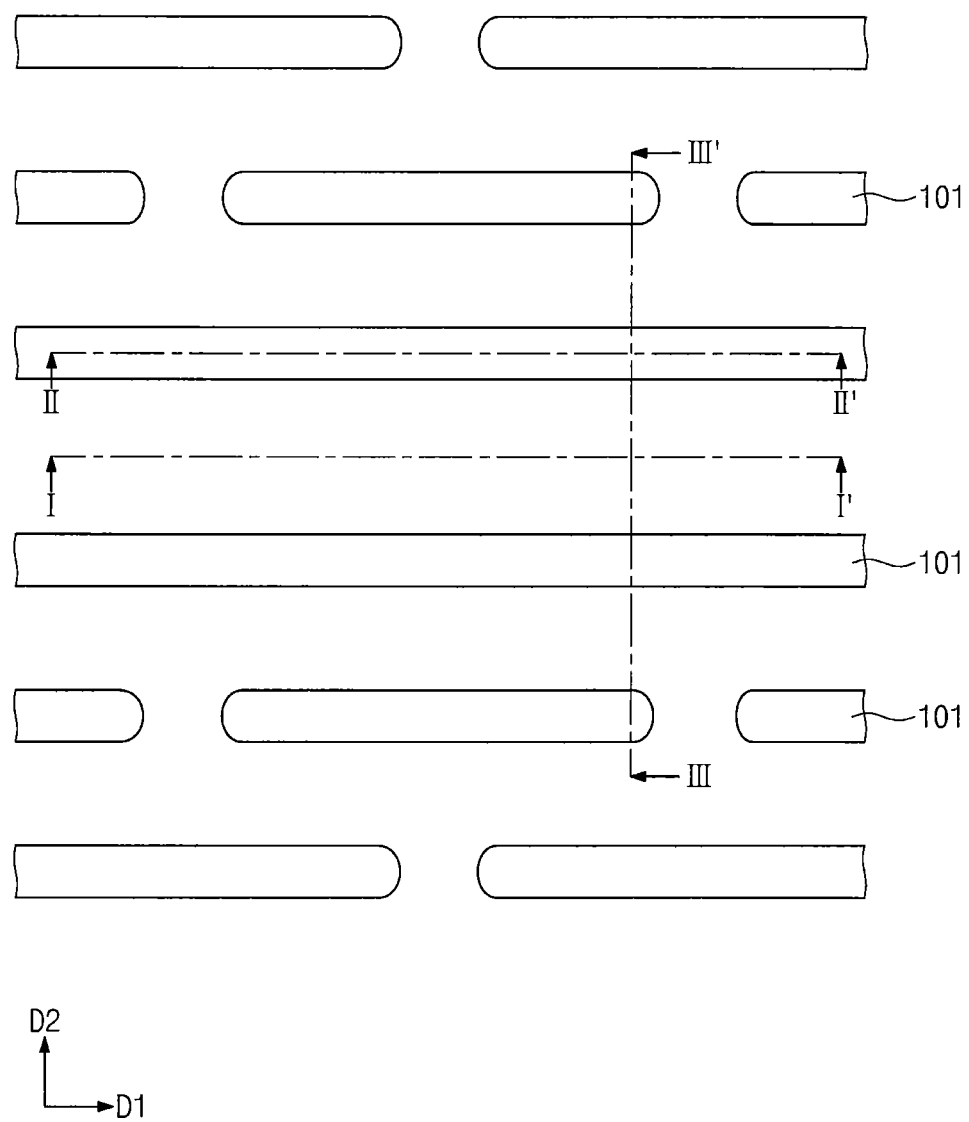

According to some embodiments, each of the active patterns 101 may have a long axis parallel to a first direction D1. Each of the active patterns 101 may have a longitudinal axis extending in the first direction D1 as illustrated in FIG. 13D. The active patterns 101 may have different lengths in the first direction D1. For example, one or more of the active patterns 101 may have a linear shape, and another or others of the active patterns 101 may have a bar shape. Shapes and arrangement of the active patterns 101 may vary.

In some embodiments, forming the active patterns 101 may include forming a mask pattern (not shown) exposing predetermined regions of the semiconductor substrate 100 on the semiconductor substrate 100, and anisotropically etching the semiconductor substrate 100 using the mask pattern as an etch mask to form trenches. The trenches may have linear shapes, and a width of an upper portion of each trench may be greater than that of a lower portion of each trench. In other words, the width of each trench may decrease with depth of the trench.

A device isolation layer 103 may be formed in the trenches. According to some embodiments, forming the device isolation layer 103 may include forming an insulating layer filling the trenches, planarizing the insulating layer to expose a top surface of the mask pattern, and recessing a top surface of the planarized insulating layer to expose sidewalls of upper portions of the active patterns 101. A top surface of the device isolation layer 103 may be lower than the top surfaces of the active patterns 101. In some embodiments, the process of recessing the top surface of the planarized insulating layer may be omitted. Thus, the top surface of the device isolation layer 103 may be substantially coplanar with the top surfaces of the active patterns 101 as illustrated in FIGS. 7A, 7B, and 7C.

Referring to FIGS. 14A, 14B, 14C, and 14D, a dummy gate layer 113 may be formed. The dummy gate layer 113 may include openings OP exposing portions of the device isolation layer 103.

In more detail, a dummy gate insulating layer 111, a dummy gate layer 113, and a hard mask layer 115 may be sequentially formed on an entire surface of the semiconductor substrate 100 including the active patterns 101.

For example, the dummy gate insulating layer 111 may be formed of a silicon oxide layer, a silicon nitride layer, and/or a silicon oxynitride layer. The dummy gate layer 113 may fill a space between the active patterns 101 and may be formed of a material having an etch selectivity with respect to the device isolation layer 103 and the active patterns 101. For example, the dummy gate layer 113 may be formed of a poly-crystalline silicon layer doped with dopants, an undoped poly-crystalline silicon layer, a silicon-germanium layer and/or a silicon carbide layer. For example, the hard mask layer 115 may be formed of a silicon nitride layer and/or a silicon oxynitride layer.

The dummy gate insulating layer 111 may be formed by, for example, a thermal oxidation method, a chemical vapor deposition (CVD) method, and/or an atomic layer deposition (ALD) method. Each of the dummy gate layer 113 and the hard mask layer 115 may be formed by, for example, a CVD process, a physical vapor deposition (PVD) method, and/or an ALD process. In some embodiments, a gate conductive layer may be formed instead of the dummy gate layer 113. The gate conductive layer may include a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride) and/or a metal-semiconductor compound (e.g., a metal silicide).

Figure 14A:
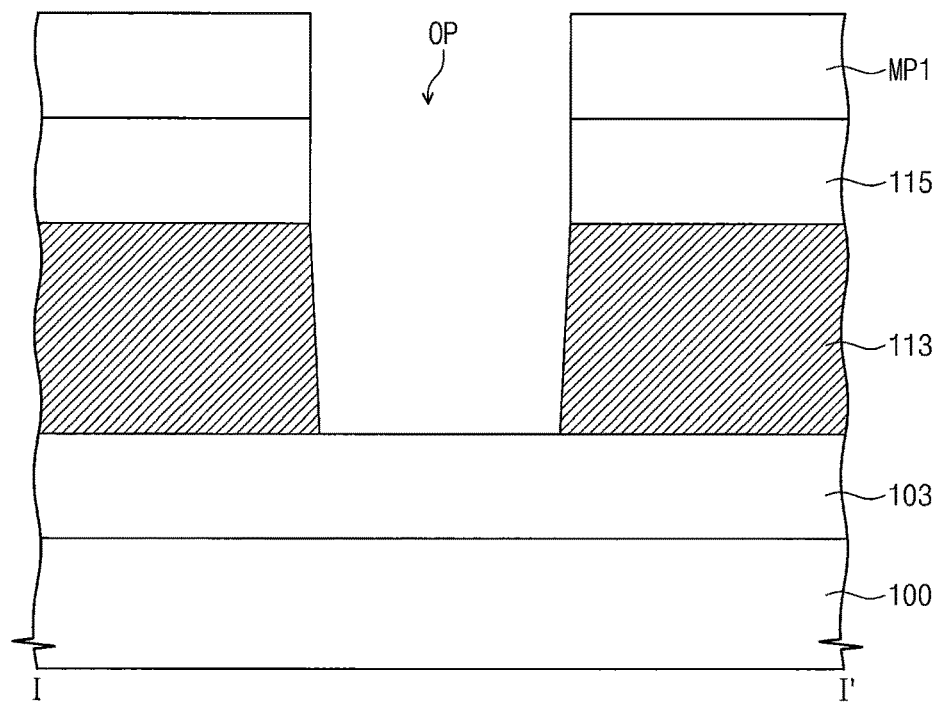
Figure 14B:
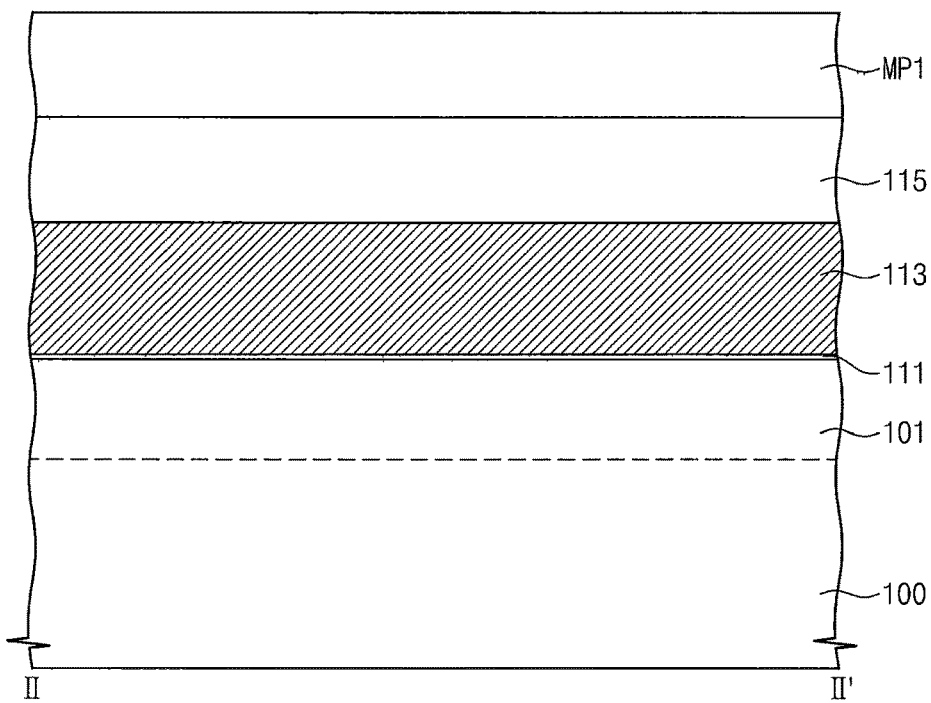
Figure 14C:
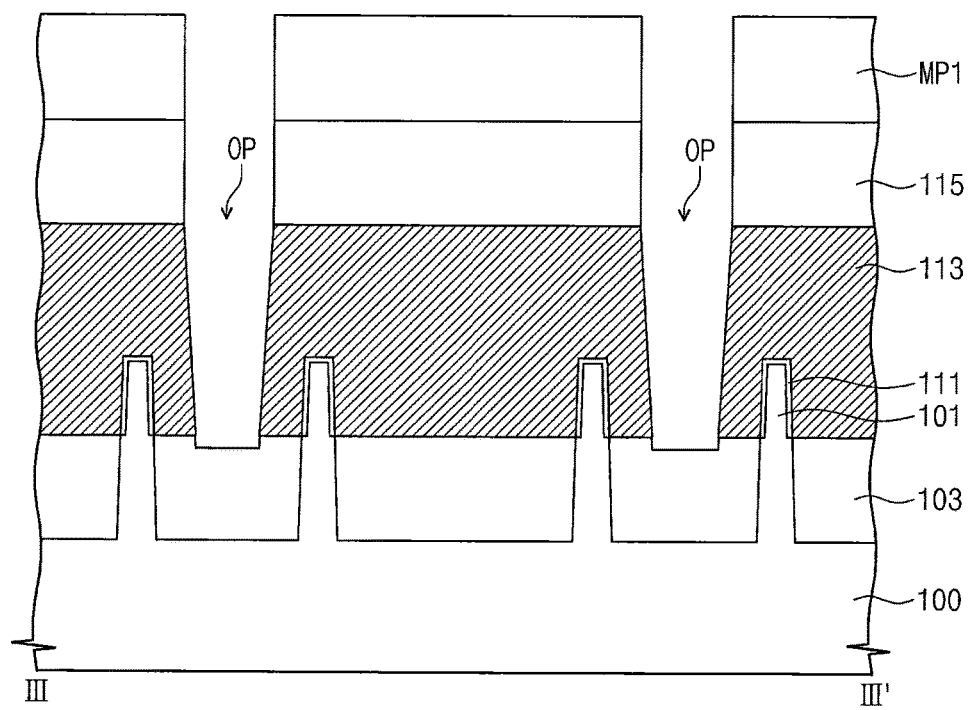

A first mask pattern MP1 including first preliminary openings may be formed on the hard mask layer 115. The hard mask layer 115, the dummy gate layer 113, and the dummy gate insulating layer 111 may be anisotropically etched using the first mask pattern MP1 as an etch mask. Thus, the openings OP may be formed in the hard mask layer 115, the dummy gate layer 113, and the dummy gate insulating layer 111. In some embodiments, the dummy gate insulating layer 111 may be formed by the thermal oxidation method as illustrated in FIGS. 14A to 14D, and the openings OP may penetrate the hard mask layer 115 and the dummy gate layer 113 to expose the portions of the device isolation layer 103. The device isolation layer 103 may be used as an etch stop layer during the anisotropic etching process for forming the openings OP. A width of a lower portion of the opening OP may be smaller than that of an upper portion of the opening OP as illustrated in FIG. 14A. In other words, the width of the opening OP may decrease toward a bottom surface of opening OP. In addition, the portions of the device isolation layer 103 exposed by the openings OP may be recessed by over-etching during the anisotropic etching process for forming the openings OP, as illustrated in FIGS. 2A, 2B, and 2C.

Figure 14D:
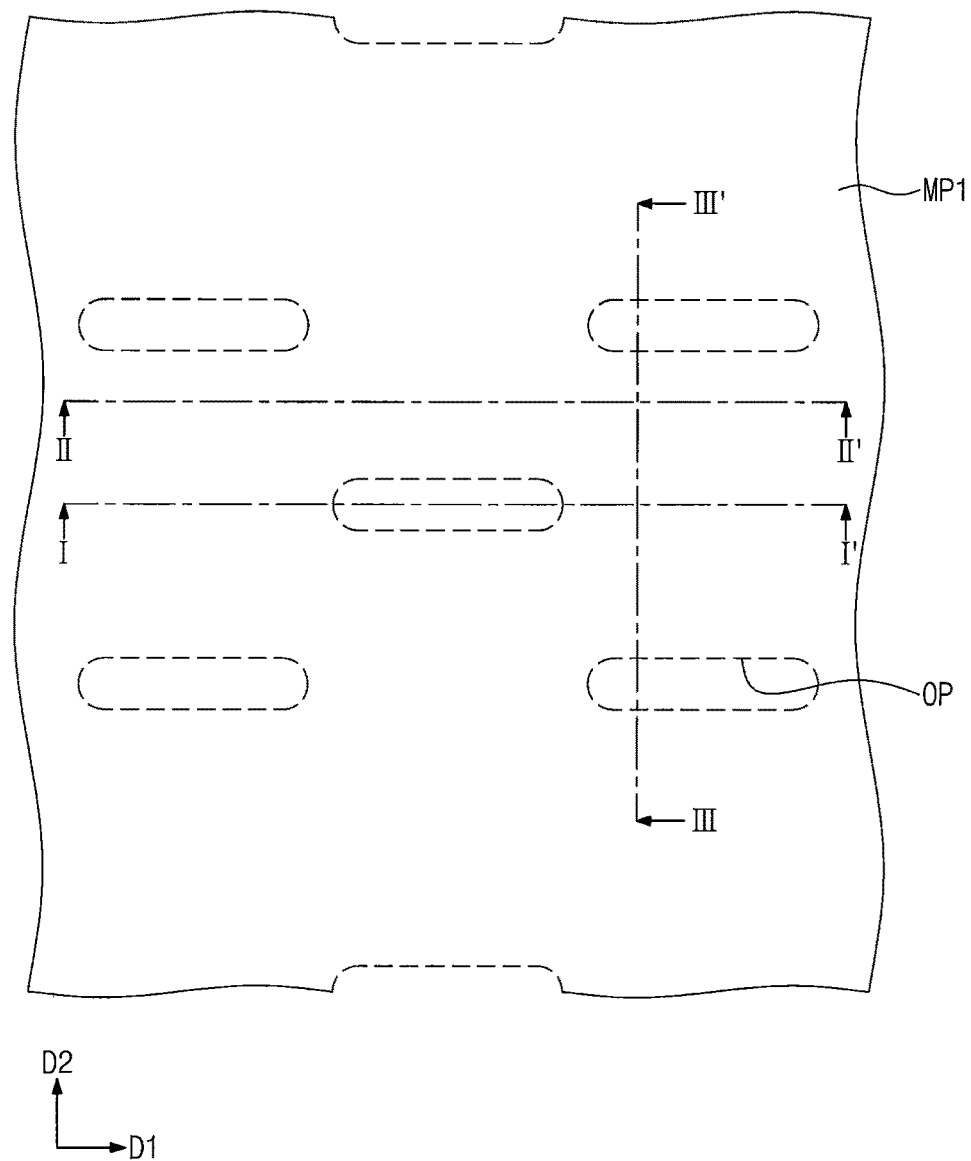
Figure 15A:
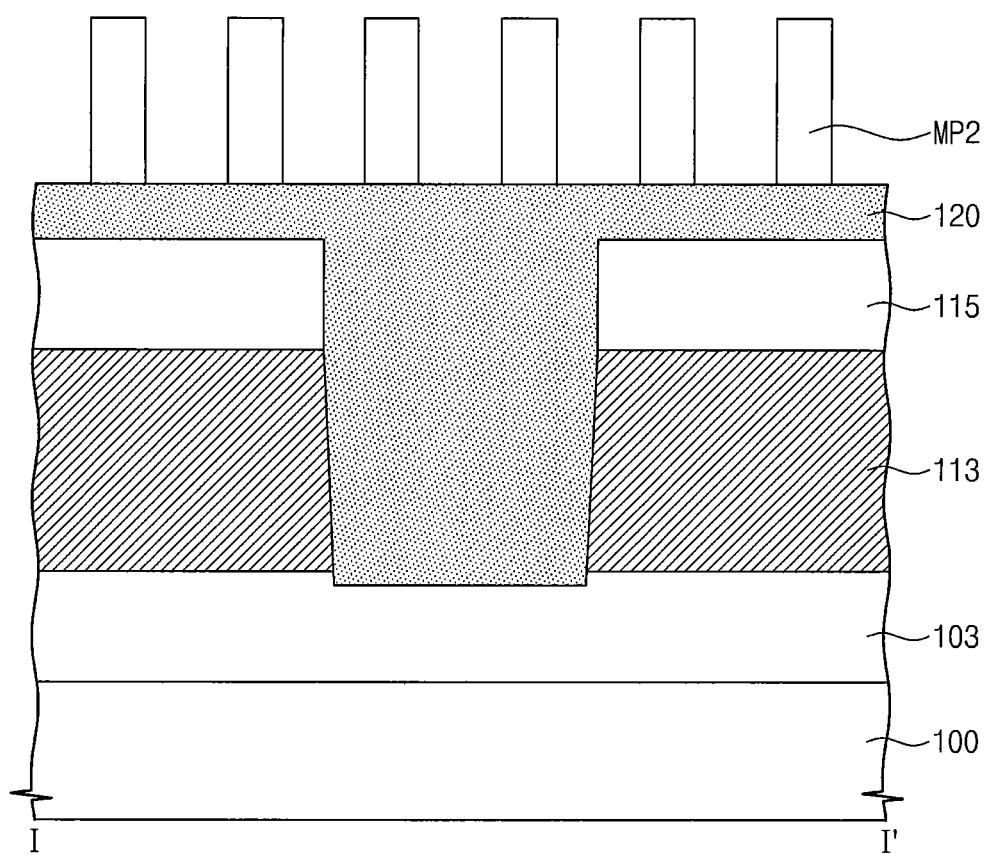
Figure 15B:
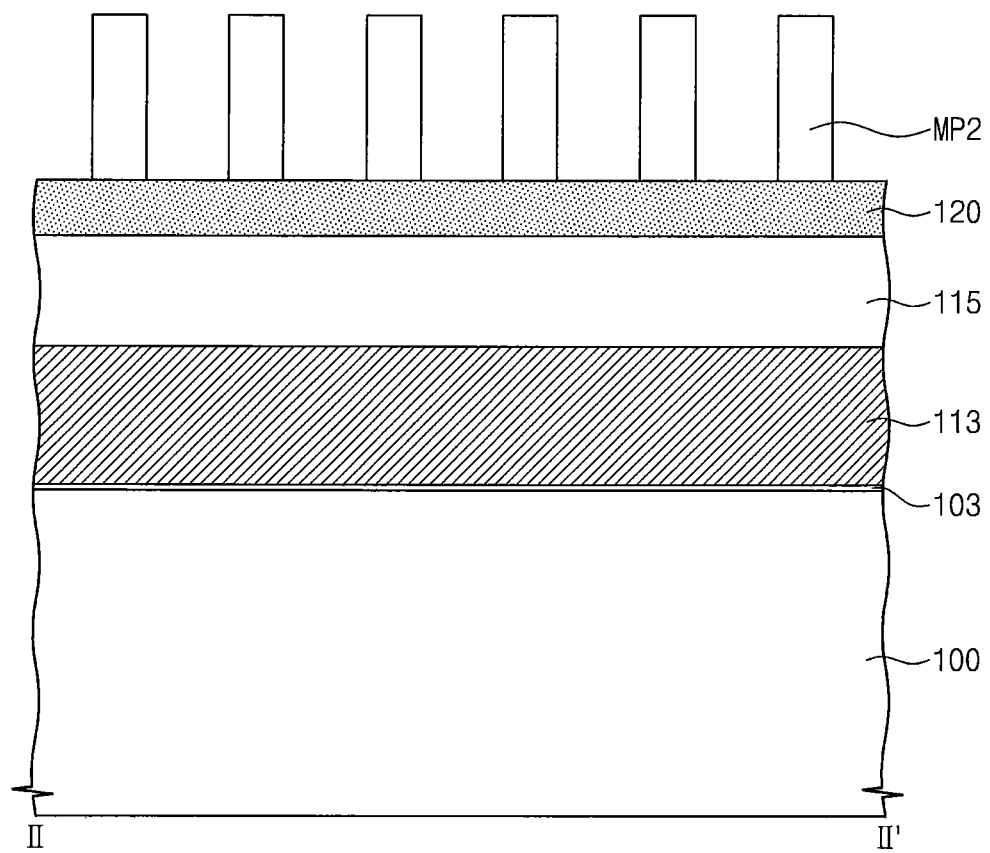
Figure 15C:
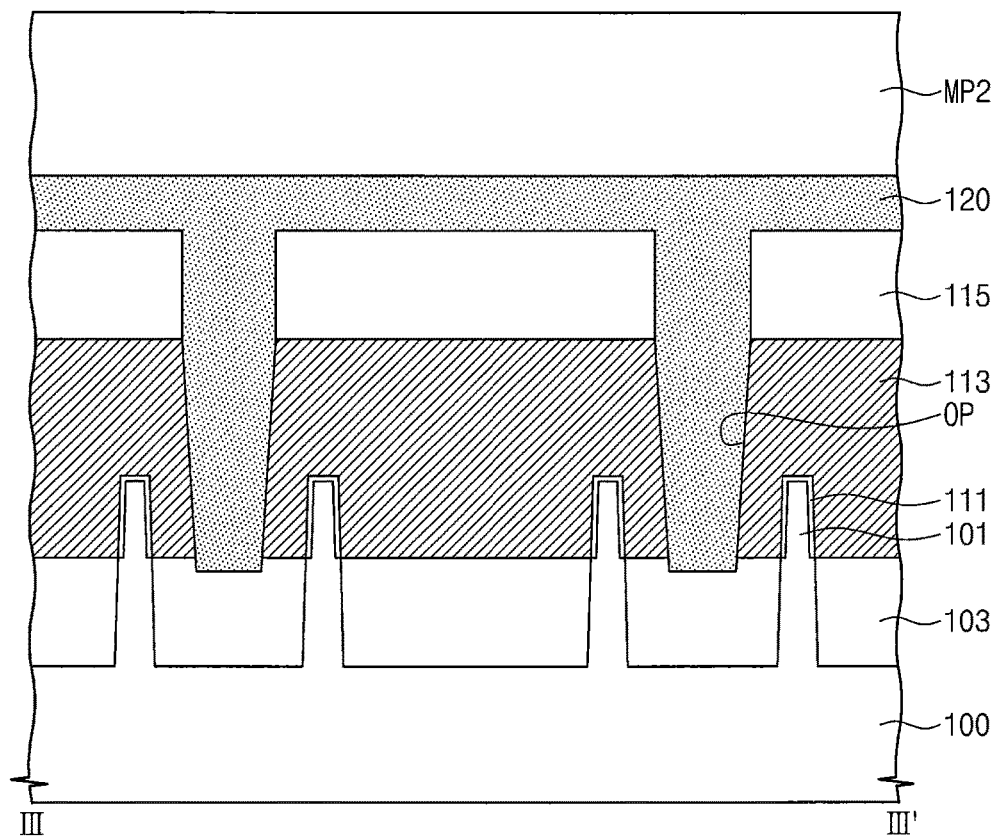
Figure 15D:
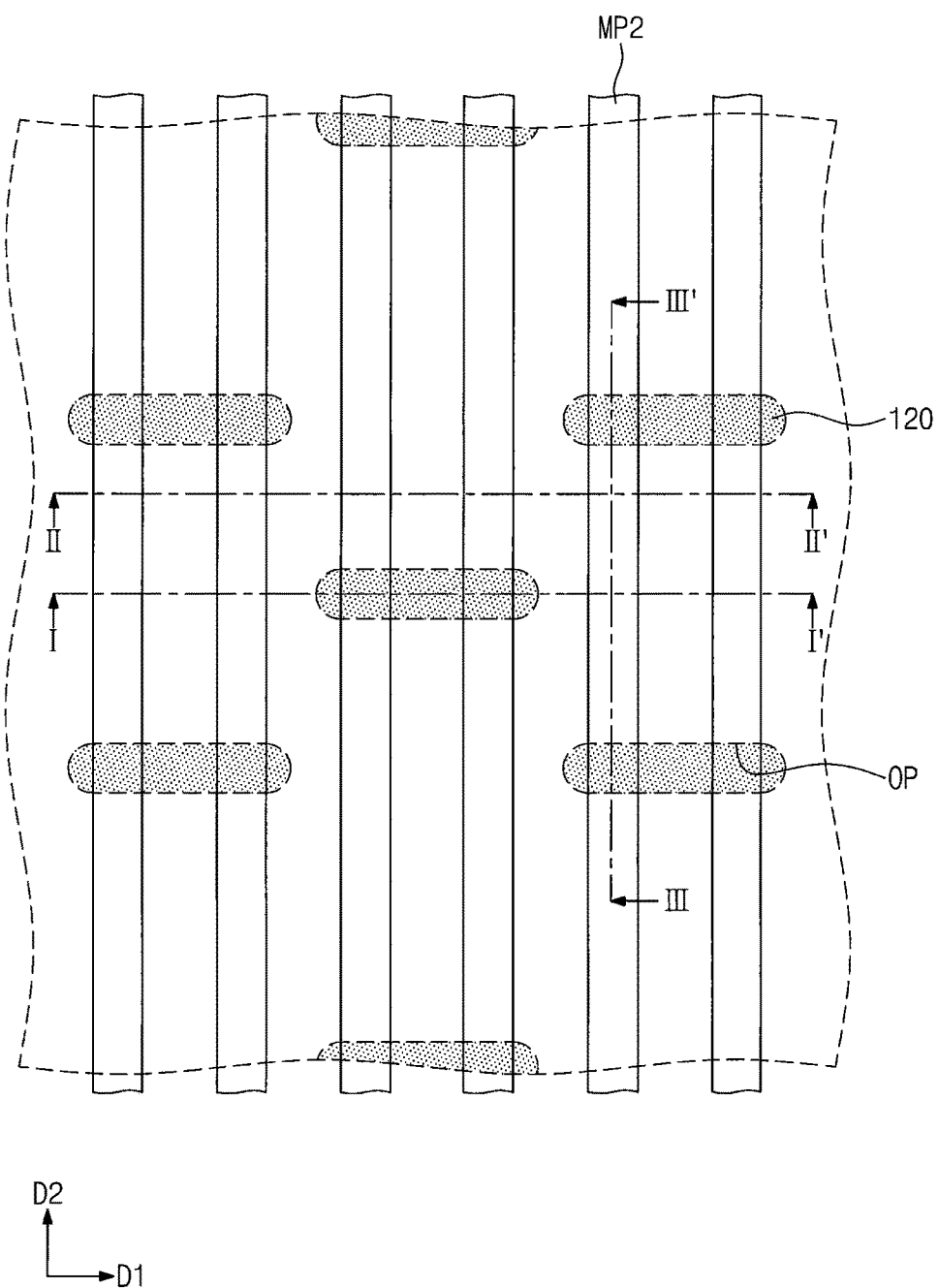
Figure 16A:
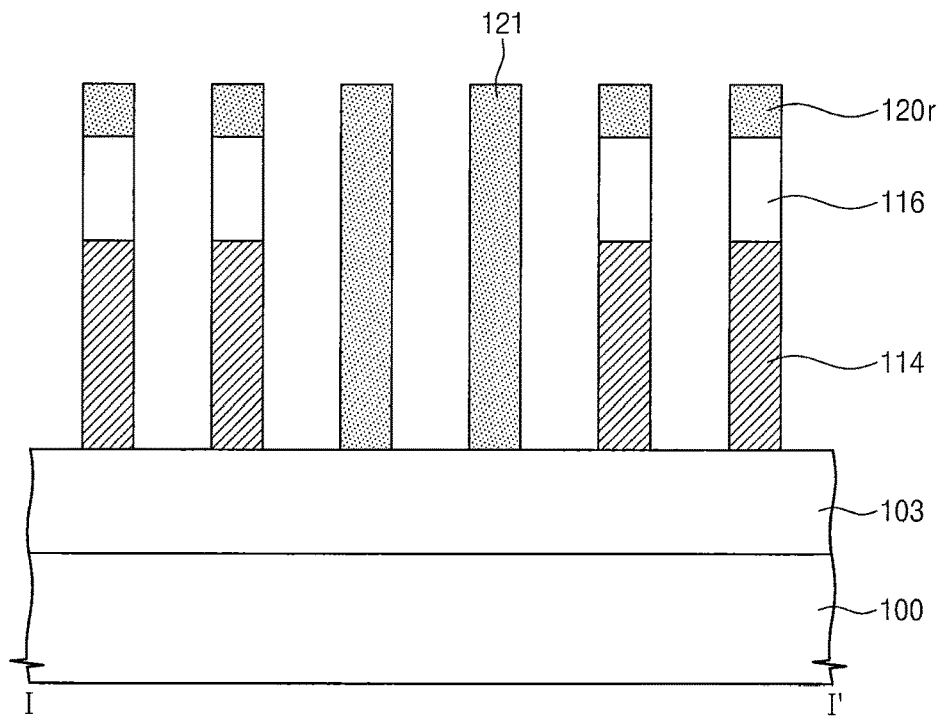
Figure 16B:
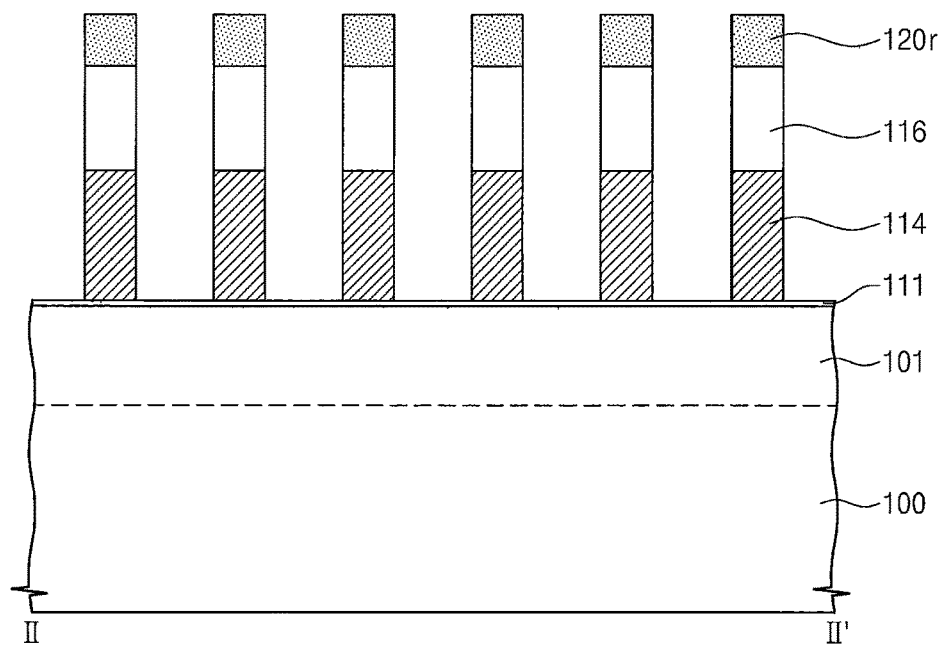
Figure 16C:
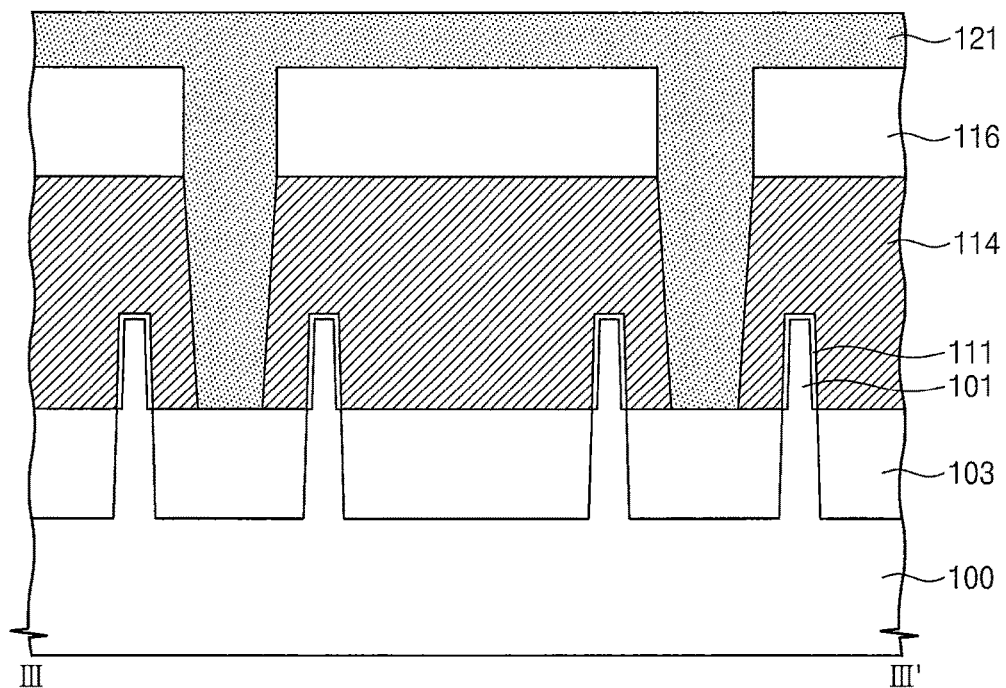
Figure 16D:
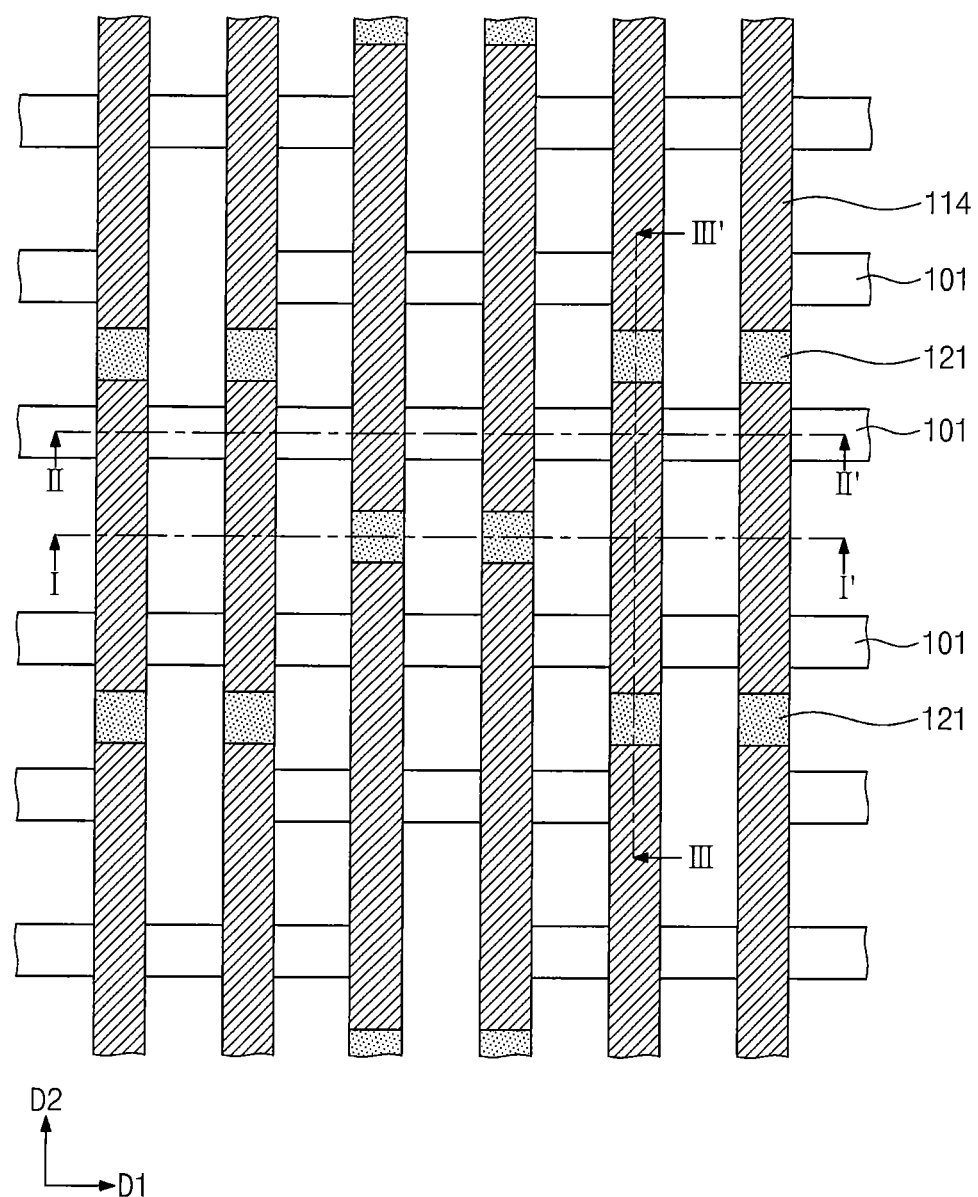
Figure 17A:
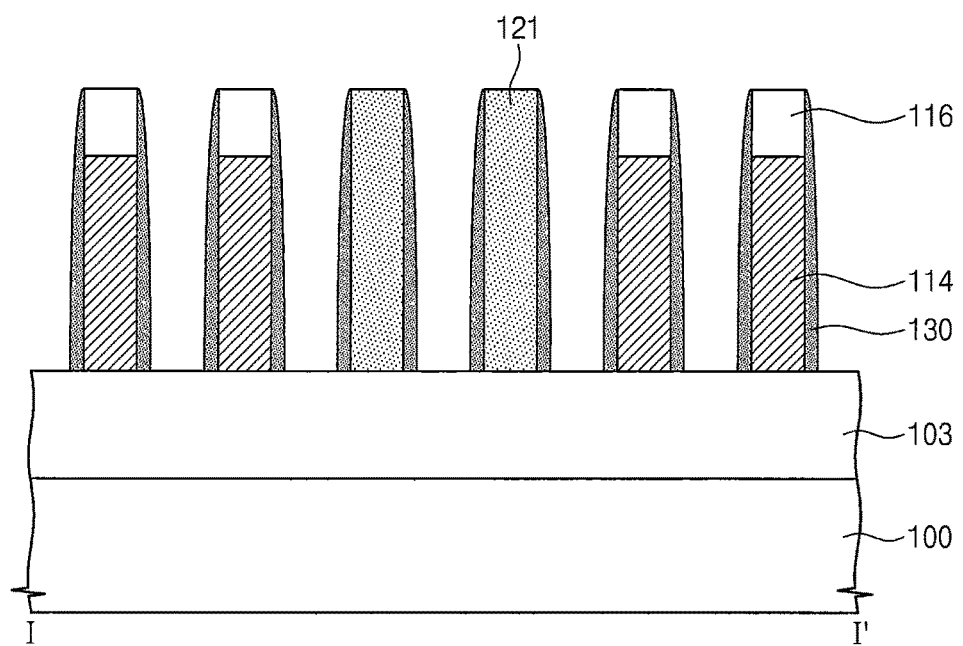
Figure 17B:
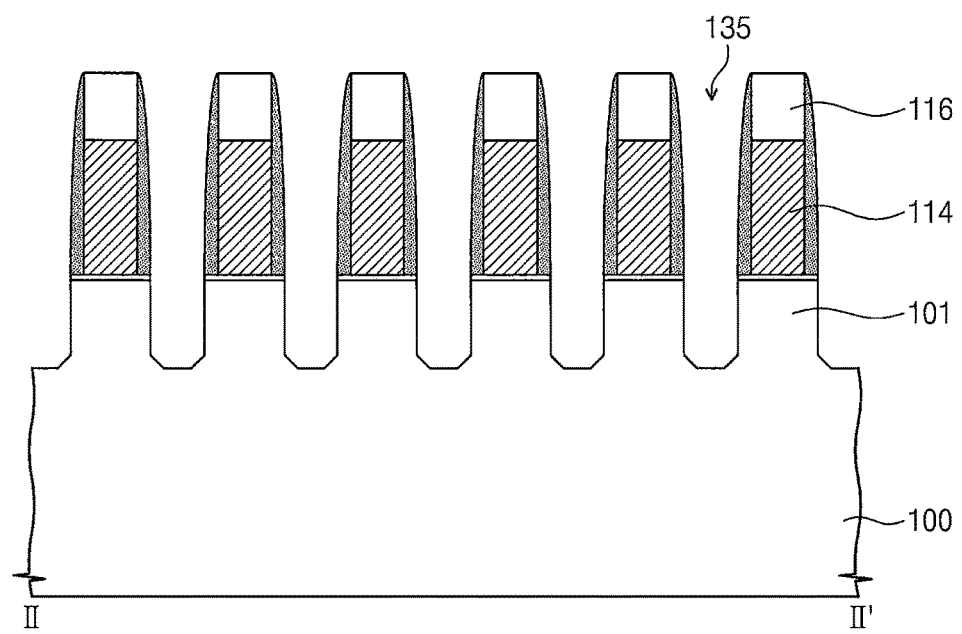
Figure 17C:
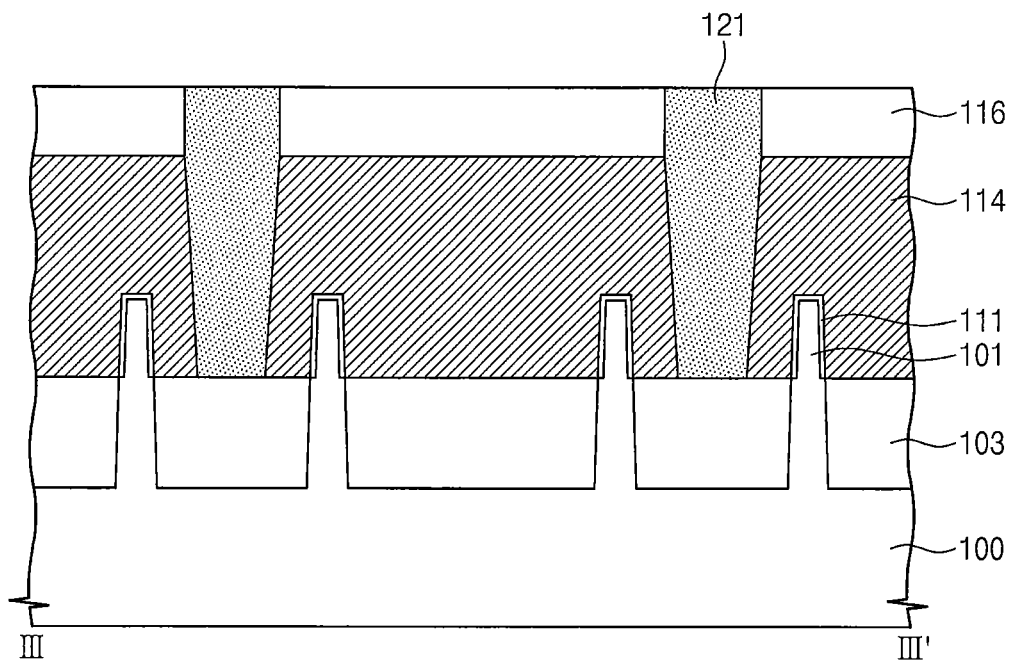
Figure 17D:
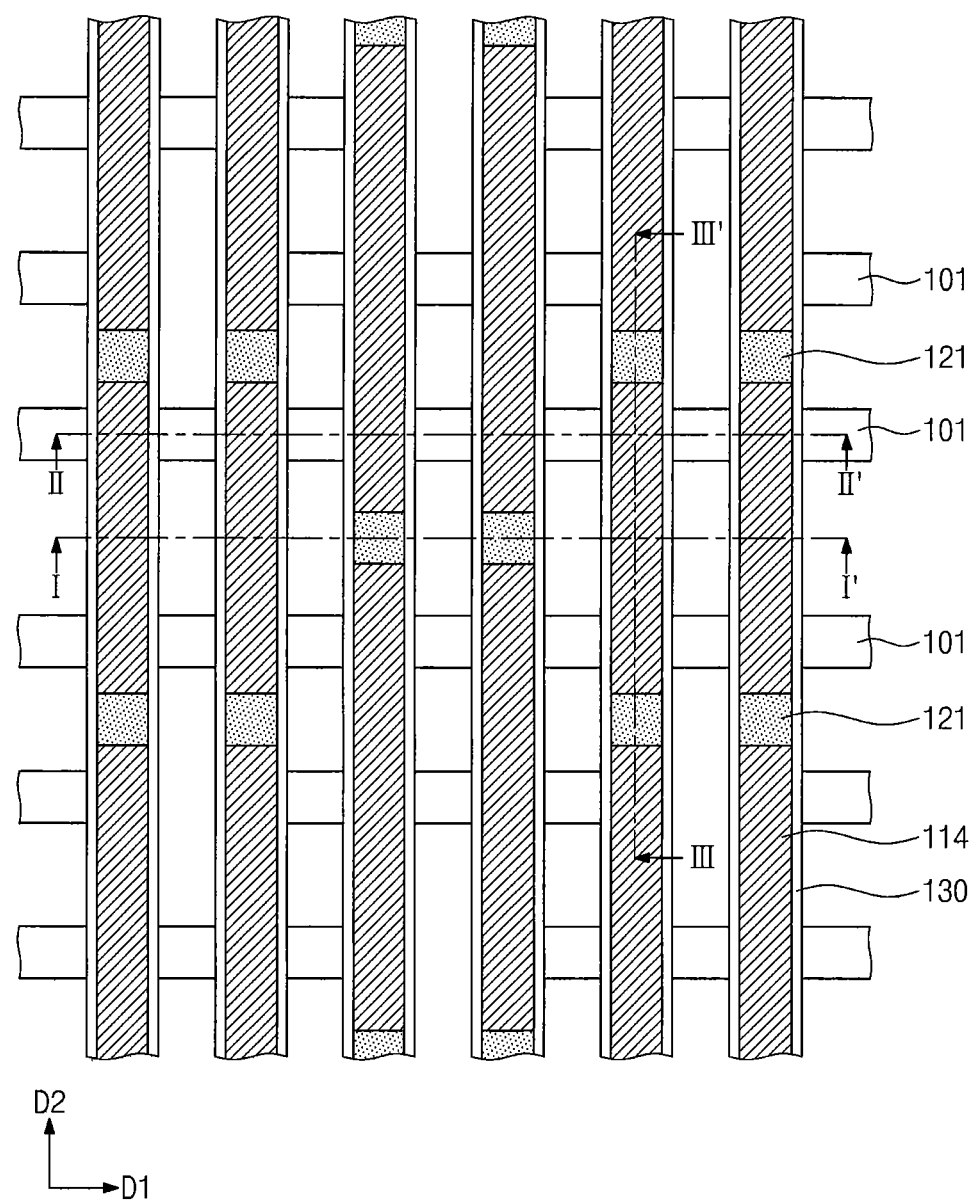

According to some embodiments, the openings OP may have a bar shape having a long axis parallel to the first direction D1. Each of the openings OP may have a longitudinal axis extending in the first direction D1 as illustrated in FIG. 14D. The openings OP may be spaced apart from each other in the first direction D1 and the second direction D2 and may expose the portions of the device isolation layer 103 disposed between the active patterns 101. A length of the opening OP in the first direction D1 may be greater than widths, in the first direction D1, of dummy gate patterns 114 to be formed in subsequent processes. A width of the opening OP in the second direction D2 may be smaller than a distance between the active patterns 101 adjacent to each other in the second direction D2.

Referring to FIGS. 15A, 15B, 15C, and 15D, a gate separation layer 120 may be formed in the openings OP to cover sidewalls of the openings OP. In some embodiments, the gate separation layer 120 may be formed on the hard mask layer 115 to completely fill the openings OP.

The gate separation layer 120 may be formed of an insulating material having an etch selectivity with respect to the dummy gate layer 113. For example, the gate separation layer 120 may include a silicon oxide layer, a silicon nitride layer, a silicon oxynitride layer, and/or low-k dielectric layers. The gate separation layer 120 may be formed by, for example, a CVD method and/or an ALD method. For example, a thickness of the gate separation layer 120 formed by the deposition process may be greater than about a half of the width of the opening OP in the second direction D2.

After the formation of the gate separation layer 120, a planarization process may be performed to planarize a top surface of the gate separation layer 120.

A second mask pattern MP2 including second preliminary openings may be formed on the gate separation layer 120. The second preliminary openings of the second mask pattern MP2 may have groove shapes extending in the second direction D2 that may be perpendicular to the first direction D1. Thus, the second mask pattern MP2 may have line patterns of which each is disposed between the second preliminary openings adjacent to each other. In other words, the line patterns of the second mask pattern MP2 may intersect the openings OP and the active patterns 101.

Referring to FIGS. 16A, 16B, 16C, and 16D, the gate separation layer 120, the hard mask layer 115, and a dummy gate layer 113 may be sequentially and anisotropically etched using the second mask pattern MP2 as an etch mask to form dummy gate patterns 114 and gate separation patterns 121 at approximately the same time (i.e., concurrently). In addition, a hard mask pattern 116 and a residual gate separation pattern 120r may be formed on each of the dummy gate patterns 114.

According to some embodiments, the dummy gate patterns 114 may be spaced apart from each other in the first direction D1 and the second direction D2 by the anisotropic etching process using the second mask pattern MP2 having the line patterns. In some embodiments, each of the dummy gate patterns 114 may have a bar shape having a long axis parallel to the second direction D2 and may intersect the active patterns 101. Each of the dummy gate patterns 114 may have a longitudinal axis extending in the second direction D2. The dummy gate patterns 114 may be spaced apart from each other by a first distance in the first direction D1 and may be spaced apart from each other by a second distance smaller than the first distance in the second direction D2. Each of the dummy gate patterns 114 may have first sidewalls being in contact with the gate separation patterns 121 and second sidewalls perpendicular to the first sidewalls.

Each of the gate separation patterns 121 may fill a space between the dummy gate patterns 114 adjacent to each other in the second direction D2. Each of the gate separation patterns 121 may be formed on the device isolation layer 103. Each of the gate separation patterns 121 may overlap the device isolation layer 103 when viewed from a plan perspective. Since the gate separation patterns 121 are formed concurrently with the dummy gate patterns 114, a width of the dummy gate pattern 114 in the first direction D1 may be substantially equal to a width of the gate separation pattern 121 in the first direction D1. The gate separation pattern 121 may have a slanted sidewall which is in contact with the dummy gate pattern 114. It will be understood that "formed concurrently" refers to formed in a same fabrication step, at approximately (but not necessarily exactly) the same time.

Referring to FIGS. 17A, 17B, 17C, and 17D, gate spacers 130 may be formed on both sidewalls of the dummy gate patterns 114. The gate spacers 130 may extend in the second direction D2 to cover sidewalls of the gate separation patterns 121.

According to some embodiments, forming the gate spacers 130 may include conformally depositing a gate spacer layer on the semiconductor substrate 100 including the dummy gate patterns 114 and the gate separation patterns 121 and then anisotropically etching the gate spacer layer. When the gate spacer layer is deposited, the thickness of the gate spacer layer may be smaller than about a half of a distance between the dummy gate patterns 114 adjacent to each other in the first direction D1.

The gate spacers 130 may be formed of an insulating material having an etch selectivity with respect to the dummy gate patterns 114. For example, the gate spacers 130 may include a metal oxide (e.g., tantalum oxide, titanium oxide, hafnium oxide, zirconium oxide, or aluminum oxide), silicon oxide, silicon nitride and/or silicon oxynitride. In some embodiments, the gate spacer 130 may include the first and second spacers 131 and 133, as illustrated in FIGS. 2A and 2B.

After the formation of the gate spacers 130, recess regions (i.e., recesses) 135 may be formed in the semiconductor substrate 100 at both sides of each of the dummy gate patterns 114. The recess regions 135 may be formed by etching portions of the active patterns 101 exposed between the gate spacers 130. The recess regions 135 may be formed by anisotropically and/or isotropically etching the portions of the active patterns 101 using the dummy gate patterns 114 and the gate spacers 130 as etch masks.

According to some embodiments, during the etching process of forming the recess regions 135, the first sidewalls of each of the dummy gate patterns 114 may be protected by the gate separation patterns 121 and the second sidewalls of each of the dummy gate patterns 114 may be protected by the gate spacers 130. In addition, upper portions of the gate separation patterns 121 and the residual gate separation patterns 120r of FIG. 16A may be recessed to expose top surfaces of the hard mask patterns 116 during the process of forming the gate spacers 130 and the process of forming the recess regions 135. In some embodiments, the residual gate separation patterns 120r of FIG. 16A may remain on the hard mask patterns 116.

Figure 18A:
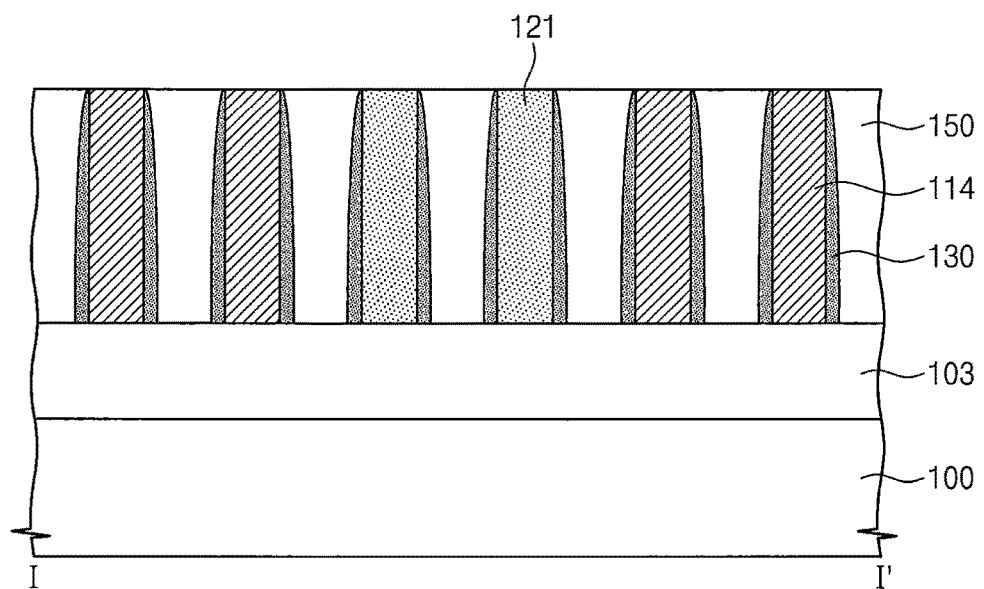
Figure 18B:
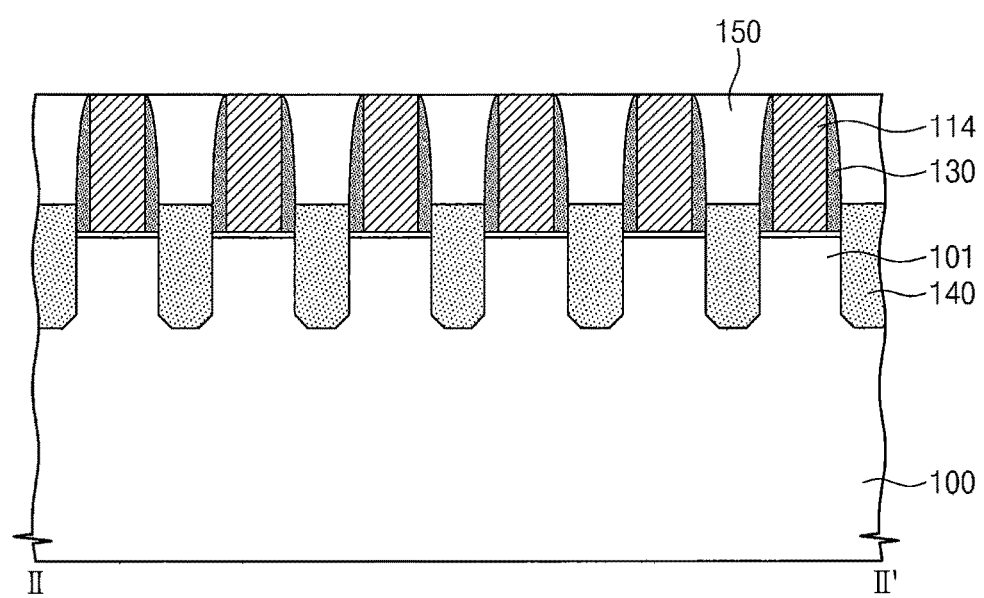
Figure 18C:
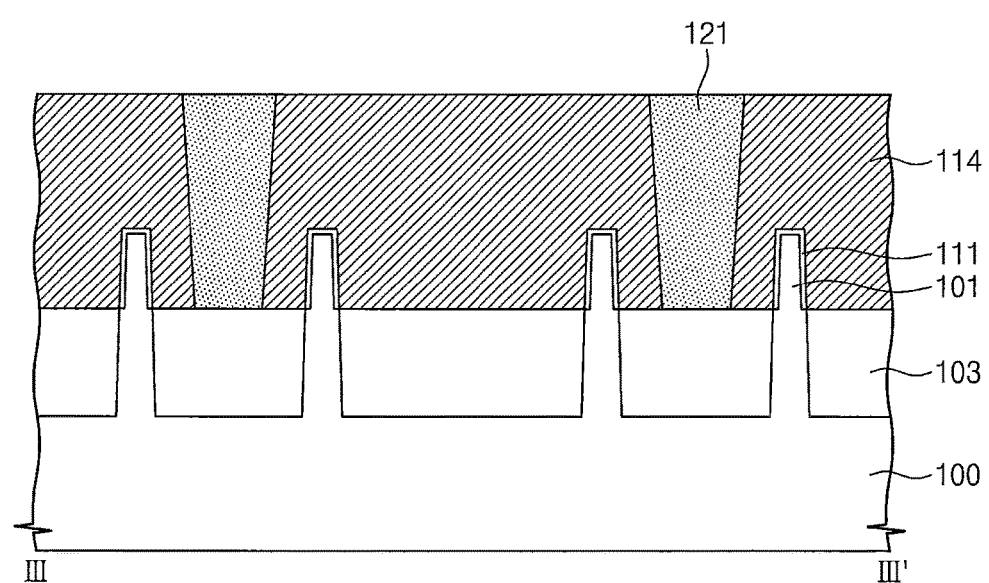

Referring to FIGS. 18A, 18B, and 18C, epitaxial layers 140 may be formed in the recess regions 135, respectively. The epitaxial layers 140 may be formed at both sides of each of the dummy gate patterns 114 and may be used as source/drain electrodes of a fin field effect transistor.

In some embodiments, the epitaxial layers 140 of an N-channel metal-oxide-semiconductor field effect transistor (NMOSFET) may be formed of a material providing tensile strain to the active pattern 101 under the dummy gate pattern 114. For example, the epitaxial layers 140 of the NMOSFET may be formed of silicon carbide (SiC). However, embodiments of the inventive concepts are not limited thereto. In some embodiments, the epitaxial layers 140 of a P-channel metal-oxide-semiconductor field effect transistor (PMOSFET) may be formed of a material providing compressive strain to the active pattern 101 under the dummy gate pattern 114. For example, the epitaxial layers 140 of the PMOSFET may be formed of silicon-germanium (SiGe). However, embodiments of the inventive concepts are not limited thereto. In addition, a metal silicide layer (not shown) may be formed on each of the epitaxial layers 140. The metal silicide layer may include nickel silicide, cobalt silicide, tungsten silicide, titanium silicide, niobium silicide, and/or tantalum silicide.

Figure 19A:
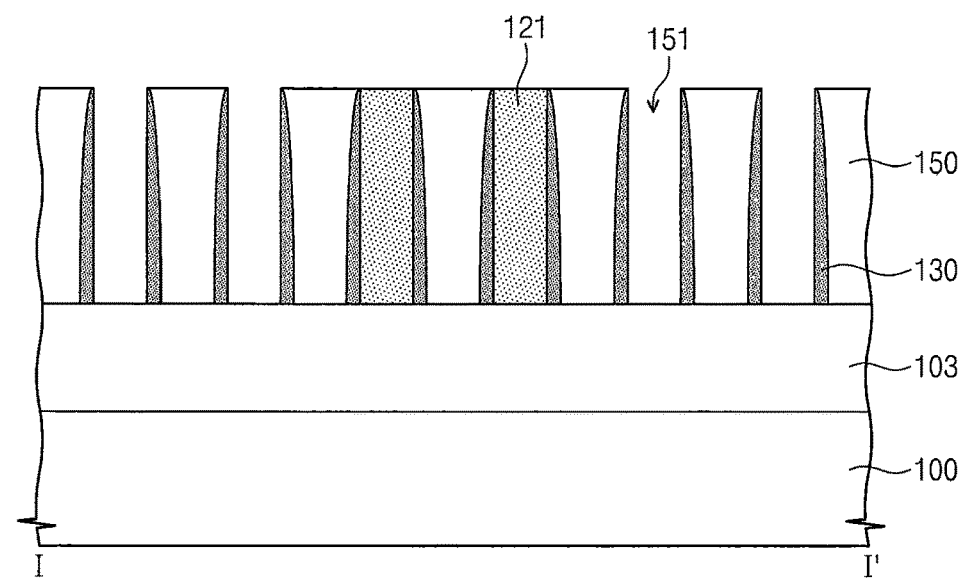
Figure 19B:
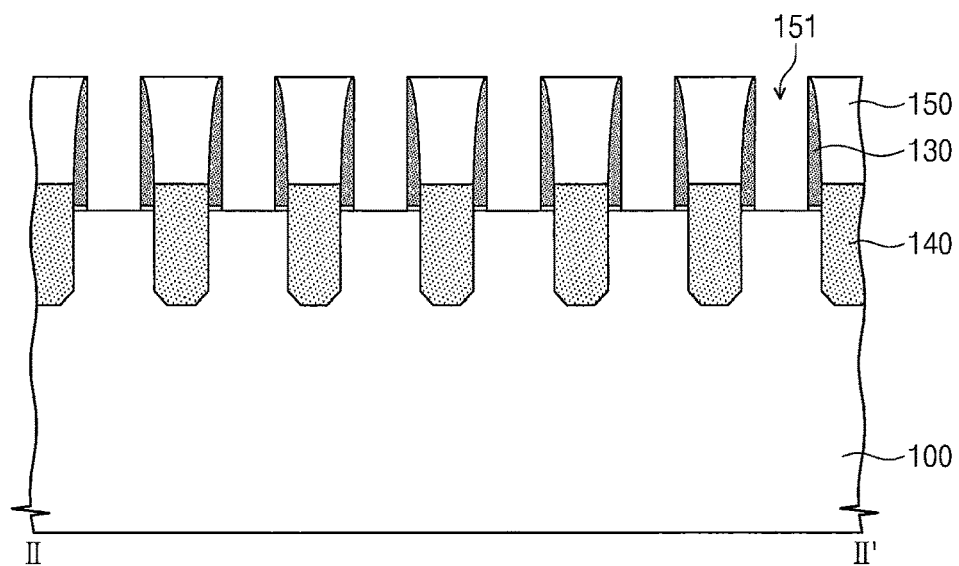
Figure 19C:
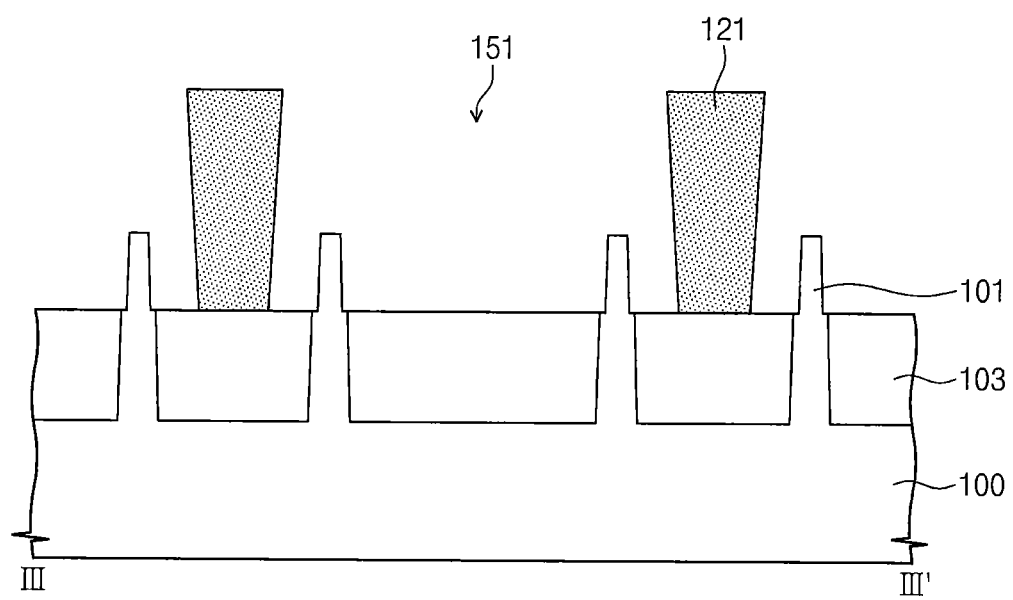

Referring to FIGS. 19A, 19B, and 19C, a first interlayer insulating layer 150 may be formed to fill spaces between the dummy gate patterns 114 on the epitaxial layers 140. Here, the first interlayer insulating layer 150 may expose top surfaces of the dummy gate patterns 114 and top surfaces of the gate separation patterns 121.

According to some embodiments, forming the first interlayer insulating layer 150 may include forming an insulating layer covering the epitaxial layers 140 and the dummy gate patterns 114, and planarizing the insulating layer until the top surfaces of the dummy gate patterns 114 are exposed. For example, the first interlayer insulating layer 150 may include at least a silicon oxide layer, a silicon nitride layer, a silicon oxynitride layer, and/or low-k dielectric layers.

The dummy gate patterns 114 may be removed to form gate regions 151 defined by the gate spacers 130 and the gate separation patterns 121.

The removal of the dummy gate patterns 114 may be performed by, for example, a combination of a dry etching process and a wet etching process. In more detail, the dummy gate patterns 114 may be wet-etched using a wet etch process having an etch selectivity with respect to the gate separation patterns 121 and the gate spacers 130. In some embodiments, when the dummy gate patterns 114 is formed of silicon-germanium (SiGe), the dummy gate patterns 114 may be removed using an etching solution including a mixture of ammonia water and hydrogen peroxide. In some embodiments, the dummy gate pattern 114 is formed of poly-crystalline silicon, the dummy gate pattern 114 may be wet-etched using an etching solution including a mixture of nitric acid, acetic acid, and/or hydrofluoric acid.

Sidewalls of the gate spacers 130 and sidewalls of the gate separation patterns 121 may be exposed to the gate regions 151 by the formation of the gate regions 151. In addition, during the removal of the dummy gate patterns 114, portions of the dummy gate insulating layers 111 disposed on the active patterns 101 may also be removed to expose portions of the active patterns 101. Portions of the device isolation layer 103 between the active patterns 101 may also be exposed. A vertical depth of the gate region 151 to the top surface of the device isolation layer 103 may be greater than a vertical depth of the gate region 151 to the top surface of the active pattern 101.

Figure 20A:
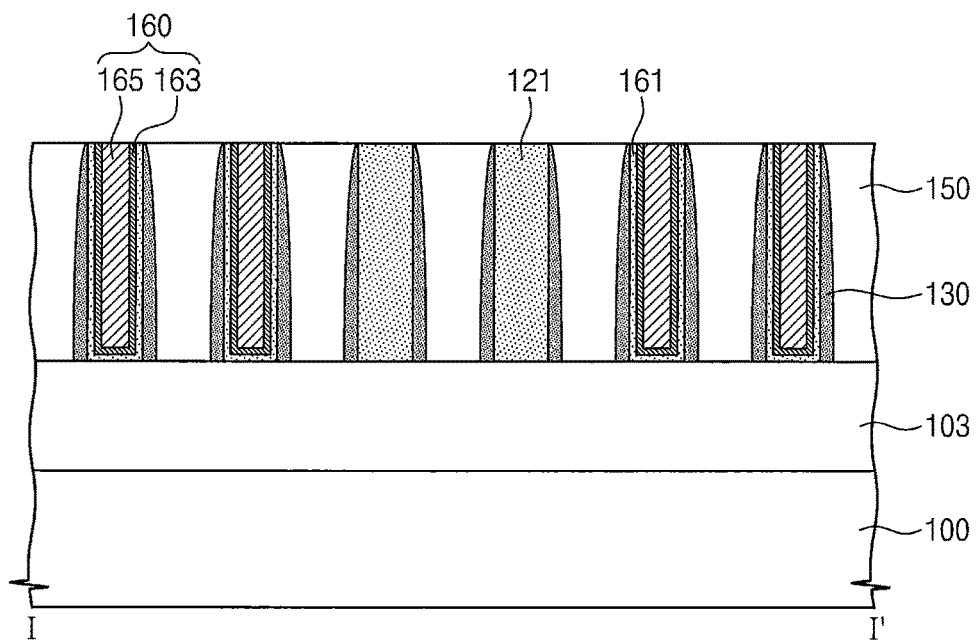
Figure 20B:
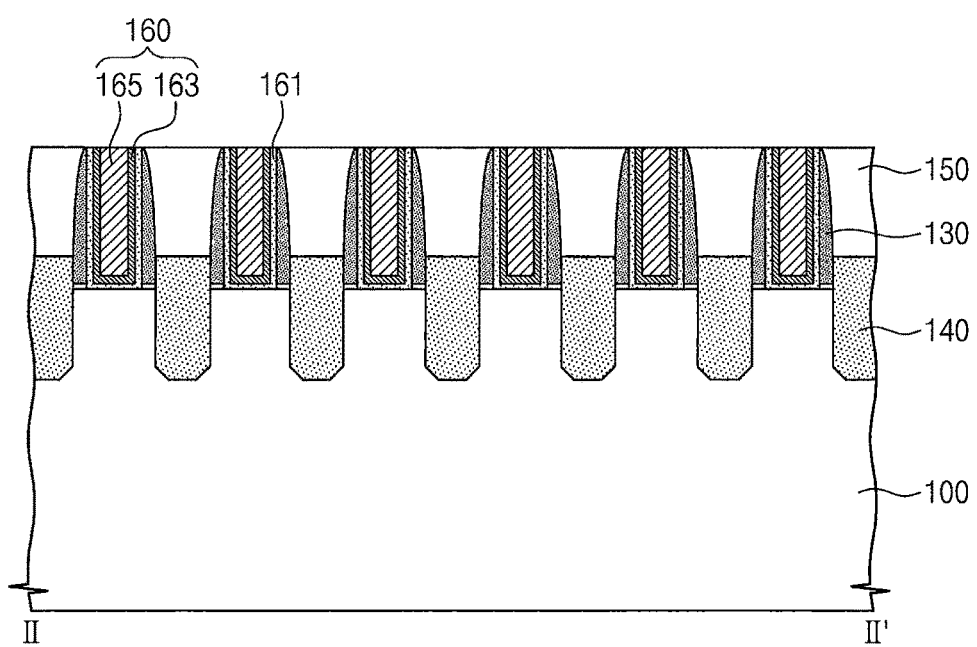
Figure 20C:
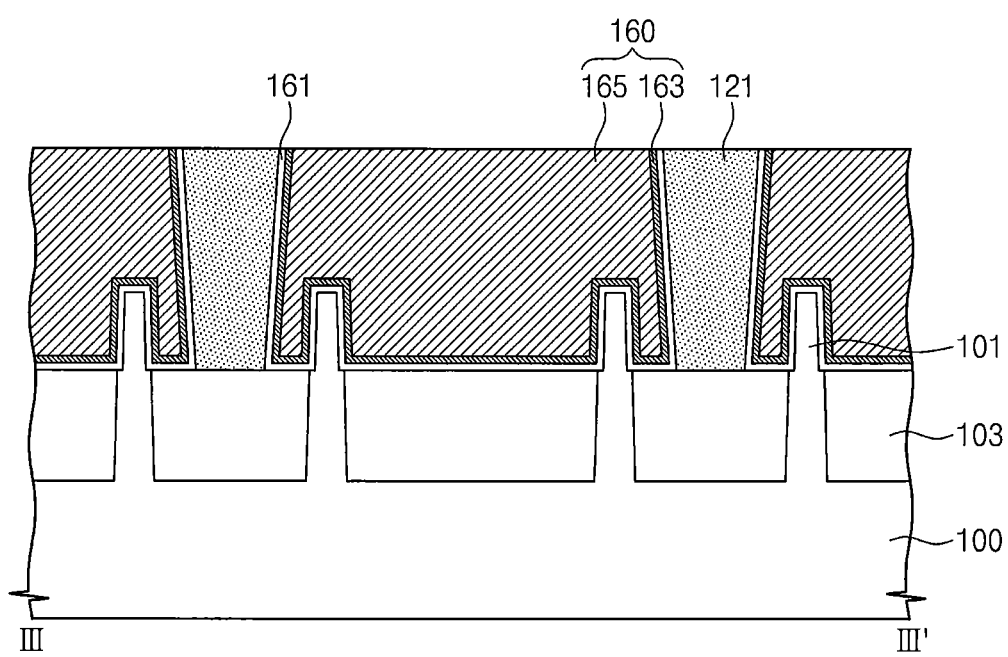

Referring to FIGS. 20A, 20B, and 20C, a gate insulating layer 161 and a gate electrode 160 may be sequentially formed in each of the gate regions 151.

The gate insulating layer 161 may be formed of, for example, a high-k dielectric layer such as a hafnium oxide layer, a hafnium silicate layer, a zirconium oxide layer, or a zirconium silicate layer. The gate insulating layer 161 may be formed using, for example, an ALD process to conformally cover the exposed surfaces of the active patterns 101, the exposed sidewalls of the gate spacers 130, and the exposed sidewalls of the gate separation patterns 121. In some embodiments, the gate insulating layer 161 may be formed by thermally oxidizing the surfaces of the active patterns 101 exposed by the gate regions 151.

Forming the gate electrodes 160 may include sequentially depositing a barrier metal layer and a metal layer in the gate regions 151 on the gate insulating layer 161, and planarizing the metal layer and the barrier metal layer until a top surface of the first interlayer insulating layer 150 is exposed. Each of the barrier metal layer and the metal layer may be formed by, for example, a CVD process, a PVD process, and/or an ALD process. The barrier metal layer may be deposited to conformally cover inner surfaces of the gate regions 151. In other words, the barrier metal layer may have a uniform thickness on the gate insulating layer 161 exposed by the gate regions 151. The metal layer and the barrier metal layer may be planarized using a blanket anisotropic etching process (e.g., an etch-back process) and/or a chemical mechanical polishing (CMP) process.

The gate electrodes 160 may fill the gate regions 151, respectively, and may be two-dimensionally arranged on the semiconductor substrate 100. Each of the gate electrodes 160 may have a long axis parallel to the second direction D2. Each of the gate electrodes 160 may have a longitudinal axis extending in the second direction D2. The gate electrode 160 disposed on the top surface of the active pattern 101 may be thicker than the gate electrode 160 disposed on the top surface of the device isolation layer 103. Each of the gate electrodes 160 may be in contact with the gate spacers 130 adjacent thereto in the first direction D1 and may be in contact with the gate separation patterns 121 adjacent thereto in the second direction D2. In other words, the gate electrodes 160 arranged in the second direction D2 may be separated from each other by the gate separation patterns 121. Each of the gate electrodes 160 may include a barrier metal pattern 163 and a metal pattern 165. In some embodiments, the barrier metal pattern 163 may be formed of a conductive material having a predetermined work function. The barrier metal pattern 163 may be formed of one of metal nitrides. For example, the barrier metal pattern 163 may be formed of a metal nitride layer such as a titanium nitride layer, a tantalum nitride layer, a tungsten nitride layer, a hafnium nitride layer, and/or a zirconium nitride layer. The metal pattern 165 may be formed of materials having a specific resistance lower than that of the barrier metal pattern 163. For example, the metal pattern 165 may include at least one of tungsten, copper, hafnium, zirconium, titanium, tantalum, aluminum, ruthenium, palladium, platinum, cobalt, nickel, and/or conductive metal nitrides.

FIGS. 21A to 24A, 21B to 24B, and 21C to 24C are cross-sectional views illustrating a method for fabricating the semiconductor device illustrated in FIGS. 7A to 7C according to some embodiments of the inventive concepts. The same or similar technical features discussed with reference to FIGS. 13A to 20A, 13B to 20B, and 13C to 20C will be omitted or mentioned briefly for the purpose of ease and convenience in explanation.

Figure 21A:
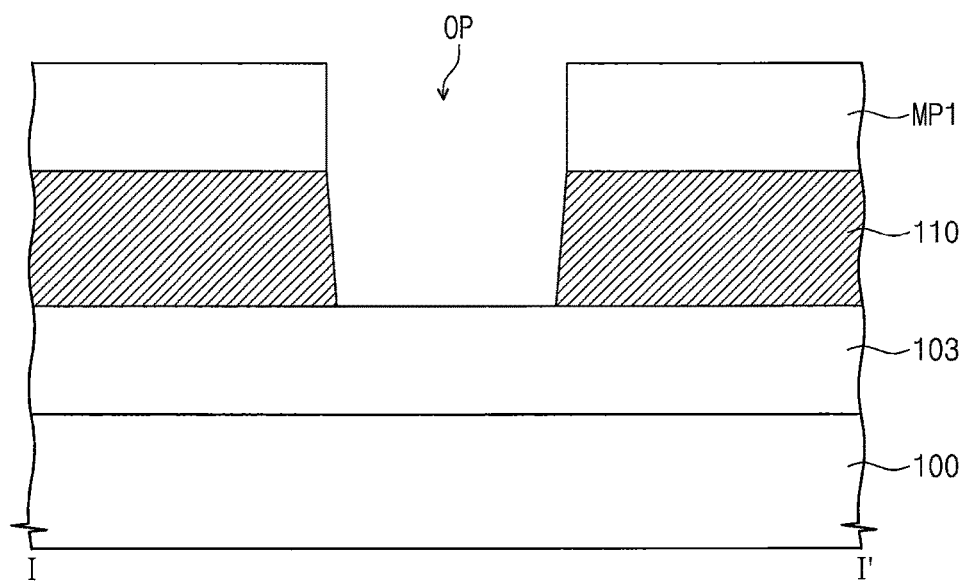
FIGS. 21A, 22A, 23A and 24A, FIGS. 21B, 22B, 23B and 24B and FIGS. 21C, 22C, 23C and 24C are cross-sectional views illustrating a method for fabricating a semiconductor device according to some embodiments of the inventive concepts.
Figure 21B:
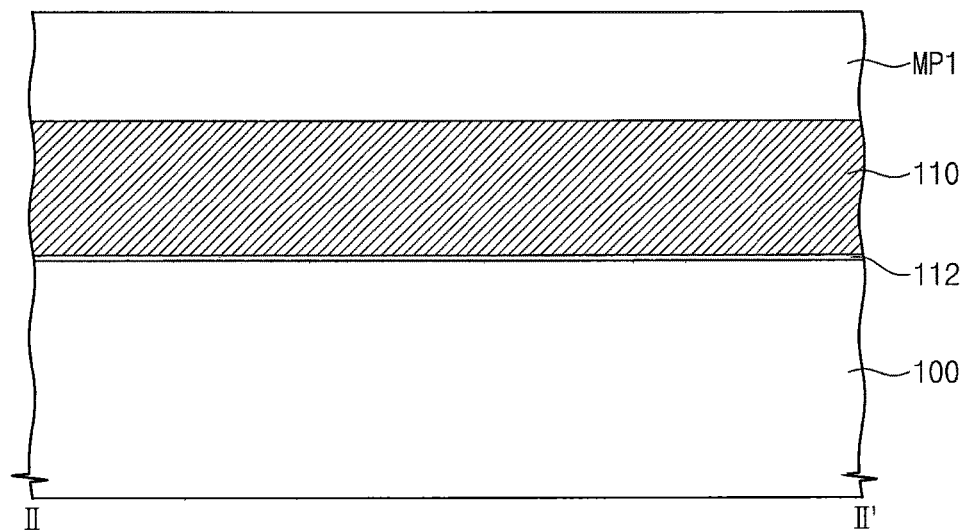
Figure 21C:
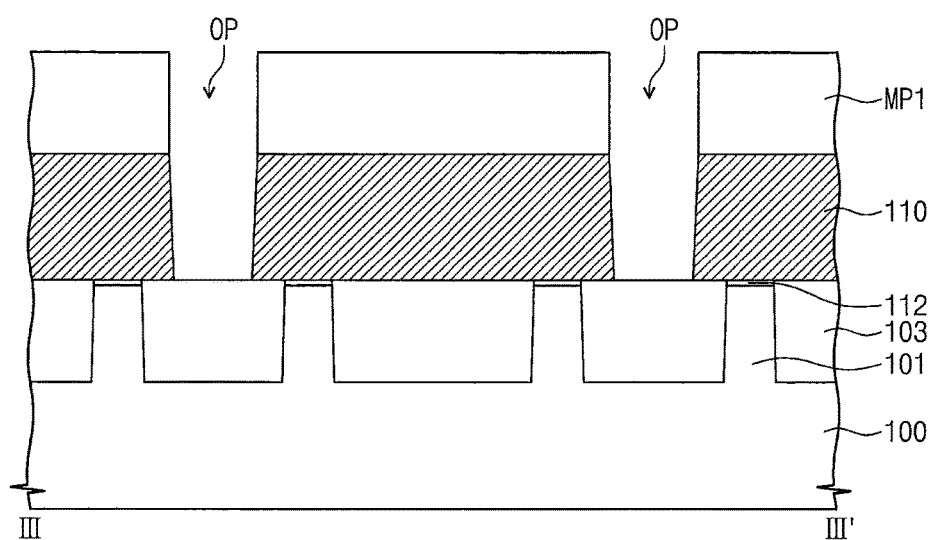

Referring to FIGS. 21A, 21B, and 21C, a gate layer 110 including openings OP may be formed on a semiconductor substrate 100.

In detail, the semiconductor substrate 100 may include active patterns 101 defined by a device isolation layer 103. Each of the active patterns 101 may have a long axis parallel to a first direction D1. Each of the active patterns 101 may have a longitudinal axis extending in the first direction D1. The active patterns 101 may have different lengths in the first direction D1. In some embodiments, the semiconductor substrate 100 may be patterned to form trenches defining the active patterns 101, an insulating layer may be formed to fill the trenches, and a planarization process may be performed on the insulating layer until the top surface of the semiconductor substrate 100 is exposed, thereby forming the device isolation layer 103. Thus, the top surfaces of the active patterns 101 may be substantially coplanar with the top surface of the device isolation layer 103, and the active patterns 101 may correspond to portions of the semiconductor substrate 100.

Forming the gate layer 110 including the openings OP may include forming a gate conductive layer on an entire top surface of the semiconductor substrate 100, forming a first mask pattern MP1 including first preliminary openings on the gate conductive layer, and etching the gate conductive layer using the first mask pattern MP1 as an etch mask to form the openings OP exposing portions of the device isolation layer 103.

According to some embodiments, the openings OP may have a bar shape having a long axis parallel to the first direction D1. Each of the openings OP may have a longitudinal axis extending in the first direction D1. The openings OP may be spaced apart from each other in the first direction D1 and the second direction D2 and may expose the portions of the device isolation layer 103 disposed between the active patterns 101. The portions of the device isolation layer 103 exposed by the openings OP may be recessed by over-etching during the etching process of forming the openings OP.

A gate insulating layer 112 may be formed between the gate layer 110 and the active pattern 101. The gate insulating layer 112 may include an oxide, a nitride, an oxynitride, and/or a high-k dielectric. For example, the gate layer 110 may include a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide).

The first mask pattern MP1 may be removed after the formation of the gate layer 110 having the openings OP.

Figure 22A:
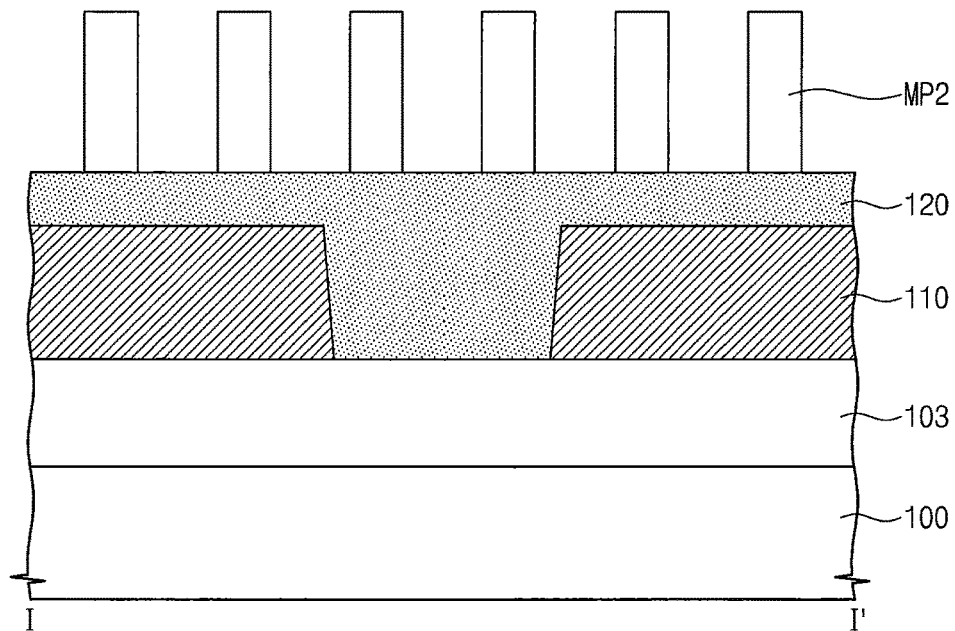
Figure 22B:
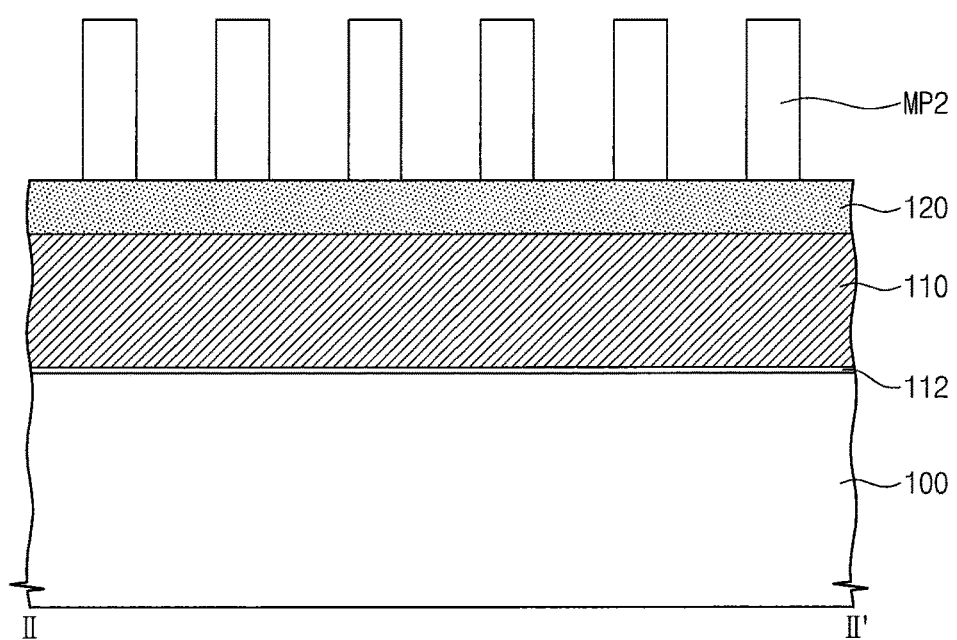
Figure 22C:
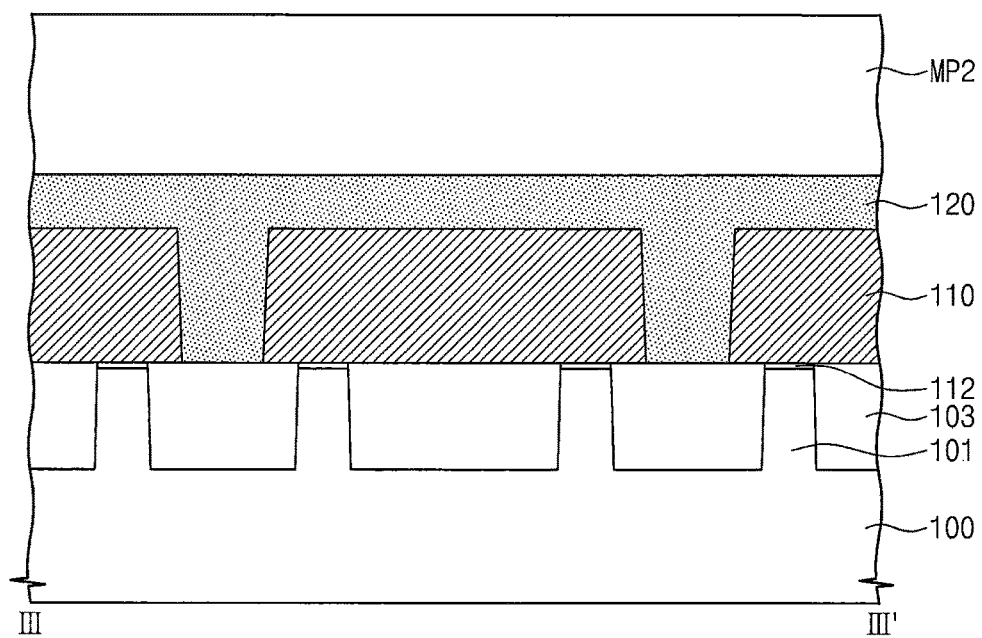

Referring to FIGS. 22A, 22B, and 22C, a gate separation layer 120 may be formed on the gate layer 110 to fill the openings OP. The gate separation layer 120 may cover a top surface of the gate layer 110. The gate separation layer 120 may be formed of an insulating material having an etch selectivity with respect to the gate layer 110.

Subsequently, a second mask pattern MP2 including second preliminary openings may be formed on the gate separation layer 120. The second preliminary openings of the second mask pattern MP2 may have groove shapes (or linear shapes) extending in the second direction D2 that may be perpendicular to the first direction D1. Thus, the second mask pattern MP2 may include line patterns of which each is disposed between the second preliminary openings adjacent to each other. In other words, the line patterns of the second mask pattern MP2 may intersect the active patterns 101.

Figure 23A:
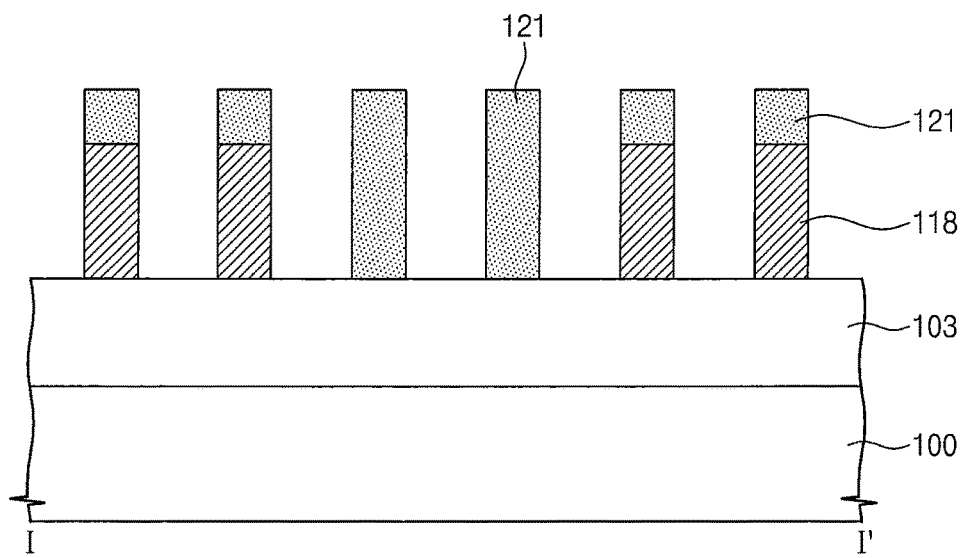
Figure 23B:
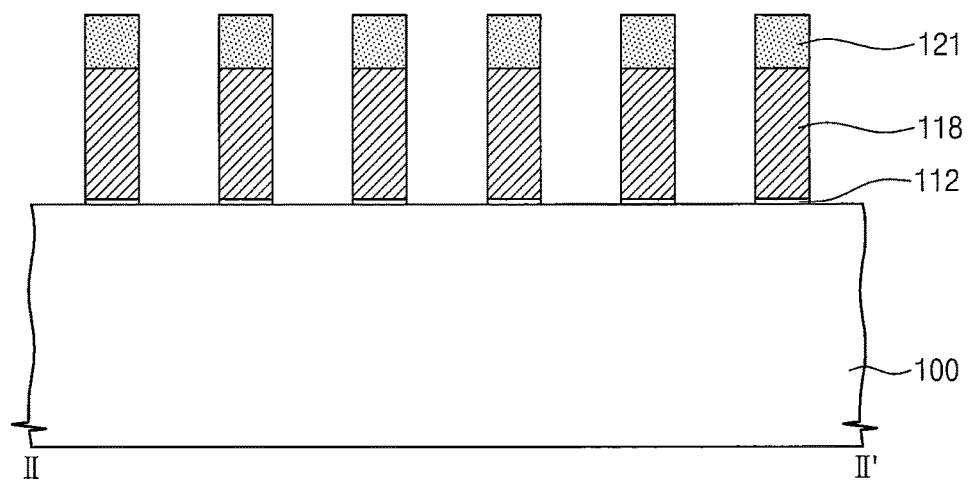
Figure 23C:
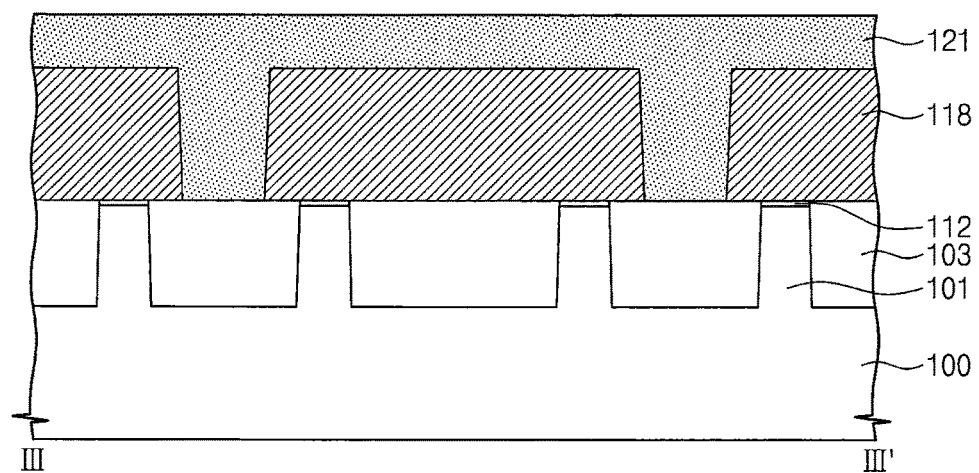

An anisotropic etching process may be performed on the gate separation layer 120 and the gate layer 110 using the second mask pattern MP2 as an etch mask. Thus, gate conductive patterns 118 and gate separation patterns 121 may be formed as illustrated in FIGS. 23A, 23B, and 23C.

In detail, the gate conductive patterns 118 may be spaced apart from each other in the first direction D1 and the second direction D2. Each of the gate conductive patterns 118 may intersect at least one of the active patterns 101 and may have long axes parallel to the second direction D2 perpendicular to the first direction D1. Each of the gate conductive patterns 118 may have a longitudinal axe extending in the second direction D2. Each of the gate conductive patterns 118 may have first opposing sidewalls S1 that are spaced apart from each other in the second direction D2 and second opposing sidewalls S2 that are spaced apart from each other in the first direction D1, as described with reference to FIG. 4.

The semiconductor substrate 100 may be exposed between the gate conductive patterns 118 adjacent to each other in the first direction D1, and the gate separation pattern 121 may be formed between the gate conductive patterns 118 adjacent to each other in the second direction D2.

In some embodiments, the gate separation patterns 121 may extend in the second direction D2, and each of the gate separation patterns 121 may fill spaces between the gate conductive patterns 118 arranged in the second direction D2. In other words, the gate separation pattern 121 may extend from the first sidewalls (see S1 of FIG. 4) onto the top surfaces of the gate conductive patterns 118 arranged in the second direction D2. The top surfaces of the gate conductive patterns 118 may be lower than the top surfaces of the gate separation patterns 121.

Figure 24A:
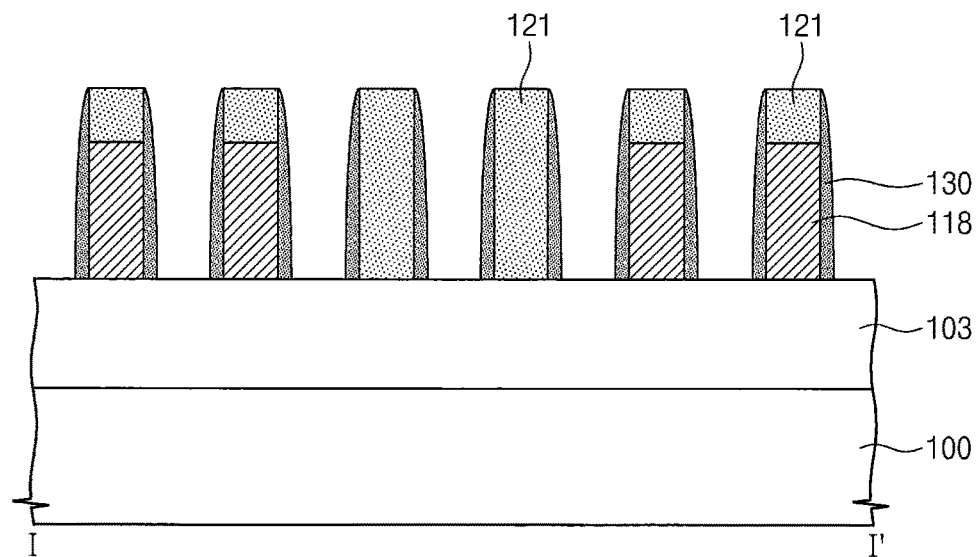
Figure 24B:
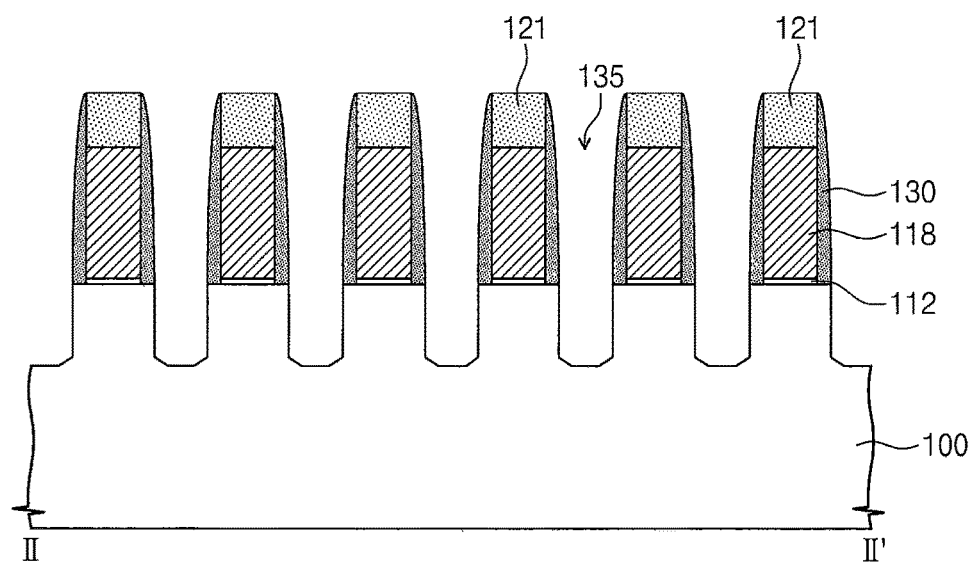
Figure 24C:
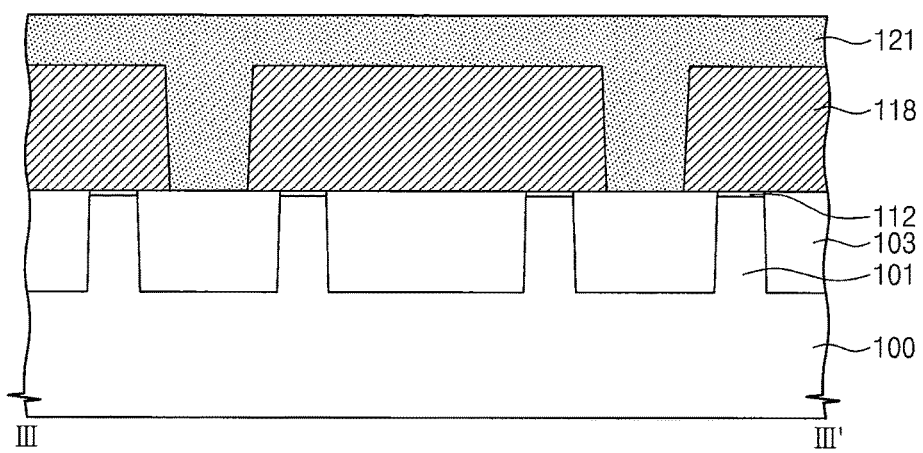

Referring to FIGS. 24A, 24B, and 24C, gate spacers 130 may be formed on both sidewalls of the gate conductive patterns 118 and both sidewalls of the gate separation patterns 121. The gate spacers 130 may extend in the second direction D2. The gate spacers 130 may be formed of an insulating material same as or different from the gate separation patterns 121.

After the formation of the gate spacers 130, recess regions (i.e., recesses) 135 may be formed in the semiconductor substrate 100 at both sides of each of the gate conductive patterns 118. In some embodiments, the gate separation patterns 121 and the gate spacers 130 may be used as etch masks when the recess regions 135 are formed.

According to some embodiments, the gate separation patterns 121 and the gate spacers 130 may be etched during the process of forming the gate spacers 130 and the process of forming the recess regions 135. Thus, the top surfaces of the gate conductive patterns 118 may be exposed.

Next, referring again to FIGS. 7A, 7B, and 7C, epitaxial layers 140 may be formed in the recess regions 135 after the formation of the recess regions 135, as described with reference to FIGS. 18A, 18B, and 18C. The epitaxial layers 140 may be formed by, for example, performing a selective epitaxial growth (SEG) process on the semiconductor substrate 100 exposed by the recess regions 135.

After the formation of the epitaxial layers 140, the etch stop layer 145 may be formed to conformally cover resultant structures formed on the semiconductor substrate 100. The etch stop layer 145 may cover the top surfaces of the gate conductive patterns 118 and the top surfaces of the gate separation patterns 121. Subsequently, the interlayer insulating layer 150 may be formed on the etch stop layer 145 to fill spaces between the gate conductive patterns 118 and the gate separation patterns 121. The etch stop layer 145 may be formed of an insulating material having an etch selectivity with respect to the interlayer insulating layer 150.

FIGS. 25A to 27A, 25B to 27B, and 25C to 27C are cross-sectional views illustrating a method for fabricating the semiconductor device illustrated in FIGS. 8 and 9A to 9C according to some embodiments of the inventive concepts. The descriptions on the same or similar technical features discussed with reference to FIGS. 13A to 20A, 13B to 20B, and 13C to 20C will be omitted or mentioned briefly for the purpose of ease and convenience in explanation.

According to some embodiments, preliminary gate patterns may be formed using the second mask pattern MP2 including line patterns, and then the preliminary gate patterns may be patterned using the first mask pattern MP1 including bar patterns to form gate electrodes.

Figure 25A:
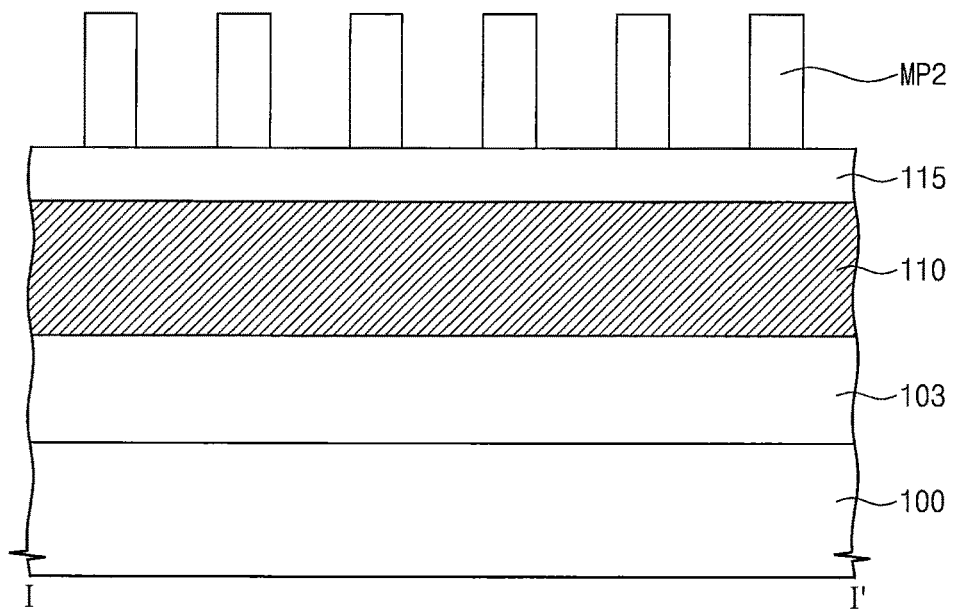
FIGS. 25A, 26A and 27A, FIGS. 25B, 26B and 27B and FIGS. 25C, 26C and 27C are cross-sectional views illustrating a method for fabricating a semiconductor device according to some embodiments of the inventive concepts.
Figure 25B:
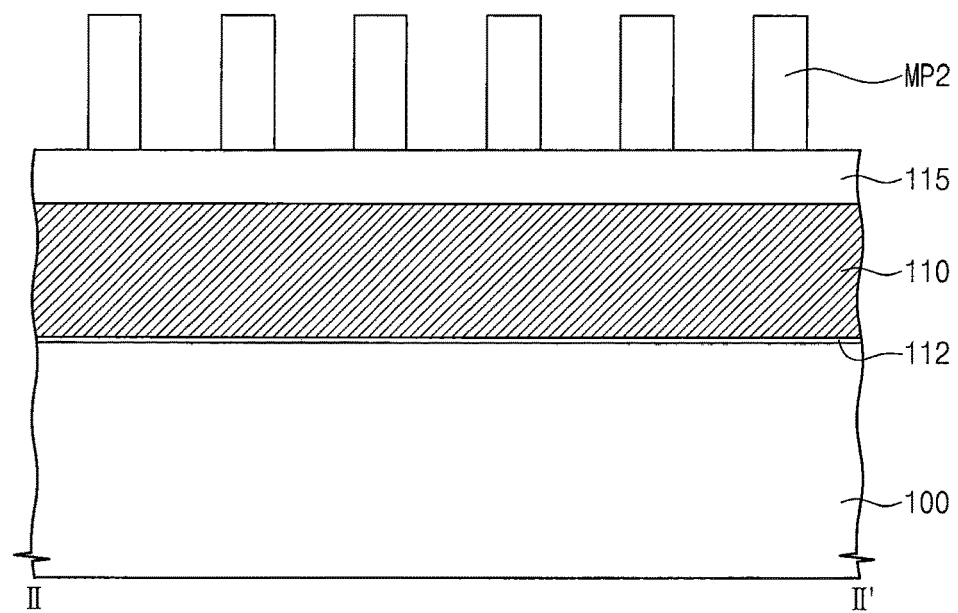
Figure 25C:
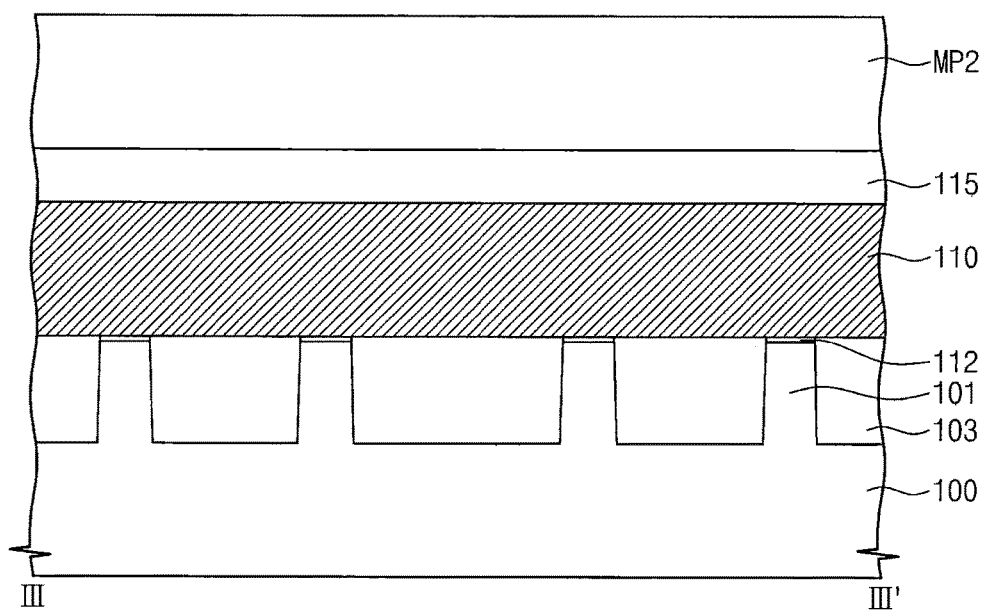

In detail, referring to FIGS. 25A, 25B, and 25C, a gate insulating layer 112, a gate layer 110, and a hard mask layer 115 may be sequentially formed on the semiconductor substrate 100 including the active patterns 101.

In some embodiments, the semiconductor substrate 100 may be patterned to form trenches defining the active patterns 101, an insulating layer may be formed to fill the trenches, and a planarization process may be performed on the insulating layer until the top surface of the semiconductor substrate 100 is exposed, thereby forming the device isolation layer 103. Thus, the top surfaces of the active patterns 101 may be substantially coplanar with the top surface of the device isolation layer 103, and the active patterns 101 may correspond to portions of the semiconductor substrate 100.

In some embodiments, the gate insulating layer 112 may include an oxide, a nitride, an oxynitride, and/or a high-k dielectric. The high-k dielectric may be an insulating material of which a dielectric constant is higher than that of a nitride. For example, the high-k dielectric may include an insulating metal oxide such as hafnium oxide and/or aluminum oxide. In some embodiments, the gate layer 110 may include a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide).

According to some embodiments, a second mask pattern (e.g., MP2 of FIG. 15D) including second preliminary openings may be formed on the hard mask layer 115. The second preliminary openings may extend in the second direction D2 to intersect the active patterns 101.

Figure 26A:
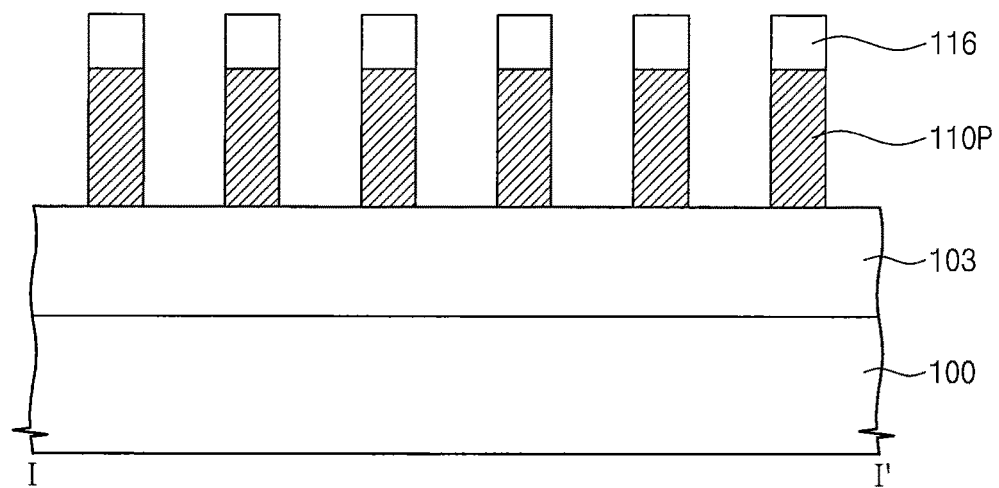
Figure 26B:
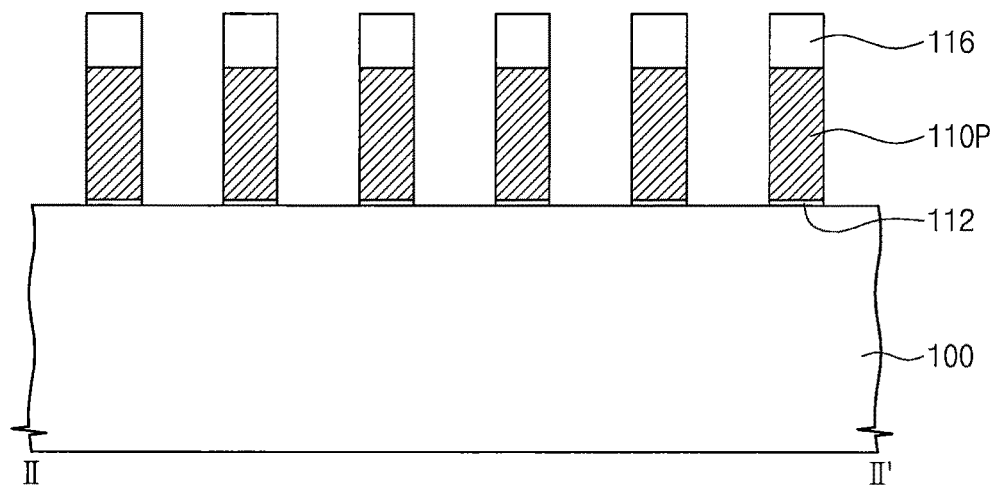
Figure 26C:
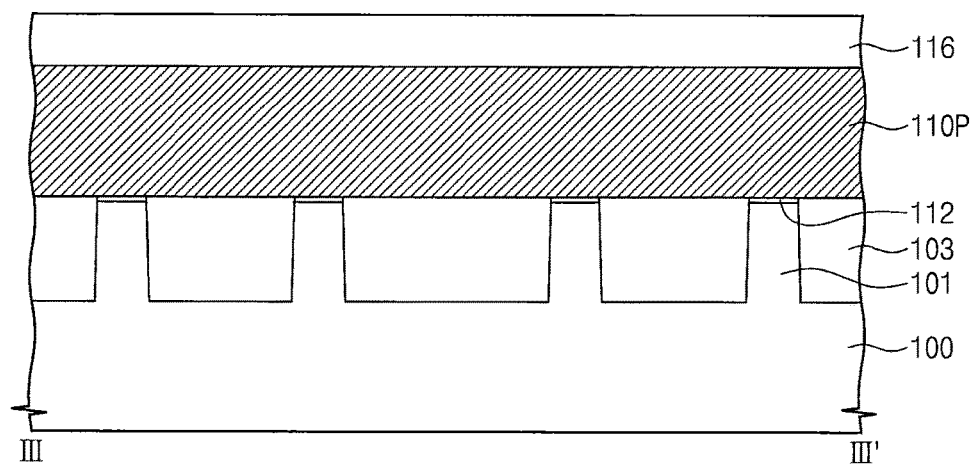

Referring to FIGS. 26A, 26B, and 26C, preliminary gate patterns 110P extending in the second direction D2 may be formed on the semiconductor substrate 100 using the second mask pattern MP2 as an etch mask. The preliminary gate patterns 110P may extend in the second direction D2 to intersect the active patterns 101 and may be spaced apart from each other at equal distances in the first direction D1.

A gate insulating pattern 112 may be formed between the preliminary gate pattern 110P and the active patterns 101, and a hard mask pattern 116 may be formed on each of the preliminary gate patterns 110P. The second mask pattern MP2 may be removed after the formation of the preliminary gate patterns 110P.

Figure 27A:
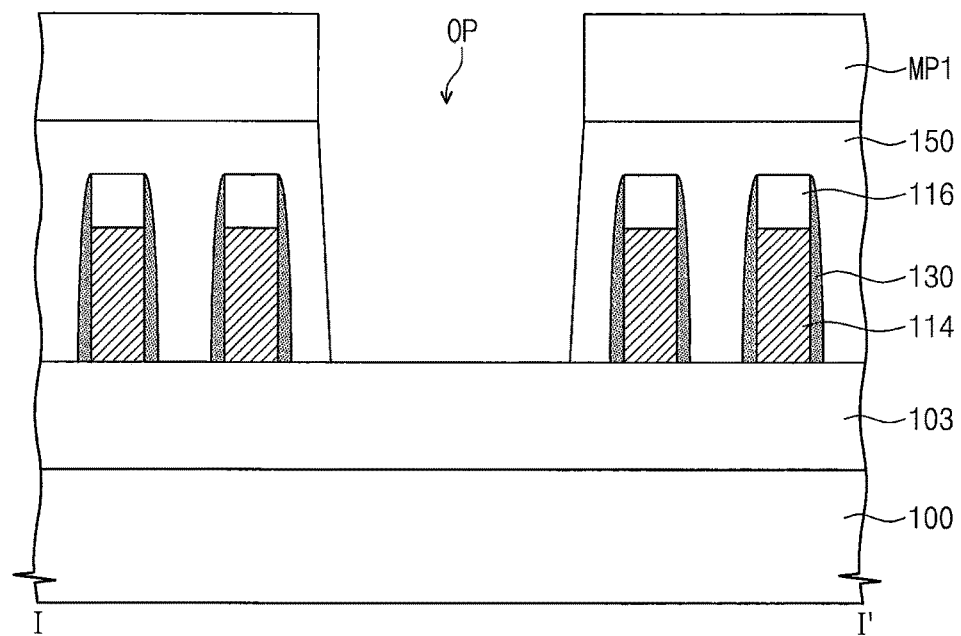
Figure 27B:
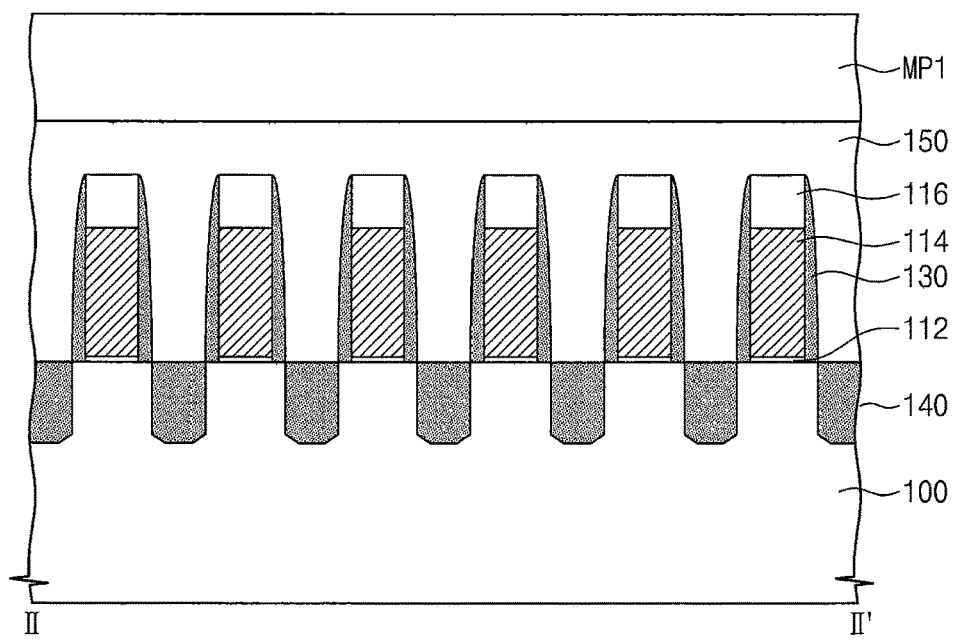
Figure 27C:
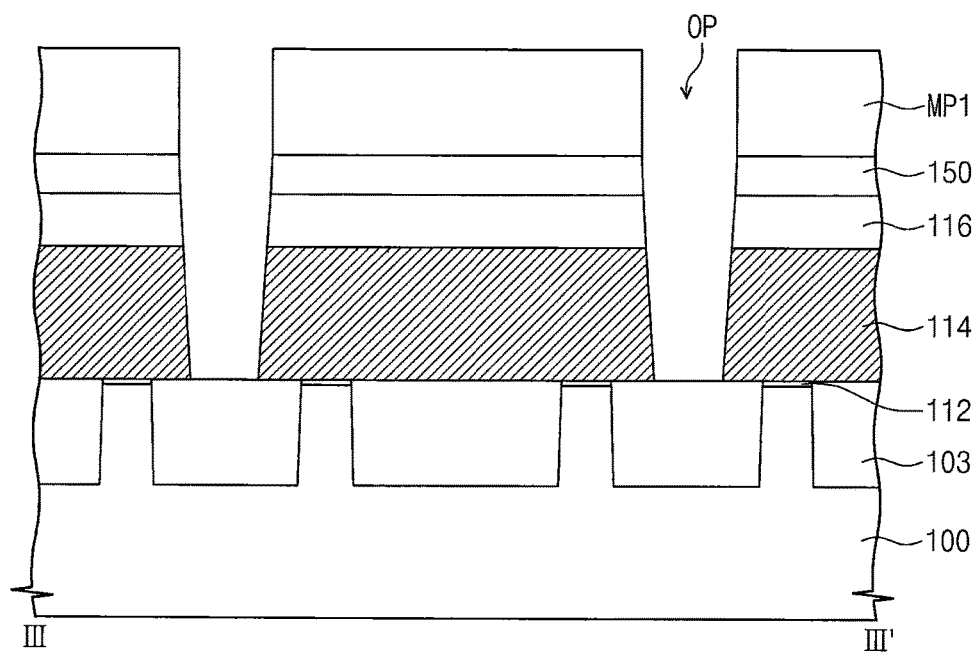

Referring to FIGS. 27A, 27B, and 27C, gate spacers 130 may be formed on both sidewalls of the preliminary gate patterns 110P and both sidewalls of the hard mask patterns 116. A gate spacer layer may be conformally deposited, and the deposited gate spacer layer may be anisotropically etched to form the gate spacers 130. The gate spacers 130 may extend in the second direction D2.

Subsequently, epitaxial layers 140 may be formed at both sides of each of the preliminary gate patterns 110P, as described with reference to FIGS. 18A, 18B, and 18C. In some embodiments, portions of the active patterns 101 disposed at both sides of the preliminary gate pattern 110P may be removed to form recess regions, and a SEG process may be performed using the semiconductor substrate 100 exposed by the recess regions as a seed to form the epitaxial layers 140.

An interlayer insulating layer 150 may be formed to cover the preliminary gate patterns 110P having linear shapes, and a first mask pattern (e.g., MP1 of FIG. 14D) including first preliminary openings may be formed on the interlayer insulating layer 150. The first preliminary openings may have long axes parallel to the first direction D1. Each of the first preliminary openings may have a longitudinal axis extending in the first direction D1

The interlayer insulating layer 150, the hard mask patterns 116, and the preliminary gate patterns 110P may be sequentially etched using the first mask pattern MP1 as an etch mask to form openings OP exposing portions of the device isolation layer 103. The hard mask patterns 116, the preliminary gate patterns 110P, and the gate spacers 130 may be partially removed during the formation of the openings OP. Lengths of the openings OP in the first direction D1 may be greater than a width of the preliminary gate pattern 110P.

By the formation of the openings OP, each of the preliminary gate patterns 110P may be divided into a plurality of gate conductive patterns 118 spaced apart from each other in the second direction D2. In addition, each of the gate spacers 130 may also be divided into a plurality of segments arranged in the second direction D2.

After the formation of the openings OP, the first mask pattern MP1 may be removed to expose the top surface of the interlayer insulating layer 150.

Next, referring again to FIGS. 9A, 9B, and 9C, a gate separation layer 120 may be formed on the interlayer insulating layer 150 including the openings OP. The gate separation layer 120 may cover sidewalls of the gate electrodes 114 exposed through the openings OP and the top surface of the interlayer insulating layer 150. In some embodiments, the gate separation layer 120 may cover the top surface of the interlayer insulating layer 150 and may fill the openings OP.

The gate separation layer 120 may be formed using, for example, a CVD method and/or an ALD method to fill the openings OP. After the gate separation layer 120 is formed using the deposition method, a planarization process may be performed on a top surface of the gate separation layer 120.

According to some embodiments, since the epitaxial layers 140 are formed at both sides of the preliminary gate pattern 110P before the gate conductive patterns 118 are separated from each other in the second direction D2, it may be possible to prevent end portions of the gate conductive patterns 118 from being exposed during the anisotropic etching process of forming the recess regions.

Figure 28:
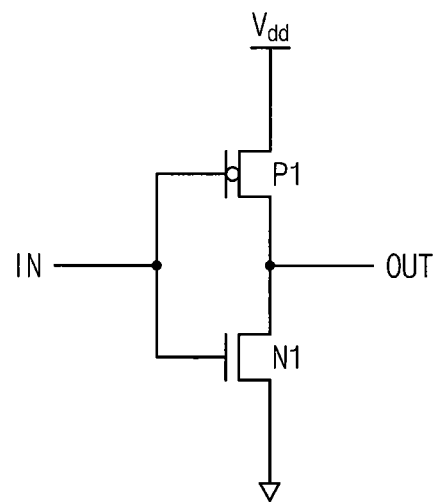
FIG. 28 is a circuit diagram illustrating an inverter including a semiconductor device according to some embodiments of the inventive concepts.

FIG. 28 is a circuit diagram illustrating an inverter including a semiconductor device according to some embodiments of the inventive concepts.

Referring to FIG. 28, a complementary metal-oxide-semiconductor (CMOS) inverter may include a PMOS transistor P1 and an NMOS transistor N1. The PMOS and NMOS transistors P1 and N1 may be connected in series between a driving voltage $V_{dd}$ and a ground voltage, and an input signal IN may be inputted in common to gates of the PMOS and NMOS transistors P1 and N1. An output signal OUT may be outputted from drains of the PMOS and NMOS transistors P1 and N1. The driving voltage $V_{dd}$ may be applied to a source of the PMOS transistor P1, and the ground voltage may be applied to a source of the NMOS transistor N1. The CMOS inverter may invert the input signal IN to output the output signal OUT. In other words, when a logic level '1' is inputted as the input signal IN of the inverter, a logic level '0' is outputted as the output signal OUT. When a logic level '0' is inputted as the input signal IN of the inverter, a logic level '1' is outputted as the output signal OUT.

Figure 29:
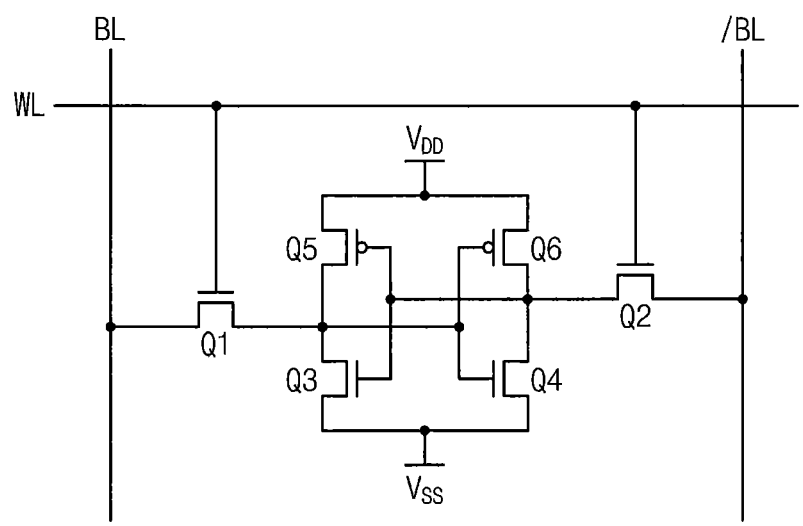
FIG. 29 is a circuit diagram illustrating a static random access memory (SRAM) device including a semiconductor device according to some embodiments of the inventive concepts.

FIG. 29 is a circuit diagram illustrating a static random access memory (SRAM) device including a semiconductor device according to some embodiments of the inventive concepts.

Referring to FIG. 29, a cell of the SRAM device may include first and second access transistors Q1 and Q2, first and second driving transistors Q3 and Q4, and first and second load transistors Q5 and Q6. Sources of the first and second driving transistors Q3 and Q4 may be connected to a ground line $V_{SS}$, and sources of the first and second load transistors Q5 and Q6 may be connected to a power line $V_{DD}$.

The first driving transistor Q3 of an NMOS transistor and the first load transistor Q5 of a PMOS transistor may constitute a first inverter, and the second driving transistor Q4 of an NMOS transistor and the second load transistor Q6 of a PMOS transistor may constitute a second inverter.

Output terminals of the first and second inverters may be connected to sources of the first and second access transistors Q1 and Q2, respectively. The output terminal and an input terminal of the first inverter may be connected to an input terminal and the output terminal of the second inverter, respectively, and thus the first and second inverters constitute a latch circuit. Drains of the first and second access transistors Q1 and Q2 may be connected to first and second bit lines BL and /BL, respectively.

According to some embodiments of the inventive concepts, a semiconductor device may include gate electrodes that are arranged in first and second directions perpendicular each other. The gate separation patterns covering the sidewalls of the gate electrodes adjacent to each other in the second direction may be formed before the etching process of forming the recess regions in the semiconductor substrate. Thus, it may be possible to prevent the gate electrodes from being exposed during the etching process of forming the recess regions in the semiconductor substrate. As a result, it may be possible to prevent an epitaxial layer from being grown on corner portions of the gate electrodes exposed to recess regions during the process of forming the epitaxial layers.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents and shall not be restricted or limited by the foregoing description.

What is claimed is:

1. A method of fabricating a semiconductor device, the method comprising:
    patterning a substrate to form active patterns;
    forming a gate layer comprising openings on the substrate;
    forming a gate separation layer filling the openings and extending on the gate layer;
    forming a gate mask pattern that has a linear shape extending in a first direction and overlaps the gate layer and a portion of the gate separation layer in one of the openings; and
    forming a pair of gate electrodes and a gate separation pattern by etching the portion of the gate separation layer and the gate layer using the gate mask pattern as an etch mask, wherein the pair of gate electrodes are spaced apart from each other and are arranged in the first direction, and wherein the gate separation pattern is disposed between the pair of gate electrodes.

2. The method of claim 1, wherein each of the openings of the gate layer has a longitudinal axis that extends in a second direction that is different from the first direction.

3. The method of claim 2, wherein lengths of the openings in the second direction are greater than widths of the pair of gate electrodes in the second direction.

4. The method of claim 1, wherein each of the openings is formed between adjacent ones of the active patterns when viewed from a plan perspective.

5. The method of claim 1, wherein the forming of the gate layer comprises:

forming a lower layer on the substrate;

forming a first mask pattern comprising first preliminary openings on the lower layer; and etching the lower layer using the first mask pattern as an etch mask to form the openings.

6. The method of claim 1, wherein forming the pair of gate electrodes and the gate separation pattern comprises concurrently etching the portion of the gate separation layer and the gate layer using the gate mask pattern as the etch mask.

7. The method of claim 1, wherein the patterning of the substrate to form the active patterns comprises:

forming a mask pattern defining the active patterns on the substrate;

etching the substrate using the mask pattern as an etch mask to form trenches; and forming a device isolation layer in the trenches, the device isolation layer exposing upper portions of sidewalls of the trenches.

8. The method of claim 1, further comprising:

forming a pair of gate spacers extending in the first direction, wherein the pair of gate spacers define a recess therebetween, and the recess extends in the first direction, and wherein the pair of gate electrodes and the gate separation pattern are in the recess.

9. The method of claim 8, further comprising:

etching portions of the active patterns at both sides of each of the pair of gate electrodes to form active recesses after forming the pair of gate spacers; and forming epitaxial layers in the respective active recesses.

10. A method of fabricating a semiconductor device comprising:

forming a device isolation layer on a substrate, the device isolation layer defining an active pattern;

forming a gate separation pattern overlapping the device isolation layer when viewed from a plan perspective, the gate separation pattern comprising an electrically insulating material, and the gate separation pattern comprising first opposing sidewalls extending in a first direction and second opposing sidewalls extending in a second direction that is different from the first direction;

forming first and second gate spacers on the respective first opposing sidewalls of the gate separation pattern, the first and second gate spacers crossing over the active pattern, extending in the first direction, and defining first and second gate recesses therebetween, and the second opposing sidewalls of the gate separation pattern defining sides of the first and second gate recesses, respectively; and forming first and second gate electrodes in the first and second gate recesses, respectively, the first gate electrode crossing over the active pattern, the first and second gate electrodes extending in the first direction, and the first gate electrode, the gate separation pattern, and the second gate electrode being sequentially arranged along the first direction.

11. The method of claim 10 further comprising:

forming a dummy gate layer on the substrate after forming the device isolation layer, the dummy gate layer comprising an opening exposing the device isolation layer;

forming a gate separation layer in the opening of the dummy gate layer and on the dummy gate layer;

forming a mask pattern having a linear shape on the dummy gate layer and the gate separation layer;

forming the gate separation pattern and first and second dummy gate patterns by etching the gate separation layer and the dummy gate layer using the mask pattern as an etch mask, the first and second dummy gate patterns being on the respective second opposing sidewalls of the gate separation pattern; and removing the first and second dummy gate patterns after forming the first and second gate spacers on the respective first opposing sidewalls of the gate separation pattern to form the first and second gate recesses between the first and second gate spacers.

12. The method of claim 11, wherein the gate separation layer fills the opening of the dummy gate layer, and wherein the first and second gate recesses expose the second opposing sidewalls of the gate separation pattern.

13. The method of claim 11 further comprising:

forming first and second active recesses in the active pattern on respective sides of the first dummy gate pattern by etching the active pattern using the gate separation pattern, the first and second dummy gate patterns and the first and second gate spacers as an etch mask;

forming epitaxial layers in the first and second active recesses; and forming an interlayer insulating layer on the gate separation pattern, the first and second dummy gate patterns, the first and second gate spacers and the epitaxial layers.

14. The method of claim 13, wherein the interlayer insulating layer exposes upper surfaces of the gate separation pattern and the first and second dummy gate patterns, and wherein removing the first and second dummy gate patterns is performed after forming the interlayer insulating layer.

15. The method of claim 10, wherein the first and second gate spacers contact the respective first opposing sidewalls of the gate separation pattern.

16. The method of claim 15, wherein the first and second gate spacers comprise a material different from the gate separation pattern.

17. The method of claim 15, wherein the first and second gate spacers are spaced apart from each other by a constant distance along the first direction.

18. The method of claim 10, further comprising forming first and second gate insulating layers in the first and second gate recesses, respectively, before forming the first and second gate electrodes, wherein the first gate insulating layer is between the first gate electrode and the gate separation pattern and contacts a first one of the second opposing sidewalls of the gate separation pattern, and wherein the second gate insulating layer is between the second gate electrode and the gate separation pattern and contacts a second one of the second opposing sidewalls of the gate separation pattern.

19. The method of claim 10, wherein an upper surface of the gate separation pattern and an upper surface of the first gate electrode are coplanar.

20. The method of claim 19, wherein a lower surface of the gate separation pattern is lower than a lower surface of the first gate electrode.

* * * * *